(12) United States Patent
Taguchi et al.

(10) Patent No.: US 12,072,568 B2
(45) Date of Patent: Aug. 27, 2024

(54) LIGHT-SHIELDING RESIN COMPOSITION, CURED FILM, COLOR FILTER, LIGHT-SHIELDING FILM, SOLID-STATE IMAGING ELEMENT, AND IMAGE DISPLAY DEVICE

(71) Applicant: FUJIFILM Corporation, Tokyo (JP)

(72) Inventors: Yoshinori Taguchi, Haibara-gun (JP); Tatsuo Ishikawa, Haibara-gun (JP); Yuki Sakamoto, Haibara-gun (JP)

(73) Assignee: FUJIFILM Corporation, Tokyo (JP)

(*) Notice: Subject to any disclaimer, the term of this patent is extended or adjusted under 35 U.S.C. 154(b) by 835 days.

(21) Appl. No.: 17/087,206

(22) Filed: Nov. 2, 2020

(65) Prior Publication Data

US 2021/0072589 A1 Mar. 11, 2021

Related U.S. Application Data

(63) Continuation of application No. PCT/JP2019/022819, filed on Jun. 7, 2019.

(30) Foreign Application Priority Data

Jul. 20, 2018 (JP) .................................. 2018-136598

(51) Int. Cl.
*G02B 5/20* (2006.01)
*G02B 1/00* (2006.01)
(Continued)

(52) U.S. Cl.
CPC ....... *G02F 1/133512* (2013.01); *G02B 1/002* (2013.01); *G02B 5/208* (2013.01); *G02F 1/133514* (2013.01); *H04N 25/11* (2023.01)

(58) Field of Classification Search
CPC ......... G02F 1/133512; G02F 1/133514; G02F 1/136209; H04N 5/11; G02B 1/002;
(Continued)

(56) References Cited

U.S. PATENT DOCUMENTS

2010/0219654 A1* 9/2010 Fujita .................... B60J 1/00
296/97.7
2012/0104529 A1* 5/2012 Tanaka ................ C09B 67/0033
430/7
(Continued)

FOREIGN PATENT DOCUMENTS

JP 2004-271788 A 9/2004
JP 2009-091205 A 4/2009
(Continued)

OTHER PUBLICATIONS

International Search Report dated Aug. 20, 2019 from the International Searching Authority in International Application No. PCT/JP2019/022819.

(Continued)

*Primary Examiner* — Stephone B Allen
*Assistant Examiner* — Adam W Booher
(74) *Attorney, Agent, or Firm* — Sughrue Mion, PLLC

(57) ABSTRACT

A light-shielding resin composition contains: a light-shielding pigment which is one or more selected from the group consisting of metal nitride-containing particles containing an atom A and metal oxynitride-containing particles containing the atom A; and a resin, in which the light-shielding pigment contains at least one of a nitride or an oxynitride of a transition metal having an electronegativity of 1.22 to 1.80, among transition metals of groups 3 to 7, and the atom A is at least one selected from the group consisting of hafnium and tungsten, and is an atom different from the transition metal.

23 Claims, 3 Drawing Sheets

(51) Int. Cl.
*G02F 1/1335* (2006.01)
*H04N 25/11* (2023.01)

(58) Field of Classification Search
CPC .......... G02B 5/208; G02B 5/20; G02B 5/206; G02B 5/22; G02B 5/223
See application file for complete search history.

(56) References Cited

U.S. PATENT DOCUMENTS

| | | | | |
|---|---|---|---|---|
| 2012/0128898 | A1* | 5/2012 | Inoue | C01G 23/00 252/582 |
| 2013/0281285 | A1 | 10/2013 | Kotaro et al. | |
| 2015/0077685 | A1 | 3/2015 | Okada et al. | |
| 2021/0115219 | A1* | 4/2021 | Inoue | C08F 2/50 |

FOREIGN PATENT DOCUMENTS

| | | |
|---|---|---|
| JP | 2012-068536 A | 4/2012 |
| JP | 2012-096945 A | 5/2012 |
| JP | 2012-096946 A | 5/2012 |
| JP | 2013-242522 A | 12/2013 |
| JP | 2015068893 A * | 4/2015 |
| TW | 201806850 A | 3/2018 |
| TW | 201809152 A | 3/2018 |
| WO | 2017/169584 A1 | 10/2017 |
| WO | 2017175550 A1 | 10/2017 |

OTHER PUBLICATIONS

Written Opinion dated Aug. 20, 2019 from the International Bureau in International Application No. PCT/JP2019/022819.
International Preliminary Report on Patentability dated Jan. 26, 2021 from the International Bureau in International Application No. PCT/JP2019/022819.
Office Action dated Oct. 28, 2022 from the Taiwanese Intellectual Property Office in TW Application No. 108120998.
Notice of Reasons for Refusal dated Nov. 24, 2021 from the Japanese Patent Office in Japanese Application No. 2020-530932.
Chinese Office Action dated Jan. 26, 2024 in Application No. 201980032009.1.

* cited by examiner

LIGHT-SHIELDING RESIN COMPOSITION, CURED FILM, COLOR FILTER, LIGHT-SHIELDING FILM, SOLID-STATE IMAGING ELEMENT, AND IMAGE DISPLAY DEVICE

CROSS-REFERENCE TO RELATED APPLICATIONS

This application is a Continuation of PCT International Application No. PCT/JP2019/022819 filed on Jun. 7, 2019, which claims priority under 35 U.S.C. § 119(a) to Japanese Patent Application No. 2018-136598 filed on Jul. 20, 2018. Each of the above application(s) is hereby expressly incorporated by reference, in its entirety, into the present application.

BACKGROUND OF THE INVENTION

1. Field of the Invention

The present invention relates to a light-shielding resin composition, a cured film, a color filter, a light-shielding film, a solid-state imaging element, and an image display device.

2. Description of the Related Art

In the related art, as a black powder, a composition containing a titanium nitride is known. The composition containing a titanium nitride is used in various applications, and has been used, for example, for producing a light-shielding film provided in a liquid crystal display device, a solid-state imaging device, or the like.

Specifically, a color filter used in a liquid crystal display device comprises a light-shielding film which is called a black matrix, for the purpose of shielding light between colored pixels, enhancing contrast, and the like.

In addition, a solid-state imaging element is also provided with a light-shielding film for the purpose of preventing the generation of noise, improving image quality, and the like. Currently, a compact and thin imaging unit is mounted on a mobile terminal of electronic equipment such as a mobile phone and a personal digital assistant (PDA). In general, such an imaging unit comprises a solid-state imaging element such as a charge coupled device (CCD) image sensor and a complementary metal-oxide semiconductor (CMOS) image sensor, and a lens for forming a subject image on the solid-state imaging element.

Furthermore, in recent years, focusing on a transmittance of light having a specific wavelength, a black powder using a metal oxynitride, which has a low transmittance of light having a specific wavelength (has high light-shielding properties), instead of a titanium nitride has been investigated. For example, JP2012-096945A discloses a "blue color-shielding black powder consisting of one or two oxynitrides of vanadium or niobium, in which an oxygen content is equal to or less than 16 wt %, a nitrogen content is equal to or greater than 10 wt %, and a transmittance X at 450 nm in transmission spectra of a dispersion liquid having a powder concentration of 50 ppm is equal to or less than 10.0%".

SUMMARY OF THE INVENTION

The blue color-shielding black powder described in JP2012-096945A has excellent properties as a black pigment having high light-shielding properties. However, according to the investigation conducted by the present inventors, it has been found that in a case where a composition containing the black pigment described above is used for forming a cured film processed into a pattern shape, the composition has room for the improvement in moisture resistance of the cured film.

Accordingly, an object of the present invention is to provide a light-shielding resin composition from which a cured film having excellent moisture resistance can be produced. Moreover, another object of the present invention is to provide a cured film, a color filter, a light-shielding film, a solid-state imaging element, and an image display device.

As a result of conducting an extensive investigation to achieve the objects, the present inventors have found that the objects can be achieved by the following constitution.

[1]
A light-shielding resin composition comprising: a light-shielding pigment which is one or more selected from the group consisting of metal nitride-containing particles containing an atom A and metal oxynitride-containing particles containing the atom A; and a resin, in which the light-shielding pigment contains at least one of a nitride or an oxynitride of a transition metal having an electronegativity of 1.22 to 1.80, among transition metals of groups 3 to 7, and the atom A is at least one selected from the group consisting of hafnium and tungsten, and is an atom different from the transition metal.

[2]
The light-shielding resin composition as described in [1], further comprising: a polymerization initiator; and a low-molecular compound containing an ethylenically unsaturated group.

[3]
The light-shielding resin composition as described in [2], in which the low-molecular compound contains five or more ethylenically unsaturated groups.

[4]
The light-shielding resin composition as described in any one of [1] to [3], in which the light-shielding pigment satisfies at least one requirement of a requirement 1 in which a content of the hafnium is 0.5% to 2.0% by mass with respect to a total mass of the light-shielding pigment, or a requirement 2 in which a content of the tungsten is 0.5% to 2.0% by mass with respect to the total mass of the light-shielding pigment.

[5]
The light-shielding resin composition as described in any one of [1] to [4], in which a content of the transition metal in the light-shielding pigment is 50% to 80% by mass with respect to a total mass of the light-shielding pigment.

[6]
The light-shielding resin composition as described in any one of [1] to [5], in which the light-shielding pigment contains an oxygen atom, and a content of the oxygen atom in the light-shielding pigment is equal to or greater than 3% by mass and less than 9% by mass with respect to a total mass of the light-shielding pigment.

[7]
The light-shielding resin composition as described in any one of [1] to [6], in which the transition metal is one or more selected from the group consisting of zirconium, vanadium, niobium, chromium, tantalum, yttrium, and titanium.

[8]
The light-shielding resin composition as described in any one of [1] to [7], in which the transition metal is one or more selected from the group consisting of zirconium, vanadium, and niobium.

[9]

The light-shielding resin composition as described in any one of [1] to [8], in which the light-shielding pigment contains one or more selected from the group consisting of zirconium oxynitride and zirconium nitride.

[10]

The light-shielding resin composition as described in any one of [1] to [9], in which the light-shielding pigment contains a silicon atom.

[11]

The light-shielding resin composition as described in any one of [1] to [10], in which an average primary particle diameter of the light-shielding pigment is 30 to 60 nm.

[12]

The light-shielding resin composition as described in any one of [1] to [11], in which the resin includes a resin containing an acid group.

[13]

The light-shielding resin composition as described in [12], in which the acid group is a carboxylic acid group.

[14]

The light-shielding resin composition as described in any one of [1] to [13], in which the resin includes a resin containing an ethylenically unsaturated group.

[15]

The light-shielding resin composition as described in [14], in which a content of the resin containing an ethylenically unsaturated group is equal to or greater than 65% by mass with respect to a total mass of the resin.

[16]

The light-shielding resin composition as described in any one of [1] to [15], in which the resin includes a resin which is a graft polymer.

[17]

The light-shielding resin composition as described in [16], in which a mass ratio of a content of the resin, which is a graft polymer, to a content of the light-shielding pigment is 0.05 to 0.35.

[18]

The light-shielding resin composition as described in [2] or [3], in which the polymerization initiator is an oxime compound.

[19]

The light-shielding resin composition as described in any one of [1] to [18], further comprising a solvent, in which a solid content is 10% to 40% by mass.

[20]

The light-shielding resin composition as described in any one of [1] to [19], further comprising one or more selected from the group consisting of an epoxy group-containing compound, an ultraviolet absorber, and an adhesive agent.

[21]

A cured film formed of the light-shielding resin composition as described in any one of [1] to [20].

[22]

A color filter comprising the cured film as described in [21].

[23]

A light-shielding film comprising the cured film as described in [21].

[24]

A solid-state imaging element comprising the cured film as described in [21].

[25]

An image display device comprising the cured film as described in [21].

According to the present invention, it is possible to provide a composition from which a cured film having excellent moisture resistance can be produced. Moreover, according to the present invention, it is possible to provide a cured film, a color filter, a light-shielding film, a solid-state imaging element, and an image display device.

DESCRIPTION OF THE PREFERRED EMBODIMENTS

Figure 1:
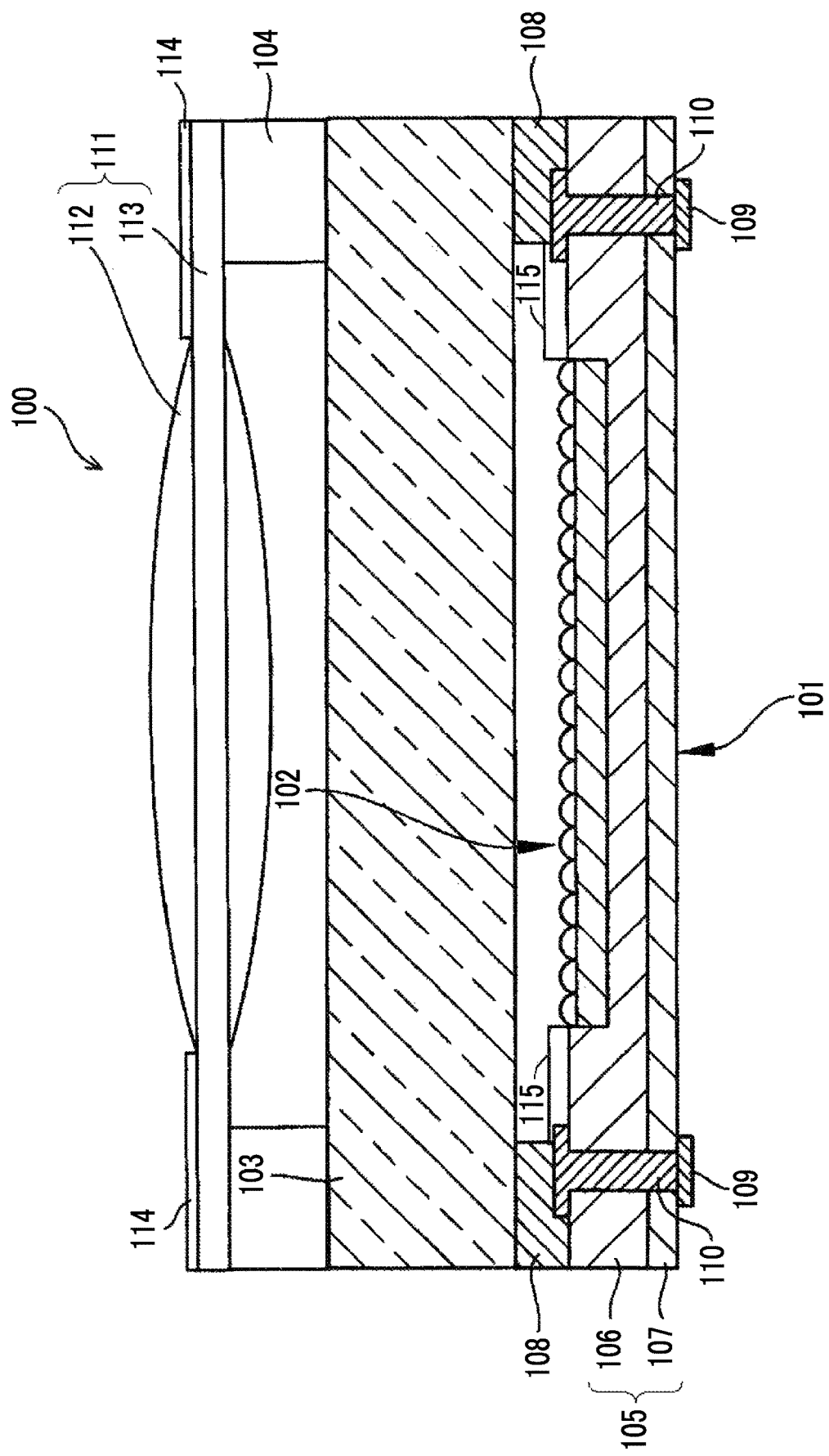
FIG. 1 is a schematic cross-sectional view showing an example of the constitution of a solid-state imaging device.

Hereinafter, the present invention will be described in detail.

The description of the following constituting requirements is made based on typical embodiments of the present invention in some cases, but the present invention is not limited to the embodiments.

Furthermore, in the present specification, a numerical range expressed using "to" means a range including numerical values described before and after "to" as a lower limit value and an upper limit value.

In the present specification, regarding the description of a group (atomic group), in a case where whether the group is substituted or unsubstituted is not described, the group includes a group which has a substituent as well as a group which does not have a substituent. For example, an "alkyl group" includes not only an alkyl group (unsubstituted alkyl group) which does not have a substituent but also an alkyl group (substituted alkyl group) which has a substituent.

In addition, in the present specification, "actinic rays" or "radiation" refers to, for example, far ultraviolet rays, extreme ultraviolet rays (EUV: extreme ultraviolet lithography), X-rays, electron beams, and the like. Moreover, in the present specification, light refers to actinic rays and radiation. In the present specification, unless otherwise specified, "exposure" includes not only exposure with far ultraviolet rays, X-rays, EUV light, or the like but also lithography by particle beams such as electron beams and ion beams.

In the present specification, "(meth)acrylate" represents acrylate and methacrylate. In the present specification, "(meth)acryl" represents acryl and methacryl. In the present specification, "(meth)acryloyl" represents acryloyl and methacryloyl. In the present specification, "(meth)acrylamide" represents acrylamide and methacrylamide. In the present specification, a "monomeric substance" and a "monomer" have the same definition.

In the present specification, a weight-average molecular weight (Mw) is a value in terms of polystyrene, as measured by a gel permeation chromatography (GPC) method.

In the present specification, the GPC method is based on a method in which HLC-8020 GPC (manufactured by TOSOH CORPORATION) is used, TSKgel SuperHZM-H, TSKgel SuperHZ4000, and TSKgel superHZ2000 (manufactured by TOSOH CORPORATION, 4.6 mm ID×15 cm) are used as columns, and tetrahydrofuran (THF) is used as an eluent.

[Light-Shielding Resin Composition]

A light-shielding resin composition (hereinafter, simply referred to as a "composition" as well) according to an embodiment of the present invention contains a light-shielding pigment and a resin.

The light-shielding pigment is one or more selected from the group consisting of metal nitride-containing particles containing an atom A and metal oxynitride-containing particles containing the atom A.

The light-shielding pigment contains at least one of a nitride or an oxynitride of a transition metal having an electronegativity of 1.22 to 1.80, among transition metals of groups 3 to 7.

The atom A is at least one selected from the group consisting of hafnium and tungsten, and is an atom different from the transition metal.

The mechanism by which the objects of the present invention are achieved by the composition having the constitution described above is not always clear, but the present inventors consider that the light-shielding pigment containing at least one of a nitride or an oxynitride of a transition metal, which belongs to groups 3 to 7 and has an electronegativity within a predetermined range, and the atom A (at least one selected from the group consisting of hafnium and tungsten) is used, and thus moisture resistance of a cured film obtained from the composition is improved.

[Light-Shielding Pigment]

The composition according to the embodiment of the present invention contains the light-shielding pigment.

The light-shielding pigment is one or more selected from the group consisting of the metal nitride-containing particles containing the atom A and the metal oxynitride-containing particles containing the atom A, and may consist of only the metal nitride-containing particles, may consist of only the metal oxynitride-containing particles, or may contain both the metal nitride-containing particles and the metal oxynitride-containing particles in a mixed manner.

A content of the light-shielding pigment in the composition is preferably 10% to 90% by mass, more preferably 30% to 70% by mass, and even more preferably 40% to 60% by mass, with respect to a total mass of a solid content of the composition.

Light shielding using a cured film formed of the composition according to the embodiment of the present invention is a concept that also includes light attenuation in which light passes through the cured film while being attenuated. In a case where the cured film (light-shielding film) is used as a light-attenuating film having such a function, it is also preferable that the content of the light-shielding pigment in the composition is less than the above suitable range.

Furthermore, in the present specification, the solid content of the composition means all components except a solvent in a case where the composition contains the solvent (an organic solvent, water, or the like), and as long as the component is a component other than the solvent, the component is considered to be a solid content even in a case where the component is a liquid component. For example, the mass of the solid content of the composition is determined as a mass remaining after heating 1 g of the composition at 160° C. for 70 minutes.

The light-shielding pigment is one or more selected from the group consisting of the metal nitride-containing particles containing the atom A and the metal oxynitride-containing particles containing the atom A. That is, the light-shielding pigment contains the atom A.

An aspect (that is, an aspect in which the metal nitride-containing particles and/or the metal oxynitride-containing particles contain the atom A) in which the light-shielding pigment contains the atom A is not particularly limited, and the atom A may be contained in any form such as an ion, a metallic compound (also including a complex compound), an intermetallic compound, an alloy, an oxide, a complex oxide, a nitride, an oxynitride, a sulfide, and an oxysulfide. Moreover, the atom A contained in the light-shielding pigment may be present as an impurity positioned between crystal lattices, or may be present as an amorphous impurity in the crystal grain boundary.

<Atom A>

The atom A is at least one selected from the group consisting of hafnium (Hf) and tungsten (W).

The atoms A may be used singly or in combination of two thereof.

Here, the atom A is an atom different from a transition metal (specific transition metal) which will be described later. That is, the atom A and the transition metal (specific transition metal) are not both hafnium.

For example, the light-shielding pigment preferably satisfies one or both of the following requirement 1 and requirement 2.

Requirement 1: A content of the hafnium is 0.1% to 10.0% by mass (preferably 0.5% to 2.0% by mass and more preferably 1.0% to 2.0% by mass) with respect to a total mass of the light-shielding pigment.

Requirement 2: A content of the tungsten is 0.1% to 10.0% by mass (preferably 0.5% to 2.0% by mass and more preferably 1.0% to 2.0% by mass) with respect to the total mass of the light-shielding pigment.

In a case where the content of the atom A is within the above range with respect to the total mass of the light-shielding pigment, viscosity stability of the composition over time, precipitation stability of the composition over time, and the moisture resistance (particularly, the moisture-resistant spectral stability) of the cured film formed of the composition are excellent in a well-balanced manner.

Herein, the content of the atom A in the light-shielding pigment is measured by an X-ray fluorescence (XRF) analysis method.

<Nitride of Transition Metal>

The light-shielding pigment contains at least one of a nitride or an oxynitride of a transition metal (hereinafter, referred to as a "specific transition metal" as well) having an electronegativity (Pauling's electronegativity) of 1.22 to 1.80, among the transition metals of groups 3 to 7.

Examples of the specific transition metal (each number in parentheses is an electronegativity) include: Sc (1.36), Dy (1.22), Ho (1.23), Er (1.24), Tm (1.25), Lu (1.27), Th (1.3), Pa (1.5), U (1.38), Np (1.36), Pu (1.28), Am (1.3), Cm (1.3), Bk (1.3), Cf (1.3), Es (1.3), Fm (1.3), Md (1.3), No (1.3), and Lr (1.3) which are transition elements of group 3; Ti (1.54), Zr (1.33), and Hf (1.3) which belong to group 4; V (1.63), Nb (1.6), and Ta (1.5) which belong to group 5; Cr (1.66) belonging to group 6; and Mn (1.55) belonging to group 7. Among them, from the viewpoint that the composition exhibits superior effects of the present invention, zirconium (Zr), vanadium (V), niobium (Nb), chromium (Cr), tantalum (Ta), yttrium (Y), and titanium (Ti) are preferable, and zirconium, vanadium, or niobium is more preferable.

In a case where the specific transition metal is zirconium, vanadium, or niobium, undercut resistance in a case where a cured film is formed of the composition is excellent.

In a case where the specific transition metal is zirconium or vanadium, the moisture resistance (particularly, the moisture-resistant spectral stability) of the cured film formed of the composition is superior.

In a case where the specific transition metal is vanadium or niobium, the light-shielding properties of the cured film formed of the composition are superior.

Among them, as the specific transition metal, zirconium is preferable. That is, the light-shielding pigment preferably contains zirconium oxynitride and/or zirconium nitride.

A content of the specific transition metal in the light-shielding pigment is preferably 10% to 85% by mass, more preferably 50% to 80% by mass, and even more preferably 70% to 80% by mass, with respect to the total mass of the light-shielding pigment. The content of the transition metal in the light-shielding pigment is measured by an X-ray fluorescence (XRF) analysis method.

One specific transition metal may be used singly or two or more specific transition metals are used, and in a case where two or more specific transition metals are used, the total content thereof is preferably within the above range.

A content of a nitrogen atom (N atom) in the light-shielding pigment is preferably 3% to 60% by mass, more preferably 5% to 30% by mass, and even more preferably 7% to 15% by mass, with respect to the total mass of the light-shielding pigment. The content of the nitrogen atom is measured by an X-ray fluorescence (XRF) analysis method.

The light-shielding pigment preferably contains an oxygen atom.

Furthermore, in a case where a metal nitride is contained as a main component, and oxygen is mixed in, in general, during synthesis thereof, and due to oxidation of the particle surface (this is remarkable in a case where the particle diameter is small, or the like), the light-shielding pigment may partially contain an oxygen atom.

In a case where the light-shielding pigment contains an oxygen atom (for example, a case where the light-shielding pigment is metal oxynitride particles), a content of the oxygen atom in the light-shielding pigment is preferably 0.5% to 30% by mass, more preferably 1% to 15% by mass, and even more preferably equal to or greater than 3% by mass and less than 9% by mass, with respect to the total mass of the light-shielding pigment. Moreover, in a case where the light-shielding pigment consists of metal nitride particles and metal oxynitride particles, the content of the oxygen atom in the metal oxynitride particles contained in the light-shielding pigment preferably satisfies the above range.

The content of the oxygen atom is measured by an X-ray fluorescence (XRF) analysis method.

In a case where the content of the oxygen atom is within the above range with respect to the total mass of the light-shielding pigment, undercut resistance in a case where a cured film is formed of the composition and the light-shielding properties of the cured film formed of the composition are excellent in a well-balanced manner.

The light-shielding pigment may contain other elements in addition to the aforementioned elements. There is no limitation on other elements, and among them, a silicon atom is preferable.

In a case where the light-shielding pigment contains a silicon atom, the content thereof is preferably 0.1% to 10.0% by mass, more preferably 0.5% to 5.0% by mass, and even more preferably 1.0% to 3.0% by mass, with respect to the total mass of the light-shielding pigment.

In a case where the content of the silicon atom is within the above range with respect to the total mass of the light-shielding pigment, the viscosity stability of the composition over time, the precipitation stability of the composition over time, and the moisture resistance (particularly, the moisture-resistant spectral stability) of the cured film formed of the composition are superior.

From the viewpoints of the temporal stability and the light-shielding properties, a specific surface area of the light-shielding pigment is preferably 5 $m^2/g$ to 100 $m^2/g$ and more preferably 10 $m^2/g$ to 60 $m^2/g$. The specific surface area is determined by the Brunauer-Emmett-Teller (BET) method.

<Method for Producing Light-Shielding Pigment>

In general, a gas-phase reaction method is used for producing the light-shielding pigment, and specific examples thereof include an electric furnace method and a thermal plasma method. Among these production methods, for the reasons that few impurities are mixed in, particle diameters are easily uniform, and productivity is high, a thermal plasma method is preferable.

Examples of a specific method for producing the light-shielding pigment by the thermal plasma method include a method in which a fine metal particle production apparatus is used. The fine metal particle production apparatus includes, for example, a plasma torch for generating thermal plasma, a material supply device for supplying a metal raw material powder into the plasma torch, a chamber having a cooling function, a cyclone for classifying generated fine metal particles, and a collection unit for collecting the fine metal particles.

Furthermore, in the present specification, the fine metal particles mean particles which contain a metallic element and of which the primary particle diameter is 5 nm to 40 μm.

The method for producing a light-shielding pigment using the fine metal particle production apparatus is not particularly limited, and known methods can be used. Among them, from the viewpoint that the yield of a light-shielding pigment having the following predetermined average primary particle diameter is increased, the method for producing a light-shielding pigment using the fine metal particle production apparatus preferably includes the following steps.

Step A: A step of supplying, as a plasma gas, an inert gas containing no nitrogen gas into a plasma torch to generate a thermal plasma flame Step B: A step of supplying a metal raw material powder containing a specific transition metal to the thermal plasma flame in the plasma torch, and evaporating the metal raw material powder to obtain a gas-phase raw material metal Step C: A step of cooling the gas-phase raw material metal to obtain fine metal particles containing a specific transition metal Step D: A step of supplying, as a plasma gas, an inert gas containing a nitrogen gas into a plasma torch to generate a thermal plasma flame Step E: A step of supplying the fine metal particles containing a specific transition metal to the thermal plasma flame in the plasma torch, and evaporating the fine metal particles to obtain a gas-phase raw material metal Step F: A step of cooling the gas-phase raw material metal to obtain a light-shielding pigment In addition, the method for producing a light-shielding pigment may include the following step G after the step C and/or the step F, if desired.

Step G: A step of classifying the obtained particles

Moreover, the following step A2 is included before the step A, between the steps A and B, between the steps C and D, or between the steps D and E.

Step A2: A step of mixing an atom A with the metal raw material powder containing a specific transition metal Furthermore, the following steps A3-1 to A3-3 may be included before the step A2.

Step A3-1: A step of supplying, as a plasma gas, an inert gas containing no nitrogen gas into a plasma torch to generate a thermal plasma flame Step A3-2: A step of supplying a raw material powder containing an atom A to the thermal plasma flame in the plasma torch, and evaporating the raw material powder to obtain a gas-phase atom A Step A3-3: A step of cooling the gas-phase atom A to obtain an atomized atom A The step G may be further included after the step A3-3.

In the present specification, the atomized atom A means a particle which contains the atom A and of which the primary particle diameter is 5 nm to 40 µm.

In addition, the step A2 may be a step A2b of further mixing another atom (for example, a silicon atom) together with the atom A.

In a case of carrying out such a step A2b, before the step A2b, the steps A3-1 to A3-3 may be included and the following steps A3-1b to A3-3b may be further included.

Step A3-1b: A step of supplying, as a plasma gas, an inert gas containing no nitrogen gas into a plasma torch to generate a thermal plasma flame Step A3-2b: A step of supplying a raw material powder containing the other atom (for example, a silicon atom) to the thermal plasma flame in the plasma torch, and evaporating the raw material powder to obtain the other atom (for example, a silicon atom) in a gas phase Step A3-3b: A step of cooling the other atom (for example, a silicon atom) in a gas phase to obtain the atomized other atom (for example, a silicon atom)

The step G may be further included after the step A3-3b.

In the present specification, the atomized other atom (for example, a silicon atom) means a particle which contains the other atom (for example, a silicon atom) and of which the primary particle diameter is 5 nm to 40 µm.

Furthermore, the method for producing a light-shielding pigment preferably further includes the following step H after the step F (in a case where the step G is included, after the step G carried out after the step F).

Step H: A step of exposing the light-shielding pigment obtained in the step F (or the step G) to a mixed atmosphere of water vapor and a nitrogen gas to perform a nitriding treatment If desired, the method for producing a light-shielding pigment may further include the step G after the step H. Hereinafter, a suitable aspect of each step will be described in detail.

Step A

The step A is a step of supplying, as a plasma gas, an inert gas containing no nitrogen gas into a plasma torch to generate a thermal plasma flame. A method for generating the thermal plasma flame is not particularly limited, but examples thereof include a direct-current arc discharge method, a multi-phase arc discharge method, a radio-frequency plasma method, and a hybrid plasma method, and a radio-frequency plasma method in which few impurities are mixed in from an electrode is preferable.

The method for generating the thermal plasma flame by the radio-frequency plasma method is not particularly limited, and examples thereof include a method in which a plasma gas is supplied into a plasma torch including a radio-frequency oscillating coil and a quartz tube, and a radio-frequency current is applied to the radio-frequency oscillating coil to obtain a thermal plasma flame.

In the step A, as the plasma gas, an inert gas containing no nitrogen gas is used. Examples of the inert gas containing no nitrogen gas include an argon gas and a hydrogen gas. The inert gases containing no nitrogen gas may be used singly or in combination of two or more thereof.

Step A2

The step A2 is a step of mixing an atom A with a metal raw material powder containing a transition metal. The method for mixing the metal raw material powder with the atom A is not particularly limited, and known methods can be used. For example, the material supply device for supplying the metal raw material powder into the plasma torch may have mixing and dispersing functions. Specifically, the material supply device described in paragraphs 0047 to 0058 of WO2010/147098A can be used, the contents of which are incorporated into the present specification.

Furthermore, as the method for producing a light-shielding pigment, the steps A3-1 to A3-3 may be further included before the step A2.

Moreover, the step A2 may be the step A2b of further mixing another atom (for example, a silicon atom) together with the atom A, and before the step A2b, the steps A3-1 to A3-3 may be included and the steps A3-1b to A3-3b may be further included.

Step B

The step B is a step of supplying a metal raw material powder containing a specific transition metal to the thermal plasma flame in the plasma torch, and evaporating the metal raw material powder to obtain a gas-phase raw material metal. The method for supplying a metal raw material powder to the thermal plasma flame in the plasma torch is not particularly limited, but from the viewpoint that the obtained gas-phase raw material metal is in a more uniform state, spraying using a carrier gas is preferable. Moreover, as the carrier gas, an inert gas containing no nitrogen gas is preferably used. The aspect of the inert gas containing no nitrogen gas is as described above.

Furthermore, in a case where the method for producing a light-shielding pigment includes the step A2 (or the step A2b), the metal raw material powder is preferably maintained in a uniformly dispersed state until the metal raw material powder is supplied into the plasma torch.

Step C

The step C is a step of cooling the gas-phase raw material metal to obtain fine metal particles containing a transition metal. The cooling method is not particularly limited, but using a chamber having a cooling function is preferable. Fine metal particles having the following desired particle diameter can be produced by introducing the gas-phase raw material metal obtained in the step B into the chamber having a cooling function, and rapidly cooling the gas-phase raw material metal in the chamber. The produced fine metal particles are collected, for example, by the collection unit. The atmosphere in the chamber is preferably an inert gas containing no nitrogen gas. The aspect of the inert gas containing no nitrogen gas is as described above.

Furthermore, the steps A to C are carried out to obtain fine metal particles containing a transition metal. The fine metal particles containing a transition metal are easily evaporated in the step E. Moreover, even in a case where the metal raw material powder contains impurities, the impurities can be removed by carrying out the steps A to C.

Step D

The step D is a step of supplying, as a plasma gas, an inert gas containing a nitrogen gas into a plasma torch to generate a thermal plasma flame. Examples of the inert gas containing a nitrogen gas include a nitrogen gas and a nitrogen gas containing an inert gas. Examples of the inert gas include an argon gas and a hydrogen gas. The nitrogen gas containing an inert gas is not particularly limited, but a content of the nitrogen gas is generally about 10% to 90% by mole and preferably about 30% to 60% by mole. The other aspects are the same as those in the step A.

Step E

The step E is a step of supplying the fine metal particles containing a specific transition metal to the thermal plasma flame in the plasma torch, and evaporating the fine metal particles to obtain a gas-phase raw material metal. The method for supplying the fine metal particles to the thermal plasma flame in the plasma torch is as described above, but as the carrier gas, an inert gas containing a nitrogen gas is preferable. The aspect of the inert gas containing a nitrogen gas is as described above.

Since in the step E, the raw material metal which will be made into the fine metal particles through the steps A to C is supplied to the thermal plasma flame, the gas-phase raw material metal is easily obtained, and the state of the gas-phase raw material metal is also likely to be more uniform.

Step F

The step F is a step of cooling the gas-phase raw material metal to obtain a light-shielding pigment containing a nitride of a specific transition metal. A suitable aspect of the cooling method is as described above, but the atmosphere in the chamber is preferably an inert gas containing a nitrogen gas. A suitable aspect of the inert gas containing a nitrogen gas is as described above.

Step G

The step G is a step of classifying the obtained fine metal particles and/or light-shielding pigment. The classification method is not particularly limited, but, for example, a cyclone can be used. The cyclone has a conical container, and has a function of generating a swirling flow in the container and classifying particles by utilizing a centrifugal force. Moreover, the classification is preferably performed in an atmosphere of an inert gas. An aspect of the inert gas is as described above.

Step H

The step H is a step of exposing the light-shielding pigment to a mixed atmosphere of water vapor and a nitrogen gas to perform a nitriding treatment. By carrying out this step, the content of the metal nitride in the light-shielding pigment can be increased. The method for exposing the light-shielding pigment to the mixed atmosphere of water vapor and a nitrogen gas is not particularly limited, but examples thereof include a method in which the light-shielding pigment is introduced into a constant-temperature tank filled with a gas mixture of water vapor and a nitrogen gas, and left to stand or stirred for a predetermined time, and from the viewpoint that the surface of the light-shielding pigment and a crystal boundary are more stabilized, being left to stand is more preferable.

Furthermore, a mixing ratio of water vapor to a nitrogen gas is preferably set such that the relative humidity is 25% to 95% in the atmosphere. The time for being left to stand or stirred is preferably 0.5 to 72 hours, and the temperature in this case is preferably 10° C. to 40° C.

Steps A3-1 to A3-3

The steps A3-1 to A3-3 are a step (A3-1) of supplying, as a plasma gas, an inert gas containing no nitrogen gas into a plasma torch to generate a thermal plasma flame, a step (A3-2) of supplying a raw material powder containing an atom A to the thermal plasma flame in the plasma torch, and evaporating the raw material powder to obtain a gas-phase atom A, and a step (A3-3) of cooling the gas-phase atom A to obtain fine particles consisting of the atom A. Aspects in the respective steps are as described in the step A, the step B (the raw material powder containing the atom A is used instead of the metal raw material powder containing the specific transition metal), and the step C (the atomized atom A is obtained instead of the fine metal particles containing the specific transition metal).

Furthermore, by carrying out the steps, the atom A is atomized, and in the step E, the atom A is easily evaporated. Moreover, by carrying out the steps, impurities (metal components other than the atom A, or the like) which are contained in the raw material powder containing the atom A can be removed.

The steps A3-1b to A3-3b are the same as the steps A3-1 to A3-3, except that the atom A is replaced with another atom (for example, a silicon atom).

(Suitable Aspect of Method for Producing Light-Shielding Pigment Containing Atom A)

Examples of a suitable aspect of the method for producing the light-shielding pigment containing the atom A includes a method which is for producing the light-shielding pigment containing the atom A and includes the following steps in order from the top.

Step A: A step of supplying, as a plasma gas, an inert gas containing no nitrogen gas into a plasma torch to generate a thermal plasma flame Step B: A step of supplying a metal raw material powder containing a transition metal to the thermal plasma flame in the plasma torch, and evaporating the metal raw material powder to obtain a gas-phase raw material metal Step C: A step of cooling the gas-phase raw material metal to obtain fine metal particles containing a transition metal Step G: A step of classifying the obtained particles Step A3-1: A step of supplying, as a plasma gas, an inert gas containing no nitrogen gas into a plasma torch to generate a thermal plasma flame Step A3-2: A step of supplying a raw material powder containing an atom A to the thermal plasma flame in the plasma torch, and evaporating the raw material powder to obtain a gas-phase atom A Step A3-3: A step of cooling the gas-phase atom A to obtain an atomized atom A Step G: A step of classifying the obtained particles Step A2: A step of mixing an atom A (in this case, the atomized atom A) with the metal raw material powder (in this case, the fine metal particles) containing a specific transition metal Step D: A step of supplying, as a plasma gas, an inert gas containing a nitrogen gas into a plasma torch to generate a thermal plasma flame Step E: A step of supplying the fine metal particles containing a specific transition metal to the thermal plasma flame in the plasma torch, and evaporating the fine metal particles to obtain a gas-phase raw material metal Step F: A step of cooling the gas-phase raw material metal to obtain a light-shielding pigment Step G: A step of classifying the obtained particles Step H: A step of exposing the light-shielding pigment obtained in the step G to a mixed atmosphere of water vapor and a nitrogen gas to perform a nitriding treatment The step A2 may be the step A2b.

Furthermore, in the series of steps, the order of the steps A to C and the steps A3-1 to A3-3 (and the steps A3-1b to A3-3b) may be exchanged. That is, the steps A to C may be carried out after the steps A3-1 to A3-3 (and the steps A3-1b to A3-3b).

According to the suitable aspect of the method for producing the light-shielding pigment containing the atom A, the impurities contained in the metal raw material powder and the raw material particles can be removed, and a light-shielding pigment having a desired average primary particle diameter can be produced.

The mechanism by which the impurities are removed is not always clear, but the present inventors presume as follows. That is, it is presumed that the transition metal and/or the atom A is ionized by a plasma treatment, and in a case where the ions are cooled, the transition metal, the atom A, and the impurities are atomized by reflecting each melting point thereof. In this case, an atom having a low melting point is rapidly granulated, and an atom having a high melting point is slowly granulated. Therefore, as described above, it is presumed that fine particles (the steps B and C, and the steps A3-2 and A3-3) which are once subjected to the plasma treatment are likely to be a single component (single crystal). In a case where the particles of the single component obtained as described above are classified, the particles of the impurities can be removed due to a difference in density and/or particle diameter between the particles of the specific transition metal and/or the particles of the atom A and the particles of the impurities. Moreover, the classification can be performed, for example, by using a cyclone or the like and appropriately setting classification conditions.

(Purification of Metal Raw Material Powder and Raw Material Powder)

The metal raw material powder (hereinafter, simply referred to as a "metal raw material powder") containing the transition metal which can be used in the step B, and the raw material powder containing the atom A and the raw material powder containing the other atom (a silicon atom or the like) (hereinafter, the raw material powder containing the atom A and the raw material powder containing the other atom are collectively and simply referred to as a "raw material powder") are not particularly limited, but preferably have high purity. The content of the transition metal in the metal raw material powder is not particularly limited, but is preferably equal to or greater than 99.99% and more preferably equal to or greater than 99.999%. Moreover, the same applies to the content of the atom A or the like in the raw material powder.

The metal raw material powder and/or the raw material powder contains, as impurities, atoms other than desired atoms in some cases. Examples of the impurities contained in the metal raw material powder include boron, aluminum, silicon, manganese, iron, nickel, and silver. Moreover, examples of the impurities contained in the raw material powder include a metallic element.

In a case where the metal raw material powder and/or the raw material powder contains unintended impurities, the performance of the obtained composition deteriorates in some cases. Therefore, the method for producing a light-shielding pigment may further include the following step A0 before the step B (in a case where the method includes the step A2 (or the step A2b), before the step A2 (or the step A2b)).

Step A0: A step of removing impurities from the metal raw material powder and/or the raw material powder Step A0

In the step A0, a method (separation and purification method) for removing impurities from the metal raw material powder and/or the raw material powder is not particularly limited, but for example, for niobium, the method described in paragraphs 0013 to 0030 of JP2012-211048A can be used, and also for another metal raw material powder and/or another raw material powder, a method equivalent to the aforementioned method can be used.

(Coating of Light-Shielding Pigment)

The light-shielding pigment may be a light-shielding pigment coated with an inorganic compound. That is, the light-shielding pigment may be a coated light-shielding pigment having a light-shielding pigment and a coating layer, which is formed of an inorganic compound and coats the light-shielding pigment. The composition containing the light-shielding pigment coated with the inorganic compound has superior dispersion stability.

The inorganic compound is not particularly limited, and examples thereof include an oxide such as $SiO_2$, $ZrO_2$, $TiO_2$, $GeO_2$, $Al_2O_3$, $Y_2O_3$, and $P_2O$, and a hydroxide such as aluminum hydroxide and zirconium hydroxide. Among them, from the viewpoints that a thinner coat is easily formed and a coat having a higher coverage is easily formed, aluminum hydroxide is preferable.

Furthermore, in a case where controlling a refractive index of the light-shielding pigment is intended, silicon oxide is preferable as a coat having a low refractive index, and zirconium hydroxide is preferable as a coat having a high refractive index.

A method for coating the light-shielding pigment with the inorganic compound is not particularly limited, but the method for producing a light-shielding pigment preferably includes the following inorganic compound coating step.

Inorganic Compound Coating Step

The inorganic compound coating step is a step of coating the light-shielding pigment with an oxide and/or a hydroxide. The coating method is not particularly limited, but examples thereof include the following wet coating methods.

As a first wet coating method, first, the light-shielding pigment is mixed with water to produce a slurry. Subsequently, a water-soluble compound (for example, sodium silicate) containing at least one selected from the group consisting of Si, Zr, Ti, Ge, Al, Y, and P is reacted with the slurry, excess alkali ions are removed by decantation and/or ion exchange resin, and then the slurry is dried to obtain a light-shielding pigment coated with an oxide.

As a second wet coating method, first, the light-shielding pigment is mixed with an organic solvent such as alcohol to produce a slurry. Subsequently, an organometallic compound such as alkoxide containing at least one selected from the group consisting of Si, Zr, Ti, Ge, Al, Y, and P is produced in the slurry, and the slurry is fired at a high temperature. In a case where the slurry is fired at a high temperature, a sol-gel reaction proceeds, and a light-shielding pigment coated with an oxide is obtained.

As a third wet coating method, urea and aluminum chloride are used in the presence of a light-shielding pigment to form a slurry containing an ionic liquid. The light-shielding pigment is taken out from the slurry and dried, and then the light-shielding pigment is fired to obtain a light-shielding pigment coated with a hydroxide including aluminum hydroxide.

<Physical Properties of Light-Shielding Pigment>
(Average Primary Particle Diameter)

An average primary particle diameter of the light-shielding pigment is not particularly limited, but is preferably 5 to 100 nm and more preferably 30 to 65 nm.

In a case where the average primary particle diameter is equal to or greater than 30 nm, the light-shielding properties of the cured film formed of the composition are excellent, and in a case where the average primary particle diameter is equal to or less than 65 nm, the precipitation stability of the composition over time is excellent.

Furthermore, the average primary particle diameter in the present specification means an average particle diameter of primary particles, and the average primary particle diameter means an average primary particle diameter measured by the following method.

Sample: A sample obtained by preparing a dispersion liquid (25% by mass of a light-shielding pigment, 7.5% by mass of a dispersant, and 67.5% by mass of a propylene glycol monomethyl ether acetate (PGMEA) solvent) by the method described in Examples below, diluting the obtained dispersion liquid to 100 times with PGMEA, then adding the resultant dropwise on a carbon foil, and drying the resultant In addition, as the dispersant, a dispersant capable of dispersing the light-shielding pigment to such an extent that the primary particles of the light-shielding pigment can be recognized in an image obtained by the following method is used. Specific examples of the dispersant include the dispersants described in Examples. The primary particles refer to independent particles which are not aggregated.

The sample is observed with a transmission electron microscope (TEM) at a magnification of 20,000 to obtain an image. Among the light-shielding pigments in the obtained image, primary particles are selected, and areas of the primary particles are calculated by image processing.

Subsequently, diameters in a case where the obtained areas are converted into circles are calculated. This operation is performed on a total of 400 primary particles of the light-shielding pigment for 4 visual fields, and the evaluated circle-converted diameters are arithmetically averaged to obtain an average primary particle diameter of the light-shielding pigment.

(Conductivity)

A conductivity of the light-shielding pigment is not particularly limited, but is preferably $100 \times 10^4$ to $600 \times 10^4$ S/m, more preferably $165 \times 10^4$ to $340 \times 10^4$ S/m, even more preferably $165 \times 10^4$ S/m to $220 \times 10^4$ S/m, and particularly preferably 170 to $190 \times 10^4$ S/m. In a case where the lower limit value of the conductivity of the light-shielding pigment is equal to or greater than $165 \times 10^4$ S/m and the upper limit value thereof is equal to or less than $340 \times 10^4$ S/m, a cured film formed of the composition containing the light-shielding pigment has superior light-shielding properties and excellent electrode anticorrosion properties.

Furthermore, in the present specification, the conductivity means a conductivity measured by the following method using a powder resistivity measurement system MCP-PD51 manufactured by Mitsubishi Chemical Analytech Co., Ltd.

First, a volume resistivity ($\rho$) of the particle is measured by packing a predetermined amount of the light-shielding pigment in a measuring container of the aforementioned measuring device, then starting pressurizing, and changing a pressure to 0 kN, 1 kN, 5 kN, 10 kN, and 20 kN. A saturated volume resistivity is determined from the measurement result under a condition where the volume resistivity does not depend on the pressure, and a conductivity ($\sigma$) is calculated by using the obtained saturated volume resistivity and a relational expression of $\sigma = 1/\rho$. Moreover, the test is performed in a room-temperature environment.

[Colorant]

The composition according to the embodiment of the present invention may contain a colorant in addition to the light-shielding pigment. The light-shielding characteristics of the cured film (light-shielding film) can be adjusted by using both the light-shielding pigment and one or more colorants. Moreover, for example, in a case where the cured film is used as a light-attenuating film, each wavelength of light containing a wide wavelength component is likely to be uniformly attenuated.

Examples of the colorant include a pigment and a dye.

In a case where the composition contains the colorant, the total content of the light-shielding pigment and the colorant is preferably 10% to 90% by mass, more preferably 30% to 70% by mass, and even more preferably 40% to 60% by mass, with respect to the total mass of the solid content of the composition.

Furthermore, in a case where the cured film formed of the composition according to the embodiment of the present invention is used as a light-attenuating film, it is also preferable that the total content of the light-shielding pigment and the colorant is less than the above suitable range.

Moreover, a mass ratio (content of colorant/content of light-shielding pigment) of the content of the colorant to the content of the light-shielding pigment is preferably 0.1 to 9.0.

<Pigment>
(Black Pigment)

Examples of the pigment include a black pigment.

As the black pigment, various known black pigments can be used. The black pigment may be an inorganic pigment or an organic pigment. Here, the black pigment is different from the aforementioned light-shielding pigment.

Examples of the black inorganic pigment include a metal oxide, a metal nitride, and a metal oxynitride which contain a metallic element of group 4 such as titanium (Ti) and zirconium (Zr), a metallic element of group 5 such as vanadium (V) and niobium (Nb), or one or more metallic elements selected from the group consisting of cobalt (Co), chromium (Cr), copper (Cu), manganese (Mn), ruthenium (Ru), iron (Fe), nickel (Ni), tin (Sn), and silver (Ag). Here, in a case where the metal in the metal nitride and the metal oxynitride is a transition metal which is other than hafnium and has an electronegativity of 1.22 to 1.80, among the transition metals of groups 3 to 7, the metal nitride contains neither hafnium nor tungsten. Moreover, in a case where the metal in the metal nitride and the metal oxynitride is hafnium, the metal nitride does not contain tungsten.

The inorganic pigment may be subjected to a surface modification treatment. For example, inorganic particles, which are subjected to a surface modification treatment with a surface-treating agent having both a silicone group and an alkyl group, are mentioned, and examples thereof include "KTP-09" series (produced by Shin-Etsu Chemical Co., Ltd.). Moreover, the metal oxide, the metal nitride, and the metal oxynitride may be used as particles in which other atoms are further mixed. For example, the metal oxide, the metal nitride, and the metal oxynitride may be used as a metal oxide, a metal nitride, and a metal oxynitride which further contain an atom (preferably, a sulfur atom) selected from elements of groups 13 to 17 of the periodic table.

As the black pigment, carbon black is also mentioned. Specific examples of the carbon black include an organic pigment such as C. I. Pigment Black 1 and an inorganic pigment such as C. I. Pigment Black 7, all of which are commercial products.

Among them, the black pigment is preferably a nitride or oxynitride of a metallic element of group 4, a nitride or oxynitride of a metallic element of group 5, or carbon black, and more preferably a nitride or oxynitride of titanium, a nitride or oxynitride of zirconium, a nitride or oxynitride of vanadium, a nitride or oxynitride of niobium, or carbon black.

Furthermore, the nitride of titanium is titanium nitride, the nitride of zirconium is zirconium nitride, the nitride of vanadium is vanadium nitride, and the nitride of niobium is niobium nitride. Moreover, the oxynitride of titanium is titanium oxynitride, the oxynitride of zirconium is zirconium oxynitride, the oxynitride of vanadium is vanadium oxynitride, and the oxynitride of niobium is niobium oxynitride.

The black pigment is preferably a pigment as fine as possible. Even considering handleability, an average primary particle diameter of the black pigment is preferably 0.01 to 0.1 μm and more preferably 0.01 to 0.05 μm.

In addition, in the present specification, the titanium nitride means TiN, and may contain an oxygen atom (for example, the surfaces of TiN particles are unintentionally oxidized, or the like) which is unavoidable in production.

In the present specification, the titanium nitride means a compound in which a diffraction angle 2θ of a peak derived from a (200) plane in a case where Cukα rays are used as an X-ray source is 42.5° to 42.8°.

Moreover, in the present specification, the titanium oxynitride means a compound in which the diffraction angle 2θ of the peak derived from the (200) plane in a case where the Cukα rays are used as an X-ray source is greater than 42.8°. The upper limit value of the diffraction angle 2θ of the titanium oxynitride is not particularly limited, but is preferably equal to or less than 43.5°.

Examples of the titanium oxynitride include titanium black, and more specifically, for example, an aspect in which lower titanium oxide represented by $TiO_2$ or $Ti_nO_{2n-1}$ (1≤n≤20) and/or a titanium oxynitride represented by $TiN_xO_y$ (0<x<2.0 and 0.1<y<2.0) is included can be mentioned. In the following description, the titanium nitride (the diffraction angle 2θ is 42.5° to 42.8°) and the titanium oxynitride (the diffraction angle 2θ is greater than 42.8°) are collectively referred to as a titanium nitride, and an aspect thereof will be described.

Furthermore, the titanium nitride may be used as particles in which other atoms are further mixed. For example, the titanium nitride may be used as titanium nitride-containing particles which further contain an atom (preferably, a sulfur atom) selected from elements of groups 13 to 17 of the periodic table. Moreover, the same applies to other metal nitrides, and the metal nitride, which refers to both the metal nitride and the metal oxynitride, may be used as particles in which other atoms are further mixed. For example, the metal nitride may be used as a metal nitride which further contains an atom (preferably, a sulfur atom) selected from elements of groups 13 to 17 of the periodic table.

In a case where the X-ray diffraction spectrum of the titanium nitride is measured using the Cukα rays as an X-ray source, as a peak with the highest intensity, for TiN, a peak derived from the (200) plane is observed near 2θ of 42.5°, and for TiO, a peak derived from the (200) plane is observed near 2θ of 43.4°. Meanwhile, although the peak is not a peak with the highest intensity, for anatase-type $TiO_2$, a peak derived from the (200) plane is observed near 2θ of 48.1°, and for rutile-type $TiO_2$, a peak derived from the (200) plane is observed near 2θ of 39.2°. Therefore, as the titanium oxynitride contains more oxygen atoms, the peak position shifts to a side of an angle higher than 42.5°.

In a case where the titanium nitride contains titanium oxide $TiO_2$, as a peak with the highest intensity, a peak oxide $TiO_2$ (101) is found near 2θ of 25.3°, and a peak derived from rutile-type $TiO_2$ (110) is found near 2θ of 27.4°. However, $TiO_2$ is white and is a factor which causes deterioration of light-shielding properties of a light-shielding film obtained by curing the composition, and thus it is preferable that $TiO_2$ is reduced to such an extent that $TiO_2$ is not observed as a peak.

A size of a crystallite constituting the titanium nitride can be determined from a half-width of the peak obtained by the measurement of the X-ray diffraction spectrum. The crystallite size can be calculated using the Scherrer equation.

The size of the crystallite constituting the titanium nitride is preferably equal to or less than 50 nm and preferably equal to or greater than 20 nm. In a case where the crystallite size is 20 to 50 nm, the cured film formed of the composition is likely to have a higher transmittance of an ultraviolet ray (particularly, an i-line (wavelength of 365 nm)), and a composition having higher photosensitivity can be obtained.

A specific surface area of the titanium nitride is not particularly limited, but is determined by the Brunauer-Emmett-Teller (BET) method. The specific surface area of the titanium nitride is preferably 5 to 100 m$^2$/g and more preferably 10 to 60 m$^2$/g.

A method for producing the black pigment is not particularly limited, known production methods can be used, and examples thereof include a gas-phase reaction method. Examples of the gas-phase reaction method include an electric furnace method and a thermal plasma method, but from the viewpoints that few impurities are mixed in, particle diameters are easily uniform, and productivity is high, a thermal plasma method is preferable.

In the thermal plasma method, the method for generating thermal plasma is not particularly limited, examples thereof include direct-current arc discharge, multi-layer arc discharge, radio-frequency (RF) plasma, and hybrid plasma, and a radio-frequency plasma in which few impurities are mixed in from an electrode is more preferable.

A specific method for producing the black pigment by the thermal plasma method is not particularly limited, but for example, as a method for producing the titanium nitride, a method (JP1990-022110A (JP-H02-022110A)) for reacting titanium tetrachloride with an ammonia gas in a plasma flame, a method (JP1986-011140A (JP-S61-011140A)) for performing synthesis by evaporating a titanium powder by radio-frequency thermal plasma, introducing nitrogen as a carrier gas, and performing nitriding in a cooling process, a method (JP1988-085007A (JP-S63-085007A)) for blowing an ammonia gas into a peripheral portion of plasma, and the like can be mentioned.

Here, the method for producing the black pigment is not limited to the aforementioned method, and the production method is not limited as long as a black pigment having desired physical properties is obtained.

The black pigment may contain, on the surface, a layer of a compound (hereinafter, referred to as a "silicon-containing compound") containing silicon. That is, the black pigment may be a black pigment obtained by coating the (oxy)nitride of the metallic atom with the silicon-containing compound.

A method for coating the (oxy)nitride of the metallic atom is not particularly limited, known methods can be used, and examples thereof include the method (the (oxy)nitride of the metallic atom is used instead of the titanium oxide) described on page 2, lower right to page 4, upper right in JP1978-033228A (JP-S53-033228A), the method (the (oxy) nitride of the metallic atom is used instead of the fine titanium dioxide particles) described in paragraphs 0015 to 0043 of JP2008-069193A, and the method (the (oxy)nitride of the metallic atom is used instead of the fine metal oxide particles) described in paragraphs 0020 and 0124 to 0138 of JP2016-074870A, the contents of which are incorporated into the present specification.

The black pigments may be used singly or in combination of two or more thereof.

(Other Pigments)

The pigment may be another pigment other than the black pigment, and the other pigment may be an inorganic pigment or an organic pigment.

Inorganic Pigment

The inorganic pigment is not particularly limited, and known inorganic pigments can be used.

Examples of the inorganic pigment include zinc oxide, white lead, lithopone, titanium oxide, chromium oxide, iron oxide, precipitated barium sulfate and a barite powder, red lead, red iron oxide, chrome yellow, zinc yellow (zinc yellow type 1 and zinc yellow type 2), ultramarine blue, Prussian blue (potassium ferric ferrocyanide), zircon grey, Praseodymium yellow, chromium titanium yellow, chrome green, peacock, Victoria green, iron blue (irrelevant to Prussian blue), vanadium zirconium blue, chrome tin pink, manganese pink, and salmon pink.

The inorganic pigment may be subjected to a surface modification treatment. For example, an inorganic pigment, which is subjected to a surface modification treatment with a surface-treating agent having both a silicone group and an alkyl group, is mentioned, and examples thereof include "KTP-09" series (produced by Shin-Etsu Chemical Co., Ltd.).

A pigment having infrared-absorbing properties can also be used.

As the pigment having infrared-absorbing properties, a tungsten compound, a metal boride, and the like are preferable, and among them, from the viewpoint that light-shielding properties in a wavelength in an infrared range are excellent, a tungsten compound is preferable. In particular, from the viewpoint that translucency in a visible light range and a light absorption wavelength range of an oxime-based polymerization initiator, which is related to curing efficiency due to exposure, is excellent, a tungsten compound is preferable.

These pigments may be used in combination of two or more thereof, and may be used in combination with a dye which will be described later. In order to adjust tint and to enhance light-shielding properties in a desired wavelength range, for example, an aspect in which a dye described later or a pigment which has a chromatic color such as red, green, yellow, orange, violet, and blue is mixed with a pigment which is black or has infrared ray-shielding properties can be mentioned. It is preferable that a red pigment or dye or a violet pigment or dye is mixed with the pigment having infrared ray-shielding properties, and more preferable that a red pigment is mixed with a pigment having infrared ray-shielding properties.

Furthermore, an infrared absorber will be described later may be added.

Organic Pigment

Examples of organic pigments include: Color Index (C. I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, 214, and the like;

C. I. Pigment Orange 2, 5, 13, 16, 17:1, 31, 34, 36, 38, 43, 46, 48, 49, 51, 52, 55, 59, 60, 61, 62, 64, 71, 73, and the like;

C. I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, 279, and the like;

C. I. Pigment Green 7, 10, 36, 37, 58, 59, and the like;

C. I. Pigment Violet 1, 19, 23, 27, 32, 37, 42, and the like; and

C. I. Pigment Blue 1, 2, 15, 15:1, 15:2, 15:3, 15:4, 15:6, 16, 22, 60, 64, 66, 79, 80, and the like. Furthermore, the pigments may be used singly or in combination of two or more thereof.

<Dye>

As a coloring dye, for example, the colorant described in paragraphs 0027 to 0200 of JP2014-042375A can also be used in addition to a dye (chromatic dye) having a chromatic color such as red (R), green (G), and blue (B). Moreover, a black dye can be used.

As the dye, for example, the coloring agents disclosed in JP1989-090403A (JP-S64-090403A), JP1989-091102A (JP-S64-091102A), JP1989-094301A (JP-H01-094301A), JP1994-011614A (JP-H06-011614A), JP2592207B, U.S. Pat. Nos. 4,808,501A, 5,667,920A, 0,505,950A, 5,667,920A, JP1993-333207A (JP-H05-333207A), JP1994-035183A (JP-H06-035183A), JP1994-051115A (JP-H06-051115A), JP1994-194828A (JP-H06-194828A), and the like can be used. In a case where the dyes are sorted based on the chemical structure, a pyrazole azo compound, a pyrromethene compound, an anilinoazo compound, a triphenylmethane compound, an anthraquinone compound, a benzylidene compound, an oxonol compound, a pyrazolotriazole azo compound, a pyridone azo compound, a cyanine compound, a phenothiazine compound, a pyrrolopyrazole azomethine compound, or the like can be used. Moreover, a coloring agent multimer may be used as the dye. Examples of the coloring agent multimer include the compounds described in JP2011-213925A and JP2013-041097A. Furthermore, a polymerizable dye having a polymerizable group in a molecule may be used, and examples of a commercial product thereof include RDW series produced by FUJIFILM Wako Pure Chemical Corporation.

<Infrared Absorber>

The colorant may further contain an infrared absorber.

The infrared absorber means a compound having absorption in a wavelength range of an infrared range (preferably, a wavelength of 650 to 1,300 nm). The infrared absorber is preferably a compound having a maximum absorption in a wavelength range of 675 to 900 nm.

Examples of a colorant having such spectral characteristics include a pyrrolopyrrole compound, a copper compound, a cyanine compound, a phthalocyanine compound, an iminium compound, a thiol complex-based compound, a transition metal oxide-based compound, a squarylium compound, a naphthalocyanine compound, a quaterrylene compound, a dithiol metal complex-based compound, and a croconium compound.

As the phthalocyanine compound, the naphthalocyanine compound, the iminium compound, the cyanine compound, the squarylium compound, and the croconium compound, the compounds disclosed in paragraphs 0010 to 0081 of JP2010-111750A may be used, the contents of which are incorporated into the present specification. Regarding the cyanine compound, reference can be made to, for example, "Functional Dyes, written by Makoto OKAWARA, Masaru MATSUOKA, Teijiro KITAO, and Tsuneaki HIRASHIMA, Kodansha Scientific Ltd.", the contents of which are incorporated into the specification of the present application.

As the colorant having spectral characteristics, the compound disclosed in paragraphs 0004 to 0016 of JP1995-164729A (JP-H07-164729A) and/or the compound disclosed in paragraphs 0027 to 0062 of JP2002-146254A, and the near-infrared absorption particles which are disclosed in paragraphs 0034 to 0067 of JP2011-164583A, consist of crystallites of an oxide containing Cu and/or P, and have a number-average aggregated particle diameter of 5 to 200 nm may be used.

As the compound having a maximum absorption in a wavelength range of 675 to 900 nm, at least one selected from the group consisting of a cyanine compound, a pyrrolopyrrole compound, a squarylium compound, a phthalocyanine compound, and a naphthalocyanine compound is preferable.

Furthermore, the infrared absorber is preferably a compound which is dissolved in an amount equal to or greater than 1% by mass in water at 25° C., and more preferably a compound which is dissolved in an amount equal to or greater than 10% by mass in water at 25° C. In a case where such a compound is used, solvent resistance is improved.

Regarding the pyrrolopyrrole compound, reference can be made to paragraphs 0049 to 0062 of JP2010-222557A, the contents of which are incorporated into the present specification. Regarding the cyanine compound and the squarylium compound, reference can be made to paragraphs 0022 to 0063 of WO2014/088063A, paragraphs 0053 to 0118 of WO2014/030628A, paragraphs 0028 to 0074 of JP2014-059550A, paragraphs 0013 to 0091 of WO2012/169447A, paragraphs 0019 to 0033 of JP2015-176046A, paragraphs 0053 to 0099 of JP2014-063144A, paragraphs 0085 to 0150 of JP2014-052431A, paragraphs 0076 to 0124 of JP2014-044301A, paragraphs 0045 to 0078 of JP2012-008532A, paragraphs 0027 to 0067 of JP2015-172102A, paragraphs 0029 to 0067 of JP2015-172004A, paragraphs 0029 to 0085 of JP2015-040895A, paragraphs 0022 to 0036 of JP2014-126642A, paragraphs 0011 to 0017 of JP2014-148567A, paragraphs 0010 to 0025 of JP2015-157893A, paragraphs 0013 to 0026 of JP2014-095007A, paragraphs 0013 to 0047 of JP2014-080487A, paragraphs 0007 to 0028 of JP2013-227403A, and the like, the contents of which are incorporated into the present specification.

[Resin]

The composition according to the embodiment of the present invention contains a resin. Examples of the resin include a dispersant and an alkali-soluble resin.

A content of the resin in the composition is not particularly limited, but is preferably 3% to 60% by mass, more preferably 10% to 40% by mass, and even more preferably 15% to 35% by mass, with respect to the total solid content of the composition. The resins may be used singly or in combination of two or more thereof. In a case where two or more resins are used in combination, the total content thereof is preferably within the above range.

A molecular weight of the resin is greater than 2,000. Moreover, in a case where the molecular weight of the resin is polydisperse, a weight-average molecular weight thereof is greater than 2,000.

<Dispersant>

The composition preferably contains a dispersant. Moreover, in the present specification, a dispersant means a compound different from the alkali-soluble resin which will be described later.

A content of the dispersant in the composition is not particularly limited, but is preferably 2% to 40% by mass, more preferably 5% to 30% by mass, and even more preferably 10% to 20% by mass, with respect to the total solid content of the composition.

The dispersants may be used singly or in combination of two or more thereof. In a case where two or more dispersants are used in combination, the total content thereof is preferably within the above range.

Furthermore, in the composition, a mass ratio (content of dispersant/content of light-shielding pigment) of the content of the dispersant (preferably, a graft polymer) to the content of the light-shielding pigment is preferably 0.05 to 1.00, more preferably 0.05 to 0.35, and even more preferably 0.20 to 0.35.

As the dispersant, for example, known dispersants can be appropriately selected and used. Among them, a polymer compound is preferable.

Examples of the dispersant include a polymer dispersant [for example, polyamidoamine and a salt thereof, polycarboxylic acid and a salt thereof, high-molecular-weight unsaturated acid ester, modified polyurethane, modified polyester, modified poly(meth)acrylate, a (meth)acrylic copolymer, and a naphthalenesulfonic acid-formalin condensate], polyoxyethylene alkyl phosphoric acid ester, polyoxyethylene alkylamine, and a pigment derivative.

The polymer compound can be further classified into a linear polymer, a terminal-modified polymer, a graft polymer, and a block polymer based on the structure.

Polymer Compound

The polymer compound acts to prevent the reaggregation of a substance to be dispersed by being adsorbed onto a surface of the substance to be dispersed, such as the light-shielding pigment and another pigment (hereinafter, the light-shielding pigment and the other pigment are collectively and simply referred to as a "pigment" as well) used in combination if desired. Therefore, a terminal-modified polymer, a graft (containing a polymer chain) polymer, or a block polymer is preferable which contains a moiety anchored to the pigment surface.

The polymer compound may contain a curable group.

Examples of the curable group include an ethylenically unsaturated group (for example, a (meth)acryloyl group, a vinyl group, a styryl group, and the like), and a cyclic ether group (for example, an epoxy group, an oxetanyl group, and the like), but the present invention is not limited thereto.

Among them, from the viewpoint that polymerization can be controlled by a radical reaction, as the curable group, an ethylenically unsaturated group is preferable. As the ethylenically unsaturated group, a (meth)acryloyl group is more preferable.

The resin containing a curable group preferably has at least one selected from the group consisting of a polyester structure and a polyether structure. In this case, the polyester structure and/or the polyether structure may be included in a main chain, and as will be described later, in a case where the resin has a structural unit containing a graft chain, the polymer chain may have a polyester structure and/or a polyether structure.

As the resin, a resin in which the polymer chain has a polyester structure is more preferable.

The polymer compound preferably has a structural unit containing a graft chain. Moreover, in the present specification, the "structural unit" has the same definition as a "repeating unit".

Such a polymer compound having the structural unit containing a graft chain has an affinity with a solvent due to the graft chain, and thus is excellent in dispersibility of a pigment or the like and dispersion stability (temporal stability) after the lapse of time. Moreover, due to the presence of the graft chain, the polymer compound having the structural unit containing a graft chain has an affinity with a polymerizable compound or other resins which can be used in combination. As a result, residues are less likely to be generated in alkali development.

In a case where the graft chain is prolonged, a steric repulsion effect is enhanced, and thus the dispersibility of the pigment or the like is improved. Meanwhile, in a case where the graft chain is too long, adsorptive power to the pigment or the like is reduced, and thus the dispersibility of the pigment or the like tends to be reduced. Therefore, the number of atoms excluding a hydrogen atom in the graft chain is preferably 40 to 10,000, more preferably 50 to 2,000, and even more preferably 60 to 500.

Herein, the graft chain refers to a portion from the base (in a group which is branched off from the main chain, an atom bonded to the main chain) of a main chain of the copolymer to the terminal of a group branched off from the main chain.

The graft chain preferably has a polymer structure, and examples of such a polymer structure include a poly(meth)acrylate structure (for example, a poly(meth)acryl structure), a polyester structure, a polyurethane structure, a polyurea structure, a polyamide structure, and a polyether structure.

In order to improve interactive properties between the graft chain and the solvent, and thus enhance the dispersibility of the pigment or the like, the graft chain is preferably a graft chain having at least one selected from the group consisting of a polyester structure, a polyether structure, and a poly(meth)acrylate structure, and more preferably a graft chain having at least one of a polyester structure or a polyether structure.

A macromonomer (a monomer which has a polymer structure and constitutes a graft chain by being bonded to the main chain of a copolymer) containing such a graft chain is not particularly limited, but a macromonomer containing a reactive double bond group can be suitably used.

As a commercial macromonomer, which corresponds to a structural unit containing a graft chain contained in the polymer compound and is suitably used for synthesizing the polymer compound, AA-6 (trade name, produced by TOAGOSEI CO., LTD.), AA-10 (trade name, produced by TOAGOSEI CO., LTD.), AB-6 (trade name, produced by TOAGOSEI CO., LTD.), AS-6 (trade name, produced by TOAGOSEI CO., LTD.), AN-6 (trade name, produced by TOAGOSEI CO., LTD.), AW-6 (trade name, produced by TOAGOSEI CO., LTD.), AA-714 (trade name, produced by TOAGOSEI CO., LTD.), AY-707 (trade name, produced by TOAGOSEI CO., LTD.), AY-714 (trade name, produced by TOAGOSEI CO., LTD.), AK-5 (trade name, produced by TOAGOSEI CO., LTD.), AK-30 (trade name, produced by TOAGOSEI CO., LTD.), AK-32 (trade name, produced by TOAGOSEI CO., LTD.), BLEMMER PP-100 (trade name, produced by NOF CORPORATION), BLEMMER PP-500 (trade name, produced by NOF CORPORATION), BLEMMER PP-800 (trade name, produced by NOF CORPORATION), BLEMMER PP-1000 (trade name, produced by NOF CORPORATION), BLEMMER 55-PET-800 (trade name, produced by NOF CORPORATION), BLEMMER PME-4000 (trade name, produced by NOF CORPORATION), BLEMMER PSE-400 (trade name, produced by NOF CORPORATION), BLEMMER PSE-1300 (trade name, produced by NOF CORPORATION), BLEMMER 43PAPE-600B (trade name, produced by NOF CORPORATION), or the like is used. Among them, AA-6 (trade name, produced by TOAGOSEI CO., LTD.), AA-10 (trade name, produced by TOAGOSEI CO., LTD.), AB-6 (trade name, produced by TOAGOSEI CO., LTD.), AS-6 (trade name, produced by TOAGOSEI CO., LTD.), AN-6 (trade name, produced by TOAGOSEI CO., LTD.), or BLEMMER PME-4000 (trade name, produced by NOF CORPORATION) is preferable.

The dispersant preferably has at least one structure selected from the group consisting of polymethyl acrylate, polymethyl methacrylate, and cyclic or chain-like polyester, more preferably has at least one structure selected from the group consisting of polymethyl acrylate, polymethyl methacrylate, and chain-like polyester, and even more preferably has at least one structure selected from the group consisting of a polymethyl acrylate structure, a polymethyl methacrylate structure, a polycaprolactone structure, and a polyvalerolactone structure. The dispersant may be a dispersant having the aforementioned structure alone in one dispersant, or may be a dispersant having a plurality of these structures in one dispersant.

Herein, the polycaprolactone structure refers to a structure containing a structure, which is obtained by ring opening of ε-caprolactone, as a repeating unit. The polyvalerolactone structure refers to a structure containing a structure, which is obtained by ring opening of δ-valerolactone, as a repeating unit.

Specific examples of the dispersant having a polycaprolactone structure include dispersants in which j and k in Formula (1) and Formula (2) are each 5. Moreover, specific examples of the dispersant having a polyvalerolactone structure include dispersants in which j and k in Formula (1) and Formula (2) are each 4.

Specific examples of the dispersant having a polymethyl acrylate structure include dispersants in which in Formula (4), $X^5$ is a hydrogen atom and $R^4$ is a methyl group. Moreover, specific examples of the dispersant having a polymethyl methacrylate structure include dispersants in which in Formula (4), $X^5$ is a methyl group and $R^4$ is a methyl group.

Structural Unit Containing Graft Chain

As the structural unit containing a graft chain, the polymer compound preferably has a structural unit represented by any one of Formula (1), . . . , or Formula (4), and more preferably has a structural unit represented by any one of Formula (A), Formula (2A), Formula (3A), Formula (3B), or Formula (4).

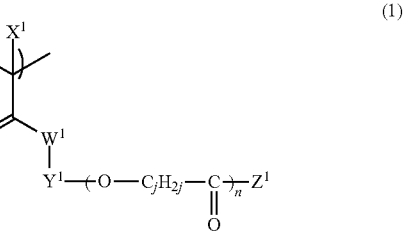

(1)

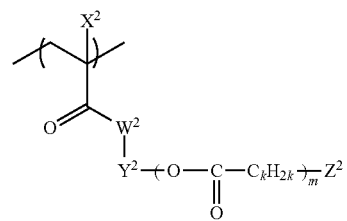
(2)

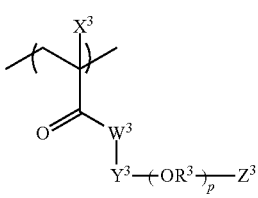
(3)

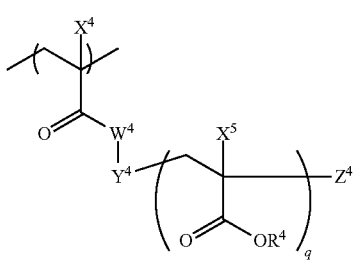
(4)

In Formulae (1) to (4), $W^1$, $W^2$, $W^3$, and $W^4$ each independently represent an oxygen atom or NH. $W^1$, $W^2$, $W^3$, and $W^4$ are each preferably an oxygen atom.

In Formulae (1) to (4), $X^1$, $X^2$, $X^3$, $X^4$, and $X^5$ each independently represent a hydrogen atom or a monovalent organic group. From the viewpoint of the restriction on synthesis, $X^1$, $X^2$, $X^3$, $X^4$, and $X^5$ are preferably each independently a hydrogen atom or an alkyl group having 1 to 12 carbon atoms (the number of carbon atoms), more preferably each independently a hydrogen atom or a methyl group, and even more preferably each independently a methyl group.

In Formulae (1) to (4), $Y^1$, $Y^2$, $Y^3$, and $Y^4$ each independently represent a divalent linking group, and the linking group has no particular restriction on a structure. Specific examples of the divalent linking groups represented by $Y^1$, $Y^2$, $Y^3$, and $Y^4$ include linking groups represented by the following (Y-1) to (Y-21). In the following structures, A and B mean moieties bonded to the left terminal group and the right terminal group in Formulae (1) to (4), respectively. Among the following structures, from the viewpoint of simplicity of synthesis, (Y-2) or (Y-13) is more preferable.

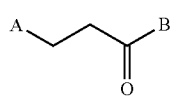
(Y-1)

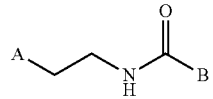
(Y-2)

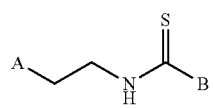
(Y-3)

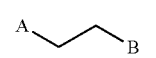
(Y-4)

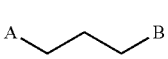
(Y-5)

(Y-6)

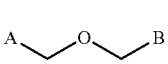
(Y-7)

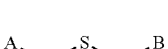
(Y-8)

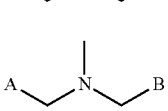
(Y-9)

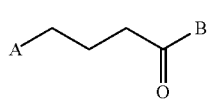
(Y-10)

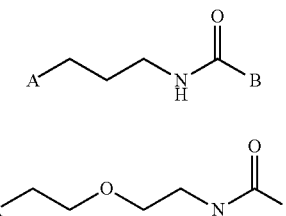
(Y-11)

(Y-12)

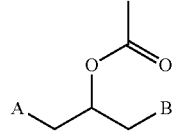
(Y-13)

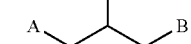
(Y-14)

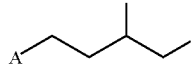
(Y-15)

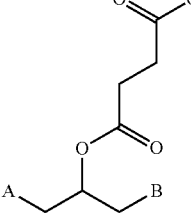
(Y-16)

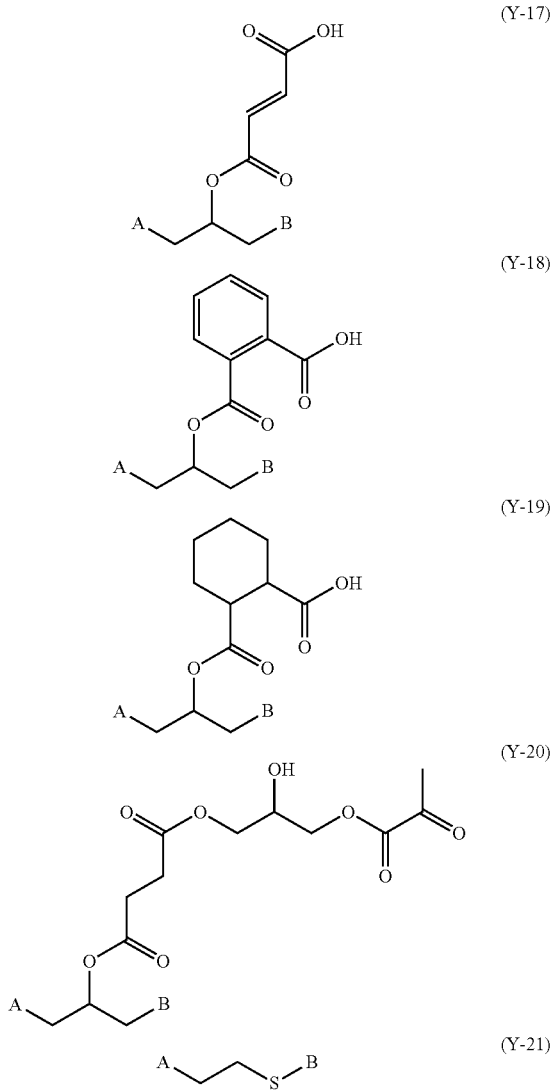

In Formulae (1) to (4), $Z^1$, $Z^2$, $Z^3$, and $Z^4$ each independently represent a monovalent organic group. The structure of the organic group is not particularly limited, but specific examples thereof include an alkyl group, a hydroxyl group, an alkoxy group, an aryloxy group, a heteroaryloxy group, an alkylthioether group, an arylthioether group, a heteroarylthioether group, and an amino group. Among them, particularly from the viewpoint of improvement in the dispersibility, the organic groups represented by $Z^1$, $Z^2$, $Z^3$, and $Z^4$ are each preferably a group exhibiting a steric repulsion effect, and more preferably each independently an alkyl group or alkoxy group having 5 to 24 carbon atoms, and, even more preferably each independently a branched alkyl group having 5 to 24 carbon atoms, a cyclic alkyl group having 5 to 24 carbon atoms, or an alkoxy group having 5 to 24 carbon atoms. Furthermore, the alkyl group contained in the alkoxy group may be any of linear, branched, or cyclic.

In Formulae (1) to (4), n, m, p, and q are each independently an integer of 1 to 500.

Furthermore, in Formulae (1) and (2), j and k each independently represent an integer of 2 to 8. From the viewpoints of the temporal stability and developability of the composition, j and k in Formulae (1) and (2) are each preferably an integer of 4 to 6 and more preferably 5.

In Formulae (1) and (2), n and m are each preferably an integer equal to or greater than 10 and more preferably an integer equal to or greater than 20. Moreover, in a case where the dispersant has a polycaprolactone structure and a polyvalerolactone structure, the sum of the repeating number of the polycaprolactone structure and the repeating number of the polyvalerolactone structure is preferably an integer equal to or greater than 10 and more preferably an integer equal to or greater than 20.

In Formula (3), $R^3$ represents a branched or linear alkylene group, and is preferably an alkylene group having 1 to 10 carbon atoms and more preferably an alkylene group having 2 or 3 carbon atoms. In a case where p is 2 to 500, a plurality of $R^3$'s may be the same as or different from each other.

In Formula (4), $R^4$ represents a hydrogen atom or a monovalent organic group, and the monovalent organic group has no particular limitation on a structure. As $R^4$, a hydrogen atom, an alkyl group, an aryl group, or a heteroaryl group is preferable, and a hydrogen atom or an alkyl group is more preferable. In a case where $R^4$ is an alkyl group, as the alkyl group, a linear alkyl group having 1 to 20 carbon atoms, a branched alkyl group having 3 to 20 carbon atoms, or a cyclic alkyl group having 5 to 20 carbon atoms is preferable, a linear alkyl group having 1 to 20 carbon atoms is more preferable, and a linear alkyl group having 1 to 6 carbon atoms is even more preferable. In a case where q in Formula (4) is 2 to 500, a plurality of $X^5$'s and a plurality of $R^4$'s in the graft copolymer may be respectively the same as or different from each other.

In addition, the polymer compound may have a structural unit which contains two or more different structures and contains a graft chain. That is, the structural units which are represented by Formulae (1) to (4) and have structures different from one another may be included in a molecule of the polymer compound, and in a case where n, m, p, and q in Formulae (1) to (4) each represent an integer equal to or greater than 2, in Formulae (1) and (2), structures in which j and k are different from each other may be included in the side chain, and in Formulae (3) and (4), a plurality of $R^3$'s, a plurality of $R^4$'s, and a plurality of $X^5$'s in the molecule may be respectively the same as or different from each other.

From the viewpoints of the temporal stability and developability of the composition, the structural unit represented by Formula (1) is more preferably a structural unit represented by Formula (A).

Furthermore, from the viewpoints of the temporal stability and developability of the composition, the structural unit represented by Formula (2) is more preferably a structural unit represented by Formula (2A).

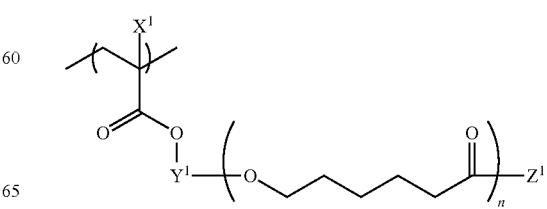

-continued (2A)

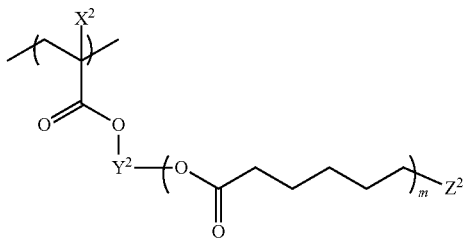

$X^1$, $Y^1$, $Z^1$, and n in Formula (1A) have the same definitions as $X^1$, $Y^1$, $Z^1$, and n in Formula (1), and preferred ranges thereof are also the same. $X^2$, $Y^2$, $Z^2$, and m in Formula (2A) have the same definitions as $X^2$, $Y^2$, $Z^2$, and m in Formula (2), and preferred ranges thereof are also the same.

In addition, from the viewpoints of the temporal stability and developability of the composition, the structural unit represented by Formula (3) is more preferably a structural unit represented by Formula (3A) or (3B).

(3A)

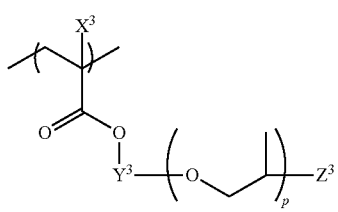

(3B)

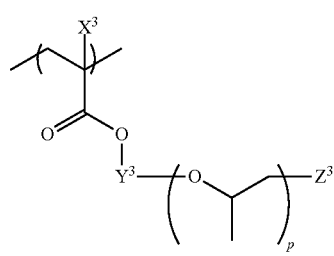

$X^3$, $Y^3$, $Z^3$, and p in Formula (3A) or (3B) have the same definitions as $X^3$, $Y^3$, $Z^3$, and p in Formula (3), and preferred ranges thereof are also the same.

The polymer compound more preferably has, as a structural unit containing a graft chain, the structural unit represented by Formula (A).

The content of the structural unit (for example, the structural units represented by Formulae (1) to (4)) containing a graft chain in the polymer compound is preferably within a range of 2% to 90% by mass and more preferably within a range of 5% to 30% by mass, in terms of mass, with respect to the total mass of the polymer compound. In a case where the structural unit containing a graft chain is within the above range, the dispersibility of the pigment is high and the developability in a case of forming a cured film is favorable.

Hydrophobic Structural Unit

The polymer compound preferably contains a hydrophobic structural unit which is different from the structural unit (that is, the structural unit does not correspond to the structural unit containing a graft chain) containing a graft chain. Here, in the present specification, the hydrophobic structural unit is a structural unit which does not have an acid group (for example, a carboxylic acid group, a sulfonic acid group, a phosphoric acid group, a phenolic hydroxyl group, or the like).

As the hydrophobic structural unit, a structural unit derived from (corresponding to) a compound (monomer) having a C log P value equal to or greater than 1.2 is preferable, and a structural unit derived from a compound having a C log P value of 1.2 to 8 is more preferable. By doing so, the effect of the present invention can be more reliably exhibited.

The C log P value is a value calculated by a program "C LOG P" available from Daylight Chemical Information System, Inc. This program provides a value of "calculated log P" calculated by the fragment approach (see the following documents) of Hansch and Leo. The fragment approach is based on a chemical structure of a compound, and the log P value of the compound is estimated by dividing the chemical structure into partial structures (fragments) and summing up degrees of contribution to log P which are assigned to the fragments. Details of the method are described in the following documents. In the present specification, a C log P value calculated by a program C LOG P v4.82 is used.

A. J. Leo, Comprehensive Medicinal Chemistry, Vol. 4, C. Hansch, P. G. Sammnens, J. B. Taylor and C. A. Ramsden, Eds., p. 295, Pergamon press, 1990, C. Hansch & A. J. Leo. Substituent Constants For Correlation Analysis in Chemistry and Biology. John Wiley & Sons. A. J. Leo. Calculating log Poct from structure. Chem. Rev., 93, 1281 to 1306, 1993.

The log P means a common logarithm of a partition coefficient P, is a physical property value that shows how a certain organic compound is partitioned in an equilibrium of a two-phase system consisting of oil (generally, 1-octanol) and water by using a quantitative numerical value, and is expressed by the following expression.

$$\log P = \log(C\text{oil}/C\text{water})$$

In the expression, Coil represents a molar concentration of a compound in an oil phase, and Cwater represents a molar concentration of the compound in a water phase.

The greater the positive log P value based on 0, the higher the oil solubility, and the greater the absolute value of negative log P, the higher the water solubility. Accordingly, the value of log P has a negative correlation with the water solubility of an organic compound and is widely used as a parameter for estimating the hydrophilicity and hydrophobicity of an organic compound.

The polymer compound preferably contains, as a hydrophobic structural unit, one or more structural units selected from structural units derived from monomers represented by Formulae (i) to (iii).

(i)

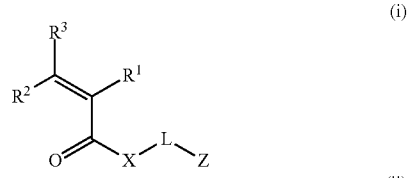

(ii)

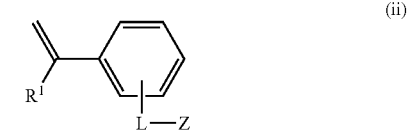

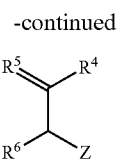

(iii)

In Formulae (i) to (iii), $R^1$, $R^2$, and $R^3$ each independently represent a hydrogen atom, a halogen atom (for example, a fluorine atom, a chlorine atom, a bromine atom, or the like), or an alkyl group (for example, a methyl group, an ethyl group, a propyl group, or the like) having 1 to 6 carbon atoms.

$R^1$, $R^2$, and $R^3$ are each preferably a hydrogen atom or an alkyl group having 1 to 3 carbon atoms, and more preferably a hydrogen atom or a methyl group. $R^2$ and $R^3$ are each even more preferably a hydrogen atom.

X represents an oxygen atom (—O—) or an imino group (—NH—), and is preferably an oxygen atom.

L is a single bond or a divalent linking group. Examples of the divalent linking group include a divalent aliphatic group (for example, an alkylene group, a substituted alkylene group, an alkenylene group, a substituted alkenylene group, an alkynylene group, or a substituted alkynylene group), a divalent aromatic group (for example, an arylene group or a substituted arylene group), a divalent heterocyclic group, an oxygen atom (—O—), a sulfur atom (—S—), an imino group (—NH—), a substituted imino group (—NR$^{31}$—, where $R^{31}$ is an aliphatic group, an aromatic group, or a heterocyclic group), a carbonyl group (—CO—), and a combination thereof.

The divalent aliphatic group may have a cyclic structure or a branched structure. The number of carbon atoms in the aliphatic group is preferably 1 to 20, more preferably 1 to 15, and even more preferably 1 to 10. The aliphatic group may be an unsaturated aliphatic group or a saturated aliphatic group, but is preferably a saturated aliphatic group. Moreover, the aliphatic group may have a substituent. Examples of the substituent include a halogen atom, an aromatic group, and a heterocyclic group.

The number of carbon atoms in the divalent aromatic group is preferably 6 to 20, more preferably 6 to 15, and even more preferably 6 to 10. Moreover, the aromatic group may have a substituent. Examples of the substituent include a halogen atom, an aliphatic group, an aromatic group, and a heterocyclic group.

The divalent heterocyclic group preferably contains a 5-membered ring or a 6-membered ring as a heterocyclic ring. The heterocyclic ring may be fused with another heterocyclic ring, an aliphatic ring, or an aromatic ring. Moreover, the heterocyclic group may have a substituent. Examples of the substituent include a halogen atom, a hydroxyl group, an oxo group (=O), a thioxo group (=S), an imino group (=NH), a substituted imino group (=N—R$^{32}$, where $R^{32}$ is an aliphatic group, an aromatic group, or a heterocyclic group), an aliphatic group, an aromatic group, and a heterocyclic group.

L is preferably a single bond, an alkylene group, or a divalent linking group having an oxyalkylene structure. The oxyalkylene structure is more preferably an oxyethylene structure or an oxypropylene structure. Moreover, L may have a polyoxyalkylene structure which contains two or more repeating oxyalkylene structures. As the polyoxyalkylene structure, a polyoxyethylene structure or a polyoxypropylene structure is preferable. The polyoxyethylene structure is represented by —(OCH$_2$CH$_2$)n-, and n is preferably an integer equal to or greater than 2 and more preferably an integer of 2 to 10.

Examples of Z include an aliphatic group (for example, an alkyl group, a substituted alkyl group, an unsaturated alkyl group, or a substituted unsaturated alkyl group), an aromatic group (for example, an aryl group, a substituted aryl group, an arylene group, or a substituted arylene group), a heterocyclic group, and a combination thereof. These groups may contain an oxygen atom (—O—), a sulfur atom (—S—), an imino group (—NH—), a substituted imino group (—NR$^{31}$—, where $R^{31}$ is an aliphatic group, an aromatic group, or a heterocyclic group), or a carbonyl group (—CO—).

The aliphatic group may have a cyclic structure or a branched structure. The number of carbon atoms in the aliphatic group is preferably 1 to 20, more preferably 1 to 15, and even more preferably 1 to 10. The aliphatic group further contains a ring-aggregated hydrocarbon group or a crosslinked cyclic hydrocarbon group, and examples of the ring-aggregated hydrocarbon group include a bicyclohexyl group, a perhydronaphthalenyl group, a biphenyl group, and a 4-cyclohexylphenyl group. Examples of a crosslinked cyclic hydrocarbon ring include a bicyclic hydrocarbon ring such as pinane, bomane, norpinane, norbomane, and bicyclooctane rings (a bicyclo[2.2.2]octane ring, a bicyclo[3.2.1] octane ring, or the like); a tricyclic hydrocarbon ring such as homobredane, adamantane, tricyclo[5.2.1.0$^{2,6}$]decane, and tricyclo[4.3.1.1$^{2,5}$]undecane rings; and a tetracyclic hydrocarbon ring such as tetracyclo[4.4.0.1$^{2,5}$.1$^{7,10}$]dodecane and perhydro-1,4-methano-5,8-methanonaphthalene rings. Moreover, the crosslinked cyclic hydrocarbon ring also includes a fused cyclic hydrocarbon ring, for example, a fused ring in which a plurality of 5- to 8-membered cycloalkane rings such as perhydronaphthalene (decalin), perhydroanthracene, perhydrophenanthrene, perhydroacenaphthene, perhydrofluorene, perhydroindene, and perhydrophenalene rings are fused.

As the aliphatic group, a saturated aliphatic group is more preferable to an unsaturated aliphatic group. Moreover, the aliphatic group may have a substituent. Examples of the substituent include a halogen atom, an aromatic group, and a heterocyclic group. Here, the aliphatic group does not have an acid group as a substituent.

The number of carbon atoms in the aromatic group is preferably 6 to 20, more preferably 6 to 15, and even more preferably 6 to 10. Moreover, the aromatic group may have a substituent. Examples of the substituent include a halogen atom, an aliphatic group, an aromatic group, and a heterocyclic group. Here, the aromatic group does not have an acid group as a substituent.

The heterocyclic group preferably contains a 5-membered ring or a 6-membered ring as a heterocyclic ring. The heterocyclic ring may be fused with another heterocyclic ring, an aliphatic ring, or an aromatic ring. Moreover, the heterocyclic group may have a substituent. Examples of the substituent include a halogen atom, a hydroxyl group, an oxo group (=O), a thioxo group (=S), an imino group (=NH), a substituted imino group (=N—R$^{32}$, where $R^{32}$ is an aliphatic group, an aromatic group, or a heterocyclic group), an aliphatic group, an aromatic group, and a heterocyclic group. Here, the heterocyclic group does not have an acid group as a substituent.

In Formula (iii), $R^4$, $R^5$, and $R^6$ each independently represent a hydrogen atom, a halogen atom (for example, a fluorine atom, a chlorine atom, a bromine atom, or the like), an alkyl group (for example, a methyl group, an ethyl group, a propyl group, or the like) having 1 to 6 carbon atoms, Z, or L-Z. Herein, L and Z have the same definitions as L and Z described above. As $R^4$, $R^5$, and $R^6$, a hydrogen atom or an alkyl group having 1 to 3 carbon atoms is preferable, and a hydrogen atom is more preferable.

The monomer represented by Formula (i) is preferably a compound in which $R^1$, $R^2$, and $R^3$ are each a hydrogen atom or a methyl group, L is a single bond, an alkylene group, or a divalent linking group having an oxyalkylene structure, X is an oxygen atom or an imino group, and Z is an aliphatic group, a heterocyclic group, or an aromatic group.

The monomer represented by Formula (ii) is preferably a compound in which $R^1$ is a hydrogen atom or a methyl group, L is an alkylene group, and Z is an aliphatic group, a heterocyclic group, or an aromatic group. Moreover, the monomer represented by Formula (iii) is preferably a compound in which $R^4$, $R^5$, and $R^6$ are each a hydrogen atom or a methyl group, and Z is an aliphatic group, a heterocyclic group, or an aromatic group.

Examples of typical compounds represented by Formulae (i) to (iii) include radically polymerizable compounds selected from acrylic acid esters, methacrylic acid esters, and styrenes.

Furthermore, regarding the examples of the typical compounds represented by Formulae (i) to (iii), reference can be made to the compounds described in paragraphs 0089 to 0093 of JP2013-249417A, the contents of which are incorporated into the present specification.

The content of the hydrophobic structural unit in the polymer compound is preferably within a range of 10% to 90% and more preferably within a range of 20% to 80%, in terms of mass, with respect to the total mass of the polymer compound. In a case where the content is within the above range, sufficient pattern formation can be obtained.

Functional Group Capable of Forming Interaction with Pigment or the Like

A functional group capable of forming interaction with the pigment or the like (for example, a light-shielding pigment) can be introduced into the polymer compound. Herein, it is preferable that the polymer compound further has a structural unit containing a functional group capable of forming interaction with the pigment or the like.

Examples of the functional group capable of forming interaction with the pigment or the like include an acid group, a basic group, a coordinating group, and a reactive functional group.

In a case where the polymer compound contains an acid group, a basic group, a coordinating group, or a reactive functional group, it is preferable that the polymer compound contains a structural unit containing an acid group, a structural unit containing a basic group, a structural unit containing a coordinating group, or a reactive structural unit.

In particular, in a case where the polymer compound further contains, as an acid group, an alkali-soluble group such as a carboxylic acid group, developability for forming a pattern by alkali development can be imparted to the polymer compound.

That is, in a case where an alkali-soluble group is introduced into the polymer compound, in the composition, the polymer compound as a dispersant making a contribution to the dispersion of the pigment or the like has alkali solubility. The composition containing such a polymer compound is excellent in light-shielding properties of a cured film formed by exposure, and improves alkali developability of an unexposed portion.

Furthermore, in a case where the polymer compound has a structural unit containing an acid group, the polymer compound is easily compatible with the solvent, and coating properties also tend to be improved.

It is presumed that this is because the acid group in the structural unit containing an acid group easily interacts with the pigment or the like, the polymer compound stably disperses the pigment or the like, the viscosity of the polymer compound dispersing the pigment or the like is reduced, and thus the polymer compound is also easily dispersed in a stable manner.

Here, the structural unit containing an alkali-soluble group as an acid group may be the same as or different from the structural unit containing a graft chain, but the structural unit containing an alkali-soluble group as an acid group is a structural unit different from the hydrophobic structural unit (that is, the structural unit does not correspond to the hydrophobic structural unit).

Examples of the acid group, which is the functional group capable of forming interaction with the pigment or the like, include a carboxylic acid group, a sulfonic acid group, a phosphoric acid group, and a phenolic hydroxyl group, at least one of a carboxylic acid group, a sulfonic acid group, or a phosphoric acid group is preferable, and a carboxylic acid group is more preferable. The carboxylic acid group has favorable adsorptive power to the pigment or the like and high dispersibility.

That is, it is preferable that the polymer compound further has a structural unit containing at least one of a carboxylic acid group, a sulfonic acid group, or a phosphoric acid group.

The polymer compound may have one or more of the structural unit containing an acid group.

The polymer compound may or may not contain the structural unit containing the acid group, but in a case where the polymer compound contains the structural unit containing the acid group, the content thereof, in terms of mass, with respect to the total mass of the polymer compound is preferably 5% to 80% by mass, and more preferably 10% to 60% by mass from the viewpoint of suppressing damage of the image intensity by alkali development.

Examples of the basic group, which is the functional group capable of forming interaction with the pigment or the like, include a primary amino group, a secondary amino group, a tertiary amino group, a hetero ring containing a N atom, and an amide group, and a preferred basic group is a tertiary amino group from the viewpoints of favorable adsorptive power to the pigment or the like and high dispersibility. The polymer compound may contain one or more of these basic groups.

The polymer compound may or may not contain the structural unit containing the basic group, but in a case where the polymer compound contains the structural unit containing the basic group, the content thereof, in terms of mass, with respect to the total mass of the polymer compound is preferably 0.01% to 50% by mass, and more preferably 0.01% to 30% by mass from the viewpoint of suppressing developability inhibition.

Examples of the coordinating group and the reactive functional group which are the functional groups capable of forming interaction with the pigment or the like include an acetyl acetoxy group, a trialkoxysilyl group, an isocyanate group, an acid anhydride, and an acid chloride. A preferred functional group is an acetyl acetoxy group from the viewpoints of favorable adsorptive power to the pigment or the like and high dispersibility of the pigment or the like. The polymer compound may have one or more of these groups.

The polymer compound may or may not contain the structural unit containing the coordinating group or the structural unit containing the reactive functional group, but in a case where the polymer compound contains the structural unit containing the coordinating group or the structural unit containing the reactive functional group, the content thereof, in terms of mass, with respect to the total mass of the polymer compound is preferably 10% to 80% by mass, and more preferably 20% to 60% by mass from the viewpoint of suppressing developability inhibition.

In a case where the polymer compound contains, other than the graft chain, the functional group capable of forming interaction with the pigment or the like, the functional groups capable of forming interaction with various pigments or the like may be contained, the way these functional groups are introduced is not particularly limited, but it is preferable that the polymer compound contains one or more structural units selected from structural units derived from monomers represented by Formulae (iv) to (vi).

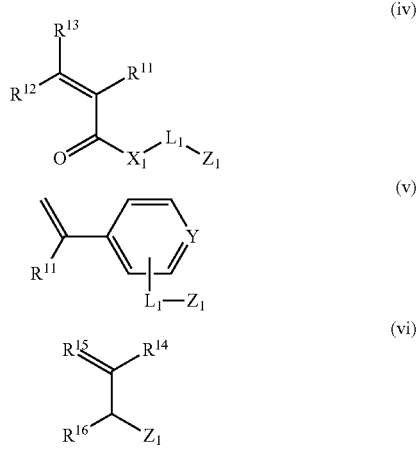

In Formulae (iv) to (vi), $R^{11}$, $R^{12}$, and $R^{13}$ each independently represent a hydrogen atom, a halogen atom (for example, a fluorine atom, a chlorine atom, a bromine atom, or the like), or an alkyl group (for example, a methyl group, an ethyl group, a propyl group, or the like) having 1 to 6 carbon atoms.

In Formulae (iv) to (vi), $R^{11}$, $R^{12}$, and $R^{13}$ are preferably each independently a hydrogen atom or an alkyl group having 1 to 3 carbon atoms, and more preferably each independently a hydrogen atom or a methyl group. In Formula (iv), $R^{12}$ and $R^{13}$ are each even more preferably a hydrogen atom.

In Formula (iv), $X_1$ represents an oxygen atom (—O—) or an imino group (—NH—), and is preferably an oxygen atom.

Moreover, in Formula (v), Y represents a methine group or a nitrogen atom.

In addition, in Formulae (iv) and (v), $L_1$ represents a single bond or a divalent linking group. The divalent linking group has the same definition as the divalent linking group represented by L in Formula (i).

$L_1$ is preferably a single bond, an alkylene group, or a divalent linking group having an oxyalkylene structure. The oxyalkylene structure is more preferably an oxyethylene structure or an oxypropylene structure. Moreover, $L_1$ may have a polyoxyalkylene structure which contains two or more repeating oxyalkylene structures. As the polyoxyalkylene structure, a polyoxyethylene structure or a polyoxypropylene structure is preferable. The polyoxyethylene structure is represented by —(OCH$_2$CH$_2$)n-, and n is preferably an integer equal to or greater than 2 and more preferably an integer of 2 to 10.

In Formulae (iv) to (vi), $Z_1$ represents a functional group capable of forming interaction with the pigment or the like other than a graft chain, and is preferably a carboxylic acid group and a tertiary amino group and more preferably a carboxylic acid group.

In Formula (vi), $R^{14}$, $R^{15}$, and $R^{16}$ each independently represent a hydrogen atom, a halogen atom (for example, a fluorine atom, a chlorine atom, a bromine atom, or the like), an alkyl group (for example, a methyl group, an ethyl group, a propyl group, or the like) having 1 to 6 carbon atoms, —$Z_1$, or $L_1$-$Z_1$. Herein, $L_1$ and $Z_1$ have the same definitions as $L_1$ and $Z_1$ described above, and preferred examples thereof are also the same. $R^{14}$, $R^{15}$, and $R^{16}$ are preferably each independently a hydrogen atom or an alkyl group having 1 to 3 carbon atoms, and more preferably each independently a hydrogen atom.

The monomer represented by Formula (iv) is preferably a compound in which $R^{11}$, $R^{12}$, and $R^{13}$ are each independently a hydrogen atom or a methyl group, $L_1$ is an alkylene group or a divalent linking group having an oxyalkylene structure, $X_1$ is an oxygen atom or an imino group, and $Z_1$ is a carboxylic acid group.

Moreover, the monomer represented by Formula (v) is preferably a compound in which $R^{11}$ is a hydrogen atom or a methyl group, $L_1$ is an alkylene group, $Z_1$ is a carboxylic acid group, and Y is a methine group.

Furthermore, the monomer represented by Formula (vi) is preferably a compound in which $R^{14}$, $R^{15}$, and $R^{16}$ are each independently a hydrogen atom or a methyl group, $L_1$ is a single bond or an alkylene group, and $Z_1$ is a carboxylic acid group.

Typical examples of the monomers (compounds) represented by Formulae (iv) to (vi) are shown below.

Examples of the monomers include methacrylic acid, crotonic acid, isocrotonic acid, a reaction product of a compound (for example, 2-hydroxyethyl methacrylate) containing an addition polymerizable double bond and a hydroxyl group in a molecule with a succinic acid anhydride, a reaction product of a compound containing an addition polymerizable double bond and a hydroxyl group in a molecule with a phthalic acid anhydride, a reaction product of a compound containing an addition polymerizable double bond and a hydroxyl group in a molecule with a tetrahydroxyphthalic acid anhydride, a reaction product of a compound containing an addition polymerizable double bond and a hydroxyl group in a molecule with trimellitic acid anhydride, a reaction product of a compound containing an addition polymerizable double bond and a hydroxyl group in a molecule with a pyromellitic acid anhydride, acrylic acid, an acrylic acid dimer, an acrylic acid oligomer, maleic acid, itaconic acid, fumaric acid, 4-vinylbenzoic acid, vinyl phenol, and 4-hydroxyphenyl methacrylamide.

From the viewpoint of the interaction with the pigment or the like, the temporal stability, and the permeability into a developer, the content of the structural unit containing a functional group capable of forming interaction with the pigment or the like is preferably 0.05% to 90% by mass, more preferably 1.0% to 80% by mass, and even more preferably 10% to 70% by mass, with respect to the total mass of the polymer compound.

Other Structural Units

In addition, for the purpose of improving various performances such as image intensity, as long as the effects of the present invention are not impaired, the polymer compound may further have other structural units (for example, a structural unit containing a functional group or the like having an affinity with the solvent which will be described later) which have various functions and are different from the structural unit containing a graft chain, the hydrophobic structural unit, and the structural unit containing a functional group capable of forming interaction with the pigment or the like.

Examples of such other structural units include structural units derived from radically polymerizable compounds selected from acrylonitriles and methacrylonitriles.

The polymer compound may have one or more of these other structural units, and the content thereof is preferably 0% to 80% by mass and more preferably 10% to 60% by mass, in terms of mass, with respect to the total mass of the polymer compound. In a case where the content is within the above range, sufficient pattern formability is maintained.

Physical Properties of Polymer Compound

An acid value of the polymer compound is preferably 0 to 250 mg KOH/g, more preferably 10 to 200 mg KOH/g, even more preferably 30 to 180 mg KOH/g, and particularly preferably in a range of 70 to 120 mg KOH/g.

In a case where the acid value of the polymer compound is equal to or lower than 160 mg KOH/g, pattern peeling during development in a case of forming a cured film is more effectively suppressed. Moreover, in a case where the acid value of the polymer compound is equal to or higher than 10 mg KOH/g, the alkali developability is improved. Furthermore, in a case where the acid value of the polymer compound is equal to or higher than 20 mg KOH/g, the precipitation of the pigment or the like can be further suppressed, the number of coarse particles can be further reduced, and the temporal stability of the composition can be further improved.

In the present specification, the acid value can be calculated, for example, from the average content of acid groups in the compound. Moreover, a resin having a desired acid value can be obtained by changing the content of the structural unit containing an acid group, which is a constituent component of the resin.

A weight-average molecular weight of the polymer compound is preferably 4,000 to 300,000, more preferably 5,000 to 200,000, even more preferably 6,000 to 100,000, and particularly preferably 10,000 to 50,000.

The polymer compound can be synthesized based on known methods.

Specific examples of the polymer compound include "DA-7301" produced by Kusumoto Chemicals, Ltd., "Disperbyk-101 (polyamidoamine phosphate), 107 (carboxylic acid ester), 110 (copolymer containing an acid group), 111 (phosphoric acid-based dispersant), 130 (polyamide), 161, 162, 163, 164, 165, 166, 170, and 190 (polymeric copolymer)" and "BYK-P104 and P105 (high-molecular-weight unsaturated polycarboxylic acid)" produced by BYK-Chemie GmbH, "EFKA 4047, 4050 to 4010 to 4165 (based on polyurethane), EFKA 4330 to 4340 (block copolymer), 4400 to 4402 (modified polyacrylate), 5010 (polyester amide), 5765 (high-molecular-weight polycarboxylate), 6220 (fatty acid polyester), 6745 (phthalocyanine derivative), and 6750 (azo pigment derivative)" produced by EFKA, "AJISPER PB821, PB822, PB880, and PB881" produced by Ajinomoto Fine-Techno Co., Inc., "FLOWLEN TG-710 (urethane oligomer)" and "POLYFLOW No. 50E and No. 300 (acrylic copolymer)" produced by KYOEISHA CHEMICAL Co., LTD., "DISPARLON KS-860, 873SN, 874, #2150 (aliphatic polyvalent carboxylic acid), #7004 (polyether ester), DA-703-50, DA-705, and DA-725" produced by Kusumoto Chemicals, Ltd., "DEMOL RN, N (naphthalenesulfonic acid-formalin polycondensate), MS, C, and SN-B (aromatic sulfonic acid-formalin polycondensate)", "HOMOGENOL L-18 (polymeric polycarboxylic acid)", "EMULGEN 920, 930, 935, and 985 (polyoxyethylene nonylphenyl ether)", and "ACETAMIN 86 (stearylamine acetate)" produced by Kao Corporation, "SOLSPERSE 5000 (phthalocyanine derivative), 22000 (azo pigment derivative), 13240 (polyester amine), 3000, 12000, 17000, 20000, 27000 (polymer containing a functional portion on a terminal portion), 24000, 28000, 32000, and 38500 (graft copolymer)" produced by Lubrizol Japan Limited, "NIKKOL T106 (polyoxyethylene sorbitan monooleate), and MYS-IEX (polyoxyethylene monostearate)" produced by Nikko Chemicals Co., Ltd., HINOACT T-8000E and the like produced by Kawaken Fine Chemicals Co., Ltd., an organosiloxane polymer KP-341 produced by Shin-Etsu Chemical Co., Ltd., "W001: cationic surfactant", nonionic surfactants such as polyoxyethylene lauryl ether, polyoxyethylene stearyl ether, polyoxyethylene oleyl ether, polyoxyethylene octyl phenyl ether, polyoxyethylene nonyl phenyl ether, polyethylene glycol dilaurate, polyethylene glycol distearate, and a sorbitan fatty acid ester, and anionic surfactants such as "W004, W005, and W017" produced by Yusho Co., Ltd., "EFKA-46, EFKA-47, EFKA-47EA, EFKA polymer 100, EFKA polymer 400, EFKA polymer 401, and EFKA polymer 450" produced by MORISHITA & CO., LTD., polymer dispersants such as "DISPERSE AID 6, DISPERSE AID 8, DISPERSE AID 15, and DISPERSE AID 9100" produced by SAN NOPCO LIMITED, "ADEKA PLURONIC L31, F38, L42, L44, L61, L64, F68, L72, P95, F77, P84, F87, P94, L101, P103, F108, L121, and P-123" produced by ADEKA CORPORATION, and "IONET (trade name) S-20" produced by Sanyo Chemical Industries, Ltd. Moreover, ACRYBASE FFS-6752 and ACRYBASE FFS-187 can also be used.

In addition, it is also preferable that an amphoteric resin containing an acid group and a basic group is used. The amphoteric resin is preferably a resin having an acid value equal to or higher than 5 mg KOH/g and an amine value equal to or higher than 5 mg KOH/g.

Examples of commercial products of the amphoteric resin include DISPERBYK-130, DISPERBYK-140, DISPERBYK-142, DISPERBYK-145, DISPERBYK-180, DISPERBYK-187, DISPERBYK-191, DISPERBYK-2001, DISPERBYK-2010, DISPERBYK-2012, DISPERBYK-2025, and BYK-9076 produced by BYK-Chemie GmbH, and AJISPER PB821, AJISPER PB822, and AJISPER PB881 produced by Ajinomoto Fine-Techno Co., Inc.

These polymer compounds may be used singly or in combination of two or more thereof.

Furthermore, regarding specific examples of the polymer compound, reference can be made to the polymer compound described in paragraphs 0127 to 0129 of JP2013-249417A, the contents of which are incorporated into the present specification.

In addition, as the dispersant, in addition to the aforementioned polymer compounds, the graft copolymer described in paragraphs 0037 to 0115 of JP2010-106268A (corresponding to paragraphs 0075 to 0133 of US2011/0124824A) can be used, the contents of which can be incorporated by reference into the present specification.

Moreover, in addition to the aforementioned dispersant, the polymer compound described in paragraphs 0028 to 0084 of JP2011-153283A (corresponding to paragraphs 0075 to 0133 of US2011/0279759A) which contains a constituent component having a side chain structure formed by bonding of acidic groups through a linking group can be used, the contents of which can be incorporated by reference into the present specification.

Furthermore, as the dispersant, the resin described in paragraphs 0033 to 0049 of JP2016-109763A can also be used, the contents of which are incorporated into the present specification.

<Alkali-Soluble Resin>

The composition preferably contains an alkali-soluble resin. In the present specification, the alkali-soluble resin means a resin containing a group (an alkali-soluble group, for example, an acid group such as a carboxylic acid group) which promotes alkali solubility, and a resin different from the dispersant described above.

A content of the alkali-soluble resin in the composition is not particularly limited, but is preferably 1% to 30% by mass, more preferably 2% to 20% by mass, and even more preferably 5% to 15% by mass, with respect to the total solid content of the composition.

The alkali-soluble resins may be used singly or in combination of two or more thereof. In a case where two or more alkali-soluble resins are used in combination, the total content thereof is preferably within the above range.

As the alkali-soluble resin, a resin containing at least one alkali-soluble group in a molecule is mentioned, and examples thereof include a polyhydroxystyrene resin, a polysiloxane resin, a (meth)acrylic resin, a (meth)acrylamide resin, a (meth)acryl/(meth)acrylamide copolymer resin, an epoxy-based resin, and a polyimide resin.

Specific examples of the alkali-soluble resin include a copolymer of an unsaturated carboxylic acid and an ethylenically unsaturated compound.

The unsaturated carboxylic acid is not particularly limited, but examples thereof include monocarboxylic acids such as (meth)acrylic acid, crotonic acid, and vinyl acetate; dicarboxylic acid such as itaconic acid, maleic acid, and fumaric acid or an acid anhydride thereof; and polyvalent carboxylic acid monoesters such as mono(2-(meth)acryloyloxyethyl)phthalate.

Examples of a copolymerizable ethylenically unsaturated compound include methyl (meth)acrylate. Moreover, the compounds described in paragraph 0027 of JP2010-097210A and paragraphs 0036 and 0037 of JP2015-068893A can also be used, the contents of which are incorporated into the present specification.

Furthermore, copolymerizable ethylenically unsaturated compounds containing an ethylenically unsaturated group in a side chain may be used in combination. As the ethylenically unsaturated group, a (meth)acrylic acid group is preferable. An acrylic resin containing an ethylenically unsaturated group in a side chain can be obtained, for example, by addition-reacting a carboxylic acid group of an acrylic resin containing the carboxylic acid group with an ethylenically unsaturated compound containing a glycidyl group or an alicyclic epoxy group.

As the alkali-soluble resin, an alkali-soluble resin containing a curable group is also preferable.

As the curable group, the curable groups which may be contained in the aforementioned polymer compound are also mentioned, and preferred ranges are also the same.

The alkali-soluble resin containing a curable group is preferably an alkali-soluble resin having a curable group in the side chain, or the like. Examples of the alkali-soluble resin containing a curable group include DIANAL NR series (produced by Mitsubishi Rayon Co., Ltd.), Photomer 6173 (COOH-containing polyurethane acrylic oligomer, produced by Diamond Shamrock Co., Ltd.), VISCOAT R-264 and KS resist 106 (all produced by OSAKA ORGANIC CHEMICAL INDUSTRY LTD.), CYCLOMER P series (for example, ACA230AA) and PLACCEL CF200 series (all produced by DAICEL CORPORATION), Ebecryl 3800 (produced by DAICEL-ALLNEX LTD.), and ACRYCURE RD-F8 (produced by NIPPON SHOKUBAI CO., LTD.).

As the alkali-soluble resin, for example, the radical polymers which contain a carboxylic acid group in a side chain and are described in JP1984-044615A (JP-S59-044615A), JP1979-034327B (JP-S54-034327B), JP1983-012577B (JP-S58-012577B), JP1979-025957B (JP-S54-025957B), JP1979-092723A (JP-S54-092723A), JP1984-053836A (JP-S59-053836A), and JP1984-071048A (JP-S59-071048A); the acetal-modified polyvinyl alcohol-based binder resins which contain an alkali-soluble group and are described in EP993966B, EP1204000B, and JP2001-318463A; polyvinyl pyrrolidone; polyethylene oxide; polyether or the like which is a reaction product of alcohol-soluble nylon, 2,2-bis-(4-hydroxyphenyl)-propane, and epichlorohydrin; the polyimide resin described in WO2008/123097A; and the like can be used.

As the alkali-soluble resin, for example, the compound described in paragraphs 0225 to 0245 of JP2016-075845A can also be used, the contents of which are incorporated into the present specification.

As the alkali-soluble resin, a polyimide precursor can also be used. The polyimide precursor means a resin obtained by causing an addition polymerization reaction between a compound containing an acid anhydride group and a diamine compound at a temperature of 40° C. to 100° C.

Examples of the polyimide precursor include a resin having a repeating unit represented by Formula (1). Examples of the polyimide precursor include polyimide precursors containing an amic acid structure represented by Formula (2), and imide structures represented by Formula (3) obtained in a case where imide ring closure occurs in a portion of an amic acid structure and Formula (4) obtained in a case where imide ring closure occurs in the entirety of an amic acid structure.

Furthermore, in the present specification, the polyimide precursor having an amic acid structure is referred to as polyamic acid in some cases.

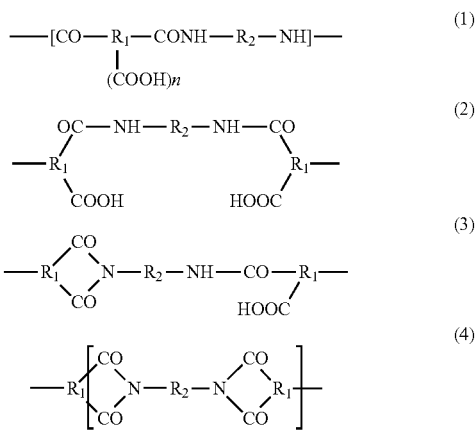

In Formulae (1) to (4), $R_1$ represents a tetravalent organic group having 2 to 22 carbon atoms, $R_2$ represents a divalent organic group having 1 to 22 carbon atoms, and n represents 1 or 2.

Specific examples of the polyimide precursor include the compound described in paragraphs 0011 to 0031 of JP2008-106250A, the compound described in paragraphs 0022 to 0039 of JP2016-122101A, and the compound described in paragraphs 0061 to 0092 of JP2016-068401A, the contents of which are incorporated into the present specification.

From the viewpoint that a pattern shape of a pattern-like cured film formed of the composition is superior, it is also preferable that the alkali-soluble resin contains at least one selected from the group consisting of a polyimide resin and a polyimide precursor.

The polyimide resin containing the alkali-soluble group is not particularly limited, and known polyimide resins containing the alkali-soluble group can be used. Examples of the polyimide resin include the resin described in paragraph 0050 of JP2014-137523A, the resin described in paragraph 0058 of JP2015-187676A, and the resin described in paragraphs 0012 and 0013 of JP2014-106326A, the contents of which are incorporated into the present specification.

(Resin Containing Ethylenically Unsaturated Group)

From the viewpoint that rectangularity of a cross-sectional shape of the obtained cured film is superior, the composition used in the production method of the present invention preferably contains, as the resin, a resin containing an ethylenically unsaturated group. The resin containing an ethylenically unsaturated group may be a dispersant or an alkali-soluble resin. Moreover, the resin containing an ethylenically unsaturated group may be a resin other than the dispersant or the alkali-soluble resin.

The lower limit of a content of the resin containing an ethylenically unsaturated group in the composition is preferably equal to or greater than 30% by mass, more preferably equal to or greater than 50% by mass, even more preferably equal to or greater than 65% by mass, and particularly preferably equal to or greater than 85% by mass, with respect to the total mass of the resins contained in the composition.

The upper limit of the content of the resin containing an ethylenically unsaturated group in the composition is preferably equal to or less than 100% by mass with respect to the total mass of the resins contained in the composition.

One resin containing an ethylenically unsaturated group may be used singly or two or more resins containing an ethylenically unsaturated group may be used, and in a case where two or more resins containing an ethylenically unsaturated group are used, the total content thereof is preferably within the above range.

Furthermore, the resin containing an ethylenically unsaturated group refers to a resin containing one or more ethylenically unsaturated groups in one molecule.

The content of the resin containing an ethylenically unsaturated group may be calculated from the charged amount of raw materials.

In addition, the content of the ethylenically unsaturated group with respect to the total mass of the resin is not particularly limited, but is preferably 0.001 to 5.00 mmol/g, more preferably 0.10 to 3.00 mmol/g, and even more preferably 0.26 to 2.50 mmol/g. In a case where the content of the ethylenically unsaturated group is within a range of 0.10 to 3.00 mmol/g, the rectangularity of the cross-sectional shape of the cured film formed of the composition is superior.

Furthermore, the total mass of the resin means the total mass of the resins contained in the composition, and for example, in a case where the composition contains a resin containing an ethylenically unsaturated group and a resin containing no ethylenically unsaturated group, the total mass of both resins corresponds to the total mass of the resin.

Therefore, the content of the ethylenically unsaturated group represents the content of the ethylenically unsaturated group in the resin, which contains the ethylenically unsaturated group, with respect to the total mass of the resin.

Moreover, the resin means a component which is dissolved in the composition and has a weight-average molecular weight greater than 2,000.

In the present specification, the content of the ethylenically unsaturated group is referred to as "C=C value" in some cases.

In the present specification, the content (C=C value) of the ethylenically unsaturated group means a value measured by the following method. Moreover, in a case where a resin containing an ethylenically unsaturated group is synthesized, the content (C=C value) may be calculated from the charged amount of raw materials and substituted for measurement.

Furthermore, in a case where the composition contains a plurality of types of resins and the C=C value of each resin is clear, the C=C value as the total mass of the resin contained in the composition is calculated and determined from a formulation ratio of each resin.

As a method for measuring the content of the ethylenically unsaturated group in the resin, the following method is used in a case where the ethylenically unsaturated group is a (meth)acryloyl group.

First, solid components (a black pigment or the like) in the composition are precipitated by a centrifugal separation method, and the remaining liquid components are fractionated. Components having a weight-average molecular weight greater than 2,000 are further fractionated from the obtained liquid components by the GPC method, and used as a resin to be measured.

Subsequently, 0.25 mg of the resin to be measured is dissolved in 50 mL of tetrahydrofuran (THF), and 15 mL of methanol is further added to produce a solution.

To the produced solution is added 10 mL of 4N aqueous sodium hydroxide solution to obtain a mixed solution. Subsequently, the mixed solution is stirred at a liquid temperature of 40° C. for 2 hours. Moreover, 10.2 mL of 4N aqueous methanesulfonic acid solution is added to the mixed solution, followed by stirring. Furthermore, 5 mL of demineralized water is added to the mixed solution, and subsequently, 2 mL of methanol is added to prepare a measurement solution.

A content of (meth)acrylic acid in the measurement solution is measured by the high performance liquid chromatography (HPLC) method (absolute calibration curve method), and then the content of the ethylenically unsaturated group is calculated.

HPLC measurement condition column: Synergi 4μ Polar-RP 80A (4.6 mm×250 mm) manufactured by Phenomenex Inc.

Column temperature: 40° C., Flow rate: 1.0 mL/min, Wavelength of detector: 210 nm, Eluent: 55 of tetrahydrofuran (THF, for HPLC)/45 of buffer water, * Buffer water . . . 0.2%-phosphoric acid and 0.2%-triethylamine, Injection volume of aqueous solution: 5 μL As the method for measuring the content of the ethylenically unsaturated group in the resin, a method for measuring bromination of the resin to be measured which is fractionated by the aforementioned method can be used in a case where the ethylenically unsaturated group is a group other than a (meth)acryloyl group, or is a combination of a (meth)acryloyl group and a group other than a (meth) acryloyl group. A bromine value is measured in accordance with JIS K 2605:1996.

Herein, the content of the ethylenically unsaturated group is a value obtained by converting the number of grams ($gBr_2$/100 g) of bromine ($Br_2$) added to 100 g of resin to be measured having the aforementioned bromine value into the number of moles of bromine ($Br_2$) added per 1 g of the resin.

[Polymerization Initiator]

The composition according to the embodiment of the present invention preferably contains a polymerization initiator.

The polymerization initiator is not particularly limited, and known polymerization initiators can be used. Examples of the polymerization initiator include a photopolymerization initiator and a thermal polymerization initiator, and a photopolymerization initiator is preferable. Moreover, as the polymerization initiator, a so-called radical polymerization initiator is preferable.

A content of the polymerization initiator in the composition is not particularly limited, but is preferably 0.5% to 20% by mass, more preferably 1.0% to 10% by mass, and even more preferably 1.5% to 8% by mass, with respect to the total solid content of the composition. The polymerization initiators may be used singly or in combination of two or more thereof. In a case where two or more polymerization initiators are used in combination, the total content thereof is preferably within the above range.

<Thermal Polymerization Initiator>

Examples of the thermal polymerization initiator include an azo compound such as 2,2'-azobisisobutyronitrile (AIBN), 3-carboxypropionitrile, azobismalononitrile, and dimethyl-(2,2')-azobis(2-methylpropionate) [V-601] and an organic peroxide such as benzoyl peroxide, lauroyl peroxide, and potassium persulfate.

Specific examples of the thermal polymerization initiator include the polymerization initiator described in pp. 65 to 148 of "Ultraviolet Curing System" (published by Sogo Gijutsu Center, 1989) written by Kiyomi KATO.

<Photopolymerization Initiator>

The composition preferably contains a photopolymerization initiator.

The photopolymerization initiator is not particularly limited as long as the photopolymerization initiator can initiate the polymerization of the polymerizable compound, and known photopolymerization initiators can be used. As the photopolymerization initiator, for example, a photopolymerization initiator exhibiting photosensitivity from an ultraviolet range to a visible light range is preferable. Moreover, the photopolymerization initiator may be an activator which generates active radicals by causing a certain action with a photoexcited sensitizer or an initiator which initiates cationic polymerization according to the type of the polymerizable compound.

Furthermore, the photopolymerization initiator preferably contains at least one compound having a molar absorption coefficient of at least 50 in a range of 300 to 800 nm (more preferably 330 to 500 nm).

A content of the photopolymerization initiator in the composition is not particularly limited, but is preferably 0.5% to 20% by mass, more preferably 1.0% to 10% by mass, and even more preferably 1.5% to 8% by mass, with respect to the total solid content of the composition. The photopolymerization initiators may be used singly or in combination of two or more thereof. In a case where two or more photopolymerization initiators are used in combination, the total content thereof is preferably within the above range.

Examples of the photopolymerization initiator include a halogenated hydrocarbon derivative (for example, a compound containing a triazine skeleton, a compound containing an oxadiazole skeleton, or the like), an acyl phosphine compound such as acyl phosphine oxide, hexaaryl biimidazole, an oxime compound such as an oxime derivative, an organic peroxide, a thio compound, a ketone compound, an aromatic onium salt, an aminoacetophenone compound, and hydroxyacetophenone.

Regarding specific examples of the photopolymerization initiator, reference can be made to, for example, paragraphs 0265 to 0268 of JP2013-029760A, the contents of which are incorporated into the present specification.

More specifically, as the photopolymerization initiator, for example, the aminoacetophenone-based initiator described in JP1998-291969A (JP-H10-291969A) and the acyl phosphine oxide-based initiator described in JP4225898B can also be used.

As the hydroxyacetophenone compound, for example, IRGACURE-184, DAROCUR-1173, IRGACURE-500, IRGACURE-2959, and IRGACURE-127 (trade names: all produced by BASF SE) can be used.

As the aminoacetophenone compound, for example, IRGACURE-907, IRGACURE-369, or IRGACURE-379EG (trade names: all produced by BASF SE), which is a commercial product, can be used. As the aminoacetophenone compound, the compound which is described in JP2009-191179A and whose absorption wavelength is matched to a light source having a long wavelength such as a wavelength of 365 nm or a wavelength of 405 nm can also be used.

As the acyl phosphine compound, IRGACURE-819 or IRGACURE-TPO (trade names: all produced by BASF SE), which is a commercial product, can be used.

(Oxime Compound)

As the photopolymerization initiator, an oxime ester-based polymerization initiator (oxime compound) is more preferable. In particular, an oxime compound has high sensitivity and high polymerization efficiency, easily designs the content of the light-shielding pigment in the composition to be high, and thus is preferable.

As specific examples of the oxime compound, the compound described in JP2001-233842A, the compound described in JP2000-080068A, or the compound described in JP2006-342166A can be used.

Examples of the oxime compound include 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one.

Furthermore, the compounds described in J. C. S. Perkin II (1979) pp. 1653 to 1660, J. C. S. Perkin II (1979) pp. 156 to 162, Journal of Photopolymer Science and Technology (1995) pp. 202 to 232, JP2000-066385A, JP2000-080068A, JP2004-534797A, and JP2006-342166A can also be mentioned.

Among commercial products, IRGACURE-OXE01 (produced by BASF SE), IRGACURE-OXE02 (produced by BASF SE), IRGACURE-OXE03 (produced by BASF SE), or IRGACURE-OXE04 (produced by BASF SE) is also preferable. Moreover, TR-PBG-304 (produced by TRONLY), ADEKA ARKLS NCI-831 and ADEKA ARKLS NCI-930 (produced by ADEKA CORPORATION), or N-1919 (carbazole and oxime ester skeleton-containing photoinitiator (produced by ADEKA CORPORATION)) can also be used.

In addition, as oxime compounds other than the aforementioned oxime compounds, the compound which is described in JP2009-519904A and in which oxime is linked to a N-position of carbazole; the compound which is described in U.S. Pat. No. 7,626,957B and in which a hetero substituent is introduced into a benzophenone moiety; the compound which is described in JP2010-015025A and US2009/0292039A and in which a nitro group is introduced into the moiety of a coloring agent; the ketoxime compound described in WO2009/131189A; the compound which is described in U.S. Pat. No. 7,556,910B and contains a triazine skeleton and an oxime skeleton in the same molecule; the compound which is described in JP2009-221114A, has a maximum absorption at 405 nm, and exhibits favorable sensitivity with respect to a light source of a g-line; and the like may be used.

Reference can be made to, for example, paragraphs 0274 and 0275 of JP2013-029760A, the contents of which are incorporated into the present specification.

Specifically, as the oxime compound, a compound represented by Formula (OX-1) is preferable. Moreover, a N—O bond in the oxime compound may be an (E) isomer, a (Z) isomer, or a mixture of an (E) isomer and a (Z) isomer.

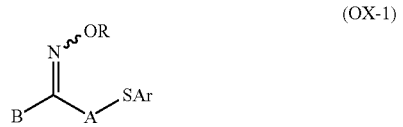

In Formula (OX-1), R and B each independently represent a monovalent substituent, A represents a divalent organic group, and Ar represents an aryl group.

In Formula (OX-1), the monovalent substituent represented by R is preferably a group of monovalent nonmetallic atoms.

Examples of the group of monovalent nonmetallic atoms include an alkyl group, an aryl group, an acyl group, an alkoxycarbonyl group, an aryloxycarbonyl group, a heterocyclic group, an alkylthiocarbonyl group, and an arylthiocarbonyl group. Moreover, these groups may have one or more substituents. Furthermore, each of the substituents may be further substituted with another substituent.

Examples of the substituent include a halogen atom, an aryloxy group, an alkoxycarbonyl group or an aryloxycarbonyl group, an acyloxy group, an acyl group, an alkyl group, and an aryl group.

As the monovalent substituent represented by B in Formula (OX-1), an aryl group, a heterocyclic group, an arylcarbonyl group, or a heterocyclic carbonyl group is preferable, and an aryl group or a heterocyclic group is more preferable. These groups may have one or more substituents. Examples of the substituents include the aforementioned substituents.

As the divalent organic group represented by A in Formula (OX-1), an alkylene group having 1 to 12 carbon atoms, a cycloalkylene group, or an alkynylene group is preferable. These groups may have one or more substituents. Examples of the substituents include the aforementioned substituents.

As the photopolymerization initiator, a fluorine atom-containing oxime compound can also be used. Specific examples of the fluorine atom-containing oxime compound include the compound described in JP2010-262028A; the compounds 24 and 36 to 40 described in JP2014-500852A; and the compound (C-3) described in JP2013-164471A. The contents of the aforementioned documents are incorporated into the present specification.

As the photopolymerization initiator, compounds represented by Formulae (1) to (4) can also be used.

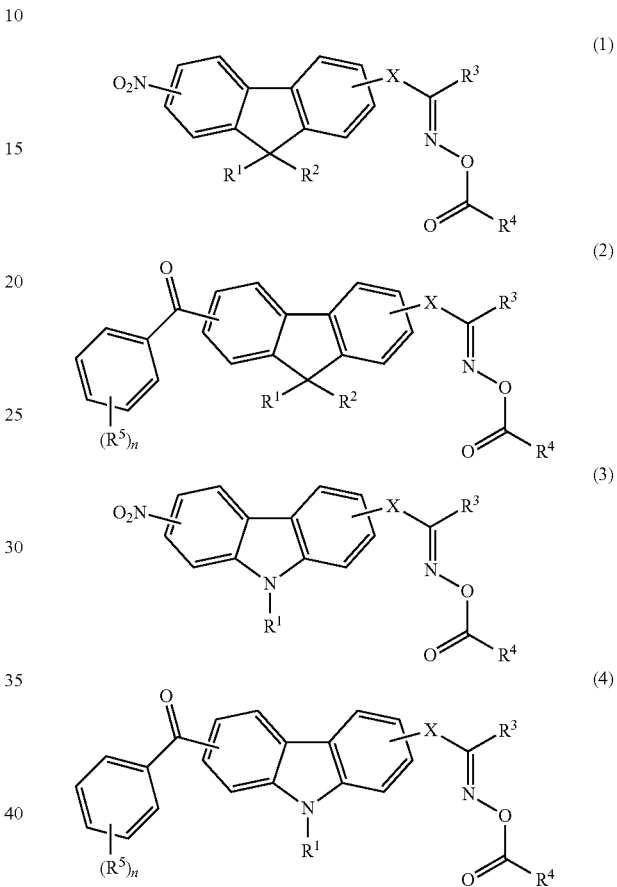

In Formula (1), $R^1$ and $R^2$ each independently represent an alkyl group having 1 to 20 carbon atoms, an alicyclic hydrocarbon group having 4 to 20 carbon atoms, an aryl group having 6 to 30 carbon atoms, or an aryl alkyl group having 7 to 30 carbon atoms, in a case where $R^1$ and $R^2$ each represent a phenyl group, the phenyl groups may be bonded to each other to form a fluorene group, $R^3$ and $R^4$ each independently represent a hydrogen atom, an alkyl group having 1 to 20 carbon atoms, an aryl group having 6 to 30 carbon atoms, an aryl alkyl group having 7 to 30 carbon atoms, or a heterocyclic group having 4 to 20 carbon atoms, and X represents a direct bond or a carbonyl group.

In Formula (2), $R^1$, $R^2$, $R^3$, and $R^4$ have the same definitions as $R^1$, $R^2$, $R^3$, and $R^4$ in Formula (1), $R^5$ represents —$R^6$, —$OR^6$, —$SR^6$, —$COR^6$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group, $R^6$ represents an alkyl group having 1 to 20 carbon atoms, an aryl group having 6 to 30 carbon atoms, an aryl alkyl group having 7 to 30 carbon atoms, or a heterocyclic group having 4 to 20 carbon atoms, X represents a direct bond or a carbonyl group, and a represents an integer of 0 to 4.

In Formula (3), $R^1$ represents an alkyl group having 1 to 20 carbon atoms, an alicyclic hydrocarbon group having 4 to 20 carbon atoms, an aryl group having 6 to 30 carbon atoms, or an aryl alkyl group having 7 to 30 carbon atoms, $R^3$ and $R^4$ each independently represent a hydrogen atom, an alkyl group having 1 to 20 carbon atoms, an aryl group having 6 to 30 carbon atoms, an aryl alkyl group having 7 to 30 carbon atoms, or a heterocyclic group having 4 to 20 carbon atoms, and X represents a direct bond or a carbonyl group.

In Formula (4), $R^1$, $R^3$, and $R^4$ have the same definitions as $R^1$, $R^3$, and $R^4$ in Formula (3), $R^5$ represents —$R^6$, —$OR^6$, —$SR^6$, —$COR^6$, —$CONR^6R^6$, —$NR^6COR^6$, —$OCOR^6$, —$COOR^6$, —$SCOR^6$, —$OCSR^6$, —$COSR^6$, —$CSOR^6$, —CN, a halogen atom, or a hydroxyl group, $R^6$ represents an alkyl group having 1 to 20 carbon atoms, an aryl group having 6 to 30 carbon atoms, an aryl alkyl group having 7 to 30 carbon atoms, or a heterocyclic group having 4 to 20 carbon atoms, X represents a direct bond or a carbonyl group, and a represents an integer of 0 to 4.

In Formulae (1) and (2), $R^1$ and $R^2$ are preferably each independently a methyl group, an ethyl group, an n-propyl group, an i-propyl group, a cyclohexyl group, or a phenyl group. $R^3$ is preferably a methyl group, an ethyl group, a phenyl group, a tolyl group, or a xylyl group. $R^4$ is preferably an alkyl group having 1 to 6 carbon atoms or a phenyl group. $R^5$ is preferably a methyl group, an ethyl group, a phenyl group, a tolyl group, or a naphthyl group. X is preferably a direct bond.

Furthermore, in Formulae (3) and (4), $R^1$'s are preferably each independently a methyl group, an ethyl group, an n-propyl group, an i-propyl group, a cyclohexyl group, or a phenyl group. $R^3$ is preferably a methyl group, an ethyl group, a phenyl group, a tolyl group, or a xylyl group. $R^4$ is preferably an alkyl group having 1 to 6 carbon atoms or a phenyl group. $R^5$ is preferably a methyl group, an ethyl group, a phenyl group, a tolyl group, or a naphthyl group. X is preferably a direct bond.

Specific examples of the compounds represented by Formula (1) and Formula (2) include the compound described in paragraphs 0076 to 0079 of JP2014-137466A. The contents of the aforementioned document are incorporated into the present specification.

Specific examples of an oxime compound preferably used in the composition are shown below. Among the oxime compounds shown below, an oxime compound represented by General Formula (C-13) is more preferable.

Furthermore, as the oxime compound, the compounds described in Table 1 of WO2015/036910A can also be used, the contents of which are incorporated into the present specification.

(C-1)

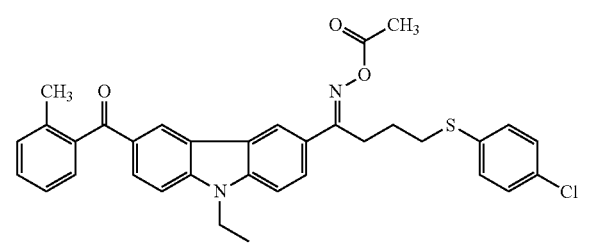

(C-2)

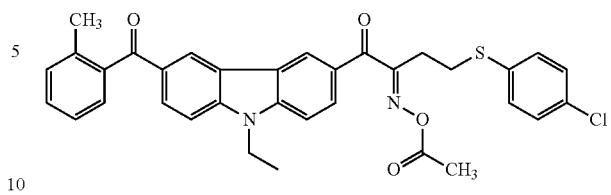

(C-3)

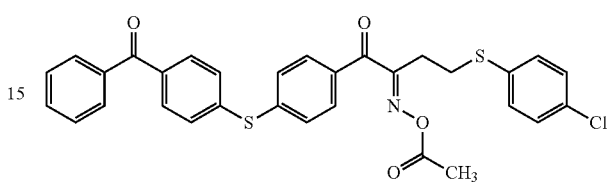

(C-4)

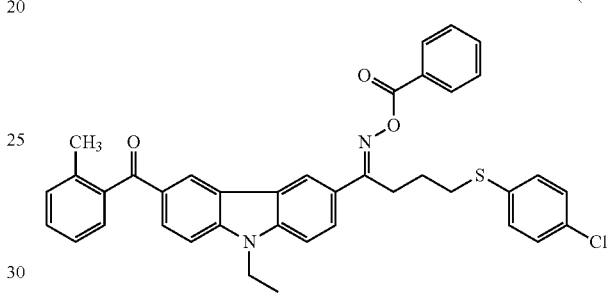

(C-5)

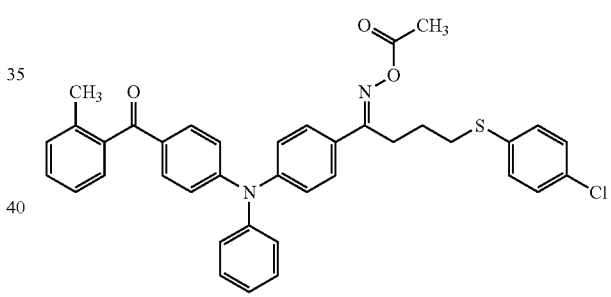

(C-6)

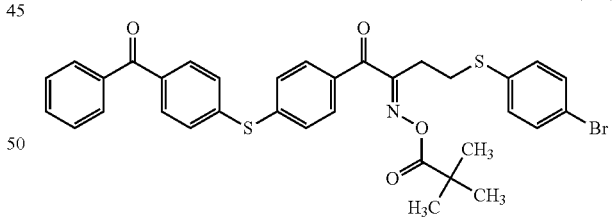

(C-7)

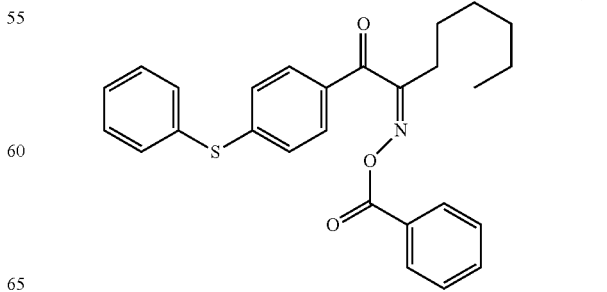

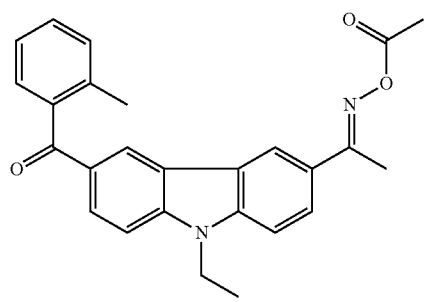
(C-8)

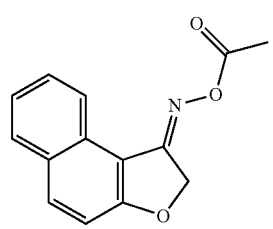
(C-9)

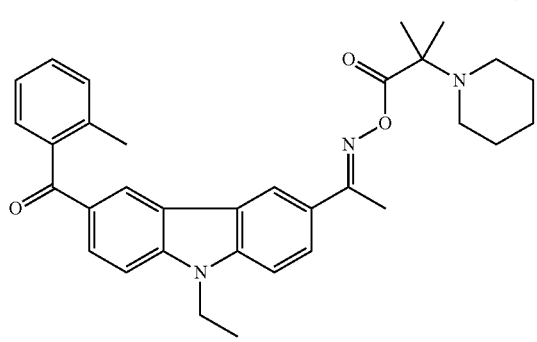
(C-10)

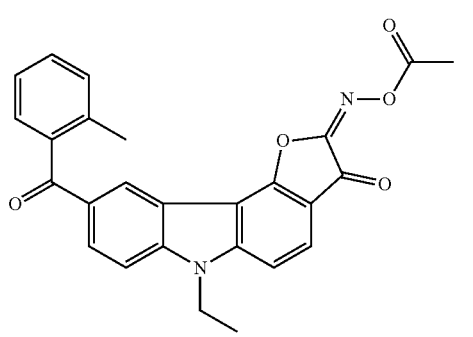
(C-11)

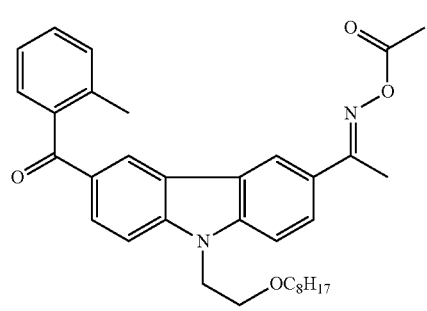
(C-12)

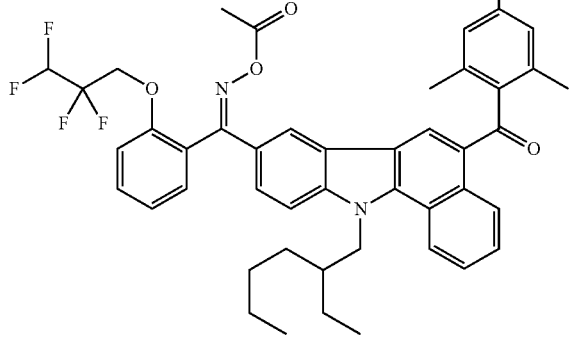
(C-13)

The oxime compound preferably has a maximum absorption in a wavelength range of 350 to 500 nm, more preferably has a maximum absorption in a wavelength range of 360 to 480 nm, and even more preferably has a high absorbance at wavelengths of 365 nm and 405 nm.

From the viewpoint of sensitivity, a molar absorption coefficient of the oxime compound at 365 nm or 405 nm is preferably 1,000 to 300,000, more preferably 2,000 to 300,000, and even more preferably 5,000 to 200,000.

The molar absorption coefficient of the compound can be measured by known methods, but for example, it is preferable that the measurement is carried out with an ultraviolet and visible spectrophotometer (Cary-5 spectrophotometer manufactured by Varian, Inc.) at a concentration of 0.01 g/L using ethyl acetate.

If necessary, two or more photopolymerization initiators may be used in combination.

In addition, as the photopolymerization initiator, the compounds described in paragraph 0052 of JP2008-260927A, paragraphs 0033 to 0037 of JP2010-097210A, and paragraph 0044 of JP2015-068893A can also be used, the contents of which are incorporated into the present specification.

[Polymerizable Compound]

The composition according to the embodiment of the present invention preferably contains a polymerizable compound.

In the present specification, the polymerizable compound means a compound which is polymerized by the action of the polymerization initiator which will be described later, and a component different from the aforementioned dispersant and alkali-soluble resin.

Moreover, the polymerizable compound means a component different from an epoxy group-containing compound which will be described later.

A content of the polymerizable compound in the composition is not particularly limited, but is preferably 5% to 35% by mass, more preferably 10% to 30% by mass, and even more preferably 15% to 25% by mass, with respect to the total solid content of the composition. The polymerizable compounds may be used singly or in combination of two or more thereof. In a case where two or more polymerizable compounds are used in combination, the total content thereof is preferably within the above range.

The polymerizable compound is preferably a low-molecular compound, and the low-molecular compound mentioned here is a compound having a molecular weight equal to or less than 2,000.

The polymerizable compound is preferably a compound which contains a group (hereinafter, simply referred to as an "ethylenically unsaturated group" as well) containing an ethylenically unsaturated bond.

That is, the composition according to the embodiment of the present invention preferably contains, as a polymerizable compound, a low-molecular compound containing an ethylenically unsaturated group.

The polymerizable compound is preferably a compound containing one or more ethylenically unsaturated bonds, more preferably a compound containing two or more ethylenically unsaturated bonds, even more preferably a compound containing three or more ethylenically unsaturated bonds, and particularly preferably a compound containing five or more ethylenically unsaturated bonds. The upper limit thereof is equal to or smaller than 15, for example. Examples of the ethylenically unsaturated group include a vinyl group, a (meth)allyl group, and a (meth)acryloyl group.

As the polymerizable compound, for example, the compounds described in paragraph 0050 of JP2008-260927A and paragraph 0040 of JP2015-068893A can be used, the contents of which are incorporated into the present specification.

The polymerizable compound may be in any chemical form such as a monomer, a prepolymer, an oligomer, a mixture thereof, and a multimer thereof.

The polymerizable compound is preferably a tri- to pentadeca-functional (meth)acrylate compound, and more preferably a tri- to hexa-functional (meth)acrylate compound.

As the polymerizable compound, a compound which contains one or more ethylenically unsaturated groups and has a boiling point equal to or higher than 100° C. under normal pressure is also preferable. Reference can be made to, for example, the compounds described in paragraph 0227 of JP2013-029760A and paragraphs 0254 to 0257 of JP2008-292970A, the contents of which are incorporated into the present specification.

As the polymerizable compound, dipentaerythritol triacrylate (as a commercial product, KAYARAD D-330; produced by Nippon Kayaku Co., Ltd.), dipentaerythritol tetraacrylate (as a commercial product, KAYARAD D-320; produced by Nippon Kayaku Co., Ltd.), dipentaerythritol penta(meth)acrylate (as a commercial product, KAYARAD D-310; produced by Nippon Kayaku Co., Ltd.), dipentaerythritol hexa(meth)acrylate (as a commercial product, KAYARAD DPHA; produced by Nippon Kayaku Co., Ltd., and A-DPH-12E; produced by Shin-Nakamura Chemical Co., Ltd.), and a structure (for example, SR454 and SR499 commercially available from Sartomer) in which an ethylene glycol residue or a propylene glycol residue is between these (meth)acryloyl groups are preferable. Oligomer types thereof can also be used. Moreover, NK ESTER A-TMMT (pentaerythritol tetraacrylate, produced by Shin-Nakamura Chemical Co., Ltd.), KAYARAD RP-1040, KAYARAD DPEA-12LT, KAYARAD DPHA LT, KAYARAD RP-3060, and KAYARAD DPEA-12 (produced by Nippon Kayaku Co., Ltd.), or the like may be used.

The preferred aspects of the polymerizable compound are shown below.

The polymerizable compound may have an acid group such as a carboxylic acid group, a sulfonic acid group, and a phosphoric acid group. The polymerizable compound containing an acid group is preferably an ester of an aliphatic polyhydroxy compound and an unsaturated carboxylic acid, more preferably a polymerizable compound having an acid group by reacting a nonaromatic carboxylic acid anhydride with an unreacted hydroxyl group of an aliphatic polyhydroxy compound, and even more preferably a compound in which the aliphatic polyhydroxy compound in the ester is pentaerythritol and/or dipentaerythritol. Examples of a commercial product thereof include ARONIX TO-2349, M-305, M-510, and M-520 produced by TOAGOSEI CO., LTD.

The acid value of the polymerizable compound containing an acid group is preferably 0.1 to 40 mg KOH/g and more preferably 5 to 30 mg KOH/g. In a case where the acid value of the polymerizable compound is equal to or greater than 0.1 mg KOH/g, development dissolution characteristics are favorable, and in a case where the acid value is equal to or less than 40 mg KOH/g, the polymerizable compound is advantageous in terms of production and/or handling. Moreover, a photopolymerization performance is favorable, and curing properties are excellent.

As the polymerizable compound, a compound having a caprolactone structure is also a preferred aspect.

The compound having a caprolactone structure is not particularly limited as long as the compound has a caprolactone structure in a molecule, but examples thereof include ε-caprolactone-modified polyfunctional (meth)acrylate which is obtained by esterifying polyhydric alcohol such as trimethylolethane, ditrimethylolethane, trimethylolpropane, ditrimethylolpropane, pentaerythritol, dipentaerythritol, tripentaerythritol, glycerin, diglycerin, and trimethylol melamine, (meth)acrylic acid, and ε-caprolactone. Among them, a compound which has a caprolactone structure and is represented by Formula (Z-1) is preferable.

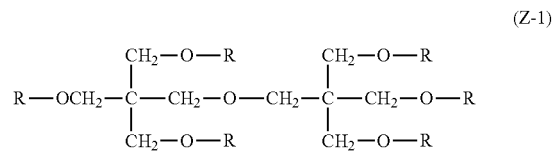

In Formula (Z-1), all six R's are groups represented by Formula (Z-2), or one to five R's among the six R's are groups represented by Formula (Z-2) and the others are groups represented by Formula (Z-3).

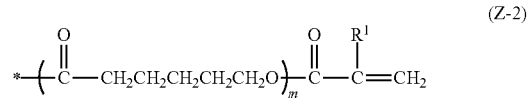

In Formula (Z-2), $R^1$ represents a hydrogen atom or a methyl group, m represents a number of 1 or 2, and "*" represents a bond.

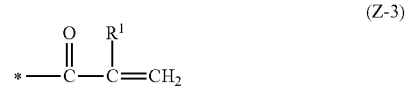

In Formula (Z-3), $R^1$ represents a hydrogen atom or a methyl group, and "*" represents a bond.

The polymerizable compound having a caprolactone structure is commercially available, for example, as KAYARAD DPCA series from Nippon Kayaku Co., Ltd., and examples thereof include DPCA-20 (a compound in which min Formulae (Z-1) to (Z-3) is 1, the number of groups represented by Formula (Z-2) is 2, and all of $R^1$'s represent hydrogen atoms), DPCA-30 (a compound in which min Formulae (Z-1) to (Z-3) is 1, the number of groups represented by Formula (Z-2) is 3, and all of $R^1$'s represent hydrogen atoms), DPCA-60 (a compound in which min Formulae (Z-1) to (Z-3) is 1, the number of groups represented by Formula (Z-2) is 6, and all of $R^1$'s represent hydrogen atoms), and DPCA-120 (a compound in which min Formulae (Z-1) to (Z-3) is 2, the number of groups represented by Formula (Z-2) is 6, and all of $R^1$'s represent hydrogen atoms).

As the polymerizable compound, a compound represented by Formula (Z-4) or (Z-5) can also be used.

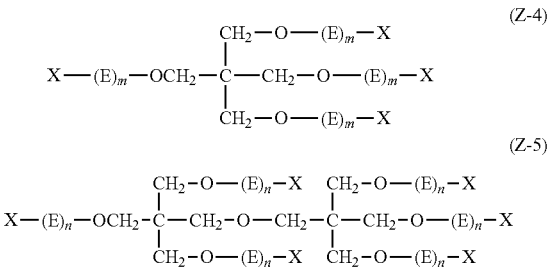

In Formulae (Z-4) and (Z-5), E's each independently represent $—((CH_2)_yCH_2O)—$ or $((CH_2)_yCH(CH_3)O)—$, y's each independently represent an integer of 0 to 10, and X's each independently represent a (meth)acryloyl group, a hydrogen atom, or a carboxylic acid group.

In Formula (Z-4), the total number of (meth)acryloyl groups is 3 or 4, m's each independently represent an integer of 0 to 10, and the total number of m's is an integer of 0 to 40.

In Formula (Z-5), the total number of (meth)acryloyl groups is 5 or 6, n's each independently represent an integer of 0 to 10, and the total number of n's is an integer of 0 to 60.

In Formula (Z-4), m is preferably an integer of 0 to 6 and more preferably an integer of 0 to 4.

Moreover, the total number of m's is preferably an integer of 2 to 40, more preferably an integer of 2 to 16, and even more preferably an integer of 4 to 8.

In Formula (Z-5), n is preferably an integer of 0 to 6 and more preferably an integer of 0 to 4.

Moreover, the total number of n's is preferably an integer of 3 to 60, more preferably an integer of 3 to 24, and even more preferably an integer of 6 to 12.

Furthermore, an aspect in which a terminal on the oxygen atom side of $—((CH_2)_yCH_2O)—$ or $((CH_2)_yCH(CH_3)O)—$ in Formula (Z-4) or Formula (Z-5) is bonded to X is preferable.

The compounds represented by Formula (Z-4) or Formula (Z-5) may be used singly or in combination of two or more thereof. In particular, an aspect in which all of six X's in Formula (Z-5) are acryloyl groups, or a mixture of a compound in which all of six X's in Formula (Z-5) are acryloyl groups and a compound in which at least one among the six X's is a hydrogen atom is preferable. With such a configuration, the developability can be further improved.

Furthermore, the total content of the compounds represented by Formula (Z-4) or Formula (Z-5) in the polymerizable compound is preferably equal to or greater than 20% by mass and more preferably equal to or greater than 50% by mass.

Among the compounds represented by Formula (Z-4) or Formula (Z-5), a pentaerythritol derivative and/or a dipentaerythritol derivative is more preferable.

In addition, the polymerizable compound may have a cardo skeleton.

As the polymerizable compound having a cardo skeleton, a polymerizable compound having a 9,9-bisarylfluorene skeleton is preferable.

The polymerizable compound having a cardo skeleton is not limited, but examples thereof include an ONCOAT EX series (produced by NAGASE & CO., LTD.), and OGSOL (produced by Osaka Gas Chemicals Co., Ltd.).

As the polymerizable compound, a compound having an isocyanuric acid skeleton as a core is also preferable. Examples of such a polymerizable compound include NK ESTER A-9300 (produced by Shin-Nakamura Chemical Co., Ltd.).

The content (which means a value obtained by dividing the number of ethylenically unsaturated groups in the polymerizable compound by the molecular weight (g/mol) of the polymerizable compound) of the ethylenically unsaturated group in the polymerizable compound is preferably equal to or greater than 5.0 mmol/g. The upper limit thereof is not particularly limited, but is generally equal to or less than 20.0 mmol/g.

Furthermore, in a case where the composition contains a plurality of types of polymerizable compounds and double bond equivalents of respective polymerizable compounds are not the same, a value obtained by summing up products of mass ratios of respective polymerizable compounds in all the polymerizable compounds and double bond equivalents of respective polymerizable compounds is preferably within the above range.

[Epoxy Group-Containing Compound]

The composition according to the embodiment of the present invention may use an epoxy group-containing compound.

Examples of the epoxy group-containing compound include compounds having one or more epoxy groups in one molecule, and compounds having two or more epoxy groups in one molecule are preferable. It is preferable that 1 to 100 epoxy groups are contained in one molecule. The upper limit thereof may be equal to or smaller than 10 or equal to or smaller than 5, for example. The lower limit thereof is preferably equal to or more than 2.

In addition, the epoxy group-containing compound means a component different from the aforementioned dispersant, alkali-soluble resin, and polymerizable compound.

An epoxy equivalent (=molecular weight of epoxy group-containing compound/the number of epoxy groups) of the epoxy group-containing compound is preferably equal to or less than 500 g/equivalent, more preferably 100 to 400 g/equivalent, and even more preferably 100 to 300 g/equivalent.

The epoxy group-containing compound may be a low-molecular compound (for example, the molecular weight is less than 2,000) or a polymer compound (macromolecule) (for example, the molecular weight is equal to or greater than 2,000, and in a case of a polymer, the weight-average molecular weight is equal to or greater than 2,000). A weight-average molecular weight of the epoxy group-containing compound is preferably 200 to 100,000 and more preferably 500 to 50,000. The upper limit of the weight-average molecular weight is more preferably equal to or less than 10,000, even more preferably equal to or less than 5,000, and particularly preferably equal to or less than 3,000.

A commercial product may be used for the epoxy group-containing compound. Examples thereof include EHPE3150 (produced by DAICEL CORPORATION) and EPICLON N-695 (produced by DIC CORPORATION). Moreover, as the epoxy group-containing compound, the compounds described in paragraphs 0034 to 0036 of JP2013-011869A, paragraphs 0147 to 0156 of JP2014-043556A, and paragraphs 0085 to 0092 of JP2014-089408A may be used. The contents of the aforementioned documents are incorporated into the present specification.

A content of the epoxy group-containing compound in the composition is preferably 0.1% to 10% by mass, more preferably 0.5% to 8% by mass, and even more preferably 1.0% to 6% by mass, with respect to the total solid content in the composition.

The epoxy group-containing compounds may be used singly or in combination of two or more thereof.

In a case where the composition contains two or more epoxy group-containing compounds, the total content thereof is preferably within the above range.

[Ultraviolet Absorber]

The composition may contain an ultraviolet absorber. By doing so, a pattern shape of a cured film can be made into a superior (fine) shape.

As the ultraviolet absorber, salicylate-based, benzophenone-based, benzotriazole-based, substituted acrylonitrile-based, and triazine-based ultraviolet absorbers can be used. As specific examples thereof, the compound described in paragraphs 0137 to 0142 of JP2012-068418A (corresponding to paragraphs 0251 to 0254 of US2012/0068292A) can be used, the contents of which can be incorporated by reference into the present specification.

In addition to the aforementioned compounds, a diethyl-amino-phenylsulfonyl-based ultraviolet absorber (produced by DAITO CHEMICAL CO., LTD., trade name: UV-503) or the like is also suitably used.

Examples of the ultraviolet absorber include the compounds exemplified in paragraphs 0134 to 0148 of JP2012-032556A.

A content of the ultraviolet absorber is preferably 0.001% to 15% by mass, more preferably 0.01% to 10% by mass, and even more preferably 0.1% to 5% by mass, with respect to the total solid content of the composition.

[Silane Coupling Agent (Adhesive Agent)]

The composition may contain a silane coupling agent.

The silane coupling agent functions as an adhesive agent which improves adhesiveness between a substrate and a cured film in a case where the cured film is formed on the substrate.

The silane coupling agent is a compound containing a hydrolyzable group and other functional groups in a molecule. Moreover, the hydrolyzable group such as an alkoxy group is bonded to the silicon atom.

The hydrolyzable group refers to a substituent which is directly bonded to a silicon atom and can form a siloxane bond by a hydrolysis reaction and/or a condensation reaction. Examples of the hydrolyzable group include a halogen atom, an alkoxy group, an acyloxy group, and an alkenyloxy group. In a case where the hydrolyzable group contains a carbon atom, the number of carbon atoms is preferably equal to or smaller than 6 and more preferably equal to or smaller than 4. In particular, an alkoxy group having 4 or less carbon atoms or an alkenyloxy group having 4 or less carbon atoms is preferable.

Furthermore, in a case where a cured film is formed on a substrate, in order to improve adhesiveness between the substrate and the cured film, the silane coupling agent preferably does not contain a fluorine atom and a silicon atom (here, a silicon atom to which a hydrolyzable group is bonded is excluded), and desirably does not contain a fluorine atom, a silicon atom (here, a silicon atom to which a hydrolyzable group is bonded is excluded), an alkylene group substituted with a silicon atom, a linear alkyl group having 8 or more carbon atoms, and a branched alkyl group having 3 or more carbon atoms.

The silane coupling agent may contain an ethylenically unsaturated group such as a (meth)acryloyl group. In a case where the silane coupling agent contains an ethylenically unsaturated group, the number thereof is preferably 1 to 10 and more preferably 4 to 8. Moreover, the silane coupling agent (for example, a compound which contains a hydrolyzable group and an ethylenically unsaturated group and has a molecular weight equal to or less than 2,000) containing an ethylenically unsaturated group does not correspond to the aforementioned polymerizable compound.

A content of the silane coupling agent in the composition is preferably 0.1% to 10% by mass, more preferably 0.5% to 8% by mass, and even more preferably 1.0% to 6% by mass, with respect to the total solid content in the composition.

The composition may contain one silane coupling agent singly or two or more silane coupling agents. In a case where the composition contains two or more silane coupling agents, the total amount thereof may be within the above range.

Examples of the silane coupling agent include 3-glycidoxypropyl trimethoxysilane, 3-glycidoxypropyl triethoxysilane, 3-glycidoxypropyl methyldimethoxysilane, 3-glycidoxypropyl methyldiethoxysilane, vinyltrimethoxysilane, and vinyltriethoxysilane.

[Surfactant]

The composition may contain a surfactant. The surfactant contributes to improvement in coating properties of the composition.

In a case where the composition contains a surfactant, a content of the surfactant is preferably 0.001% to 2.0% by mass, more preferably 0.005% to 0.5% by mass, and even more preferably 0.01% to 0.1% by mass, with respect to the total solid content of the composition.

The surfactants may be used singly or in combination of two or more thereof. In a case where two or more surfactants are used in combination, the total amount thereof is preferably within the above range.

Examples of the surfactant include a fluorine-based surfactant, a nonionic surfactant, a cationic surfactant, an anionic surfactant, and a silicone-based surfactant.

For example, in a case where the composition contains a fluorine-based surfactant, liquid characteristics (particularly, fluidity) of the composition are further improved. That is, in a case where a film is formed of the composition containing the fluorine-based surfactant, an interfacial tension between a surface to be coated and a coating liquid is reduced, and accordingly, wettability with respect to the surface to be coated is improved, and coating properties to the surface to be coated are improved. Therefore, even in a case where a thin film having a thickness of about several micrometers is formed with a small amount of a liquid, the fluorine-based surfactant is effective from the viewpoint that a film having a uniform thickness and small thickness unevenness is more suitably formed.

A content ratio of fluorine in the fluorine-based surfactant is preferably 3% to 40% by mass, more preferably 5% to 30% by mass, and even more preferably 7% to 25% by mass. A fluorine-based surfactant having a content ratio of fluorine within the above range is effective from the viewpoint of uniformity of the thickness of the coating film and/or liquid saving properties, and also has favorable solubility in the composition.

Examples of the fluorine-based surfactant include MEGAFACE F171, MEGAFACE F172, MEGAFACE F173, MEGAFACE F176, MEGAFACE F177, MEGAFACE F141, MEGAFACE F142, MEGAFACE F143, MEGAFACE F144, MEGAFACE R30, MEGAFACE F437, MEGAFACE F475, MEGAFACE F479, MEGAFACE F482, MEGAFACE F554, and MEGAFACE F780 (all produced by DIC Corporation), FLUORAD FC430, FLUORAD FC431, and FLUORAD FC171 (all produced by Sumitomo 3M Limited), SURFLON S-382, SURFLON SC-101, SURFLON SC-103, SURFLON SC-104, SURFLON SC-105, SURFLON SC-1068, SURFLON SC-381, SURFLON SC-383, SURFLON S-393, and SURFLON KH-40 (all produced by ASAHI GLASS CO., LTD.), and PF636, PF656, PF6320, PF6520, and PF7002 (produced by OMNOVA Solutions Inc.).

As the fluorine-based surfactant, a block polymer can also be used, and specific examples thereof include the compound described in JP2011-089090A.

[Solvent]

The composition preferably contains a solvent.

The solvent is not particularly limited, and known solvents can be used.

A content of the solvent in the composition is not particularly limited, but is preferably an amount such that the solid content of the composition is 10% to 90% by mass, more preferably an amount such that the solid content of the composition is 10% to 40% by mass, and even more preferably an amount such that the solid content of the composition is 15% to 35% by mass.

The solvents may be used singly or in combination of two or more thereof. In a case where two or more solvents are used in combination, the content thereof is preferably adjusted such that the total solid content of the composition is within the above range.

Examples of the solvent include water and an organic solvent.

Examples of the organic solvent include acetone, methyl ethyl ketone, cyclohexane, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, cyclopentanone, diacetone alcohol, ethylene glycol monomethyl ether acetate, ethylene glycol ethyl ether acetate, ethylene glycol monoisopropyl ether, ethylene glycol monobutyl ether acetate, 3-methoxypropanol, methoxymethoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxypropyl acetate, N,N-dimethylformamide, dimethyl sulfoxide, γ-butyrolactone, ethyl acetate, butyl acetate, methyl lactate, N-methyl-2-pyrrolidone, and ethyl lactate, but the present invention is not limited thereto.

(Water)

In a case where the composition contains water, a content thereof is preferably 0.001% to 5.0% by mass, more preferably 0.01% to 3.0% by mass, and even more preferably 0.1% to 1.0% by mass, with respect to the total mass of the composition.

In particular, the content of the water is equal to or less than 3.0% by mass (more preferably equal to or less than 1.0% by mass) with respect to the total mass of the composition, deterioration of the viscosity stability over time due to hydrolysis or the like of the components in the composition is easily suppressed, and the content is equal to or greater than 0.01% by mass (preferably equal to or greater than 0.1% by mass), precipitation stability over time is easily improved.

[Other Optional Components]

The composition may further contain optional components other than the aforementioned components. Examples thereof include a polymerization inhibitor, a sensitizer, a co-sensitizer, a crosslinking agent, a curing accelerator, a filler, a heat curing accelerator, a plasticizer, a diluent, and an oil sensitizer, and known additives such as an adhesion promoter to the surface of the substrate and other auxiliaries (for example, conductive particles, a filling agent, an antifoaming agent, a flame retardant, a leveling agent, a peeling accelerator, an antioxidant, a fragrance, a surface tension adjuster, a chain transfer agent, and the like) may be added, if necessary.

Regarding these components, reference can be made to, for example, the descriptions in paragraphs 0183 to 0228 of JP2012-003225A (corresponding to paragraphs 0237 to 0309 of US2013/0034812A), paragraphs 0101, 0102, 0103, 0104, and 0107 to 0109 of JP2008-250074A, and paragraphs 0159 to 0184 of JP2013-195480A, the contents of which are incorporated into the specification of the present application.

[Method for Producing Composition]

The composition is preferably obtained by first producing a dispersion composition in which a light-shielding pigment and a colorant are dispersed, and further mixing the obtained dispersion composition with other components.

The dispersion composition is preferably prepared by mixing a light-shielding pigment, a colorant, a resin (preferably, a dispersant), and a solvent. Moreover, it is also preferable that a polymerization inhibitor is incorporated into the dispersion composition.

The dispersion composition can be prepared by mixing the respective components described above by known mixing methods (for example, mixing methods using a stirrer, a homogenizer, a high-pressure emulsification device, a wet-type pulverizer, a wet-type disperser, or the like).

At the time of preparing the composition, the respective components may be formulated at once, or each of the components may be dissolved or dispersed in a solvent and then sequentially formulated. Moreover, the input order and the operation conditions during the formulation are not particularly limited.

For the purpose of removing foreign substances, reducing defects, and the like, the composition is preferably filtered with a filter.

The filter can be used without particular limitation as long as the filter has been used in the related art in a filtration application or the like. Examples of the filter include filters made of a fluorine resin such as polytetrafluoroethylene (PTFE), a polyamide-based resin such as nylon, a polyolefin-based resin (having a high density and an ultrahigh molecular weight) such as polyethylene and polypropylene (PP), or the like. Among these materials, polypropylene (including high-density polypropylene) and nylon are preferable.

A pore size of the filter is preferably 0.1 to 7.0 μm, more preferably 0.2 to 2.5 μm, even more preferably 0.2 to 1.5 μm, and particularly preferably 0.3 to 0.7 μm. In a case where the pore size is within the above range, it is possible to reliably remove fine foreign substances such as impurities and aggregates contained in a pigment while suppressing filtration clogging of the pigment (including a light-shielding pigment).

In a case of using a filter, different filters may be combined. In this case, filtering with a first filter may be performed only once or may be performed twice or more times. In a case where filtering is performed twice or more times with a combination of different filters, the pore sizes of the filters used in the second and subsequent filtering are preferably the same as or larger than the pore size of the filter used in the first filtering. Moreover, the first filters having different pore sizes within the above range may be combined. Regarding the pore size mentioned here, reference can be made to nominal values of filter manufacturers. A commercial filter can be selected from, for example, various filters provided by Nihon Pall Ltd., Advantec Toyo Kaisha, Ltd., Nihon Entegris K. K. (formerly Nippon Microlith Co., Ltd.), Kitz Micro Filter Corporation, and the like.

As a second filter, a filter formed of the same material as that of the first filter, or the like can be used. A pore size of the second filter is preferably 0.2 to 10.0 µm, more preferably 0.2 to 7.0 µm, and even more preferably 0.3 to 6.0 µm.

The composition preferably does not contain impurities such as a metal, a halogen-containing metal salt, an acid, and an alkali. A content of impurities contained in these materials is preferably equal to or less than 1 ppm, more preferably equal to or less than 1 ppb, even more preferably equal to or less than 100 ppt, and particularly preferably equal to or less than 10 ppt, and it is most preferable that the impurities are substantially not contained (the content is equal to or less than the detection limit the measuring device).

Furthermore, the impurities can be measured using an inductively coupled plasma mass spectrometer (manufactured by Agilent Technologies, Inc., Agilent 7500cs model).

[Method for Manufacturing Cured Film]

A composition layer (composition layer) formed of the composition is cured to obtain a pattern-like cured film.

The method for manufacturing a cured film is not particularly limited, but preferably includes the following steps.

Composition layer forming step
Exposure step
Development step
Hereinafter, each of the steps will be described.

<Composition Layer Forming Step>

In the composition layer forming step, prior to exposure, the composition is applied on a support or the like to form a layer (composition layer) of the composition. As the support, for example, a substrate for a solid-state imaging element, in which an imaging element (light-receiving element) such as a charge coupled device (CCD) and a complementary metal-oxide semiconductor (CMOS) is provided on a substrate (for example, a silicon substrate), can be used. Moreover, in order to improve adhesion with the upper layer, prevent the diffusion of substances, and planarize the surface of the substrate, an undercoat layer may be provided on the support, if necessary.

As a method for applying the composition onto the support, various coating methods such as a slit coating method, an ink jet method, a spin coating method, a cast coating method, a roll coating method, and a screen printing method can be applied. The thickness of the composition layer is preferably 0.1 to 10 µm, more preferably 0.2 to 5 µm, and even more preferably 0.2 to 3 µm. The composition layer applied on the support can be dried (pre-baked) at a temperature of 50° C. to 140° C. for 10 to 300 seconds using a hot plate, an oven, or the like.

[Exposure Step]

In the exposure step, the composition layer formed in the composition layer forming step is subjected to exposure by being irradiated with actinic rays or radiation, and the composition layer irradiated with light is cured.

The method of light irradiation is not particularly limited, but light irradiation is preferably performed through a photo mask having a pattern-like opening portion.

The exposure is preferably performed by irradiation with radiation, ultraviolet rays such as a g-line, a h-line, and an i-line are particularly preferable as the radiation which can be used during the exposure, and a high-pressure mercury lamp is preferable as a light source.

The irradiation intensity is preferably 5 to 1,500 mJ/cm$^2$ and more preferably 10 to 1,000 mJ/cm$^2$.

In addition, in a case where the composition contains a thermal polymerization initiator, the composition layer may be heated in the exposure step. A heating temperature is not particularly limited, but is preferably 80° C. to 250° C. A heating time is not particularly limited, but is preferably 30 to 300 seconds.

Furthermore, in a case where the composition layer is heated in the exposure step, the exposure step may serve as a post-heating step which will be described later. In other words, in a case where the composition layer is heated in the exposure step, the method for manufacturing a cured film may not include the post-heating step.

[Development Step]

The development step is a step of developing the exposed composition layer to form a cured film. By this step, the composition layer in a portion which is not irradiated in the exposure step is eluted, only a photo-cured portion remains, and thus a pattern-like cured film can be obtained.

A type of a developer used in the development step is not particularly limited, but an alkaline developer which does not damage the underlying imaging element and circuit or the like is desirable.

The development temperature is 20° C. to 30° C., for example.

The development time is 20 to 90 seconds, for example. In order to further remove the residues, in recent years, the development may be performed for 120 to 180 seconds. Furthermore, in order to improve residue removability, a step of shaking off the developer every 60 seconds and further supplying a fresh developer may be repeated several times.

The alkaline developer is preferably an alkaline aqueous solution which is prepared by dissolving an alkaline compound in water so that the concentration thereof is 0.001% to 10% by mass (preferably 0.01% to 5% by mass).

Examples of the alkaline compound include sodium hydroxide, potassium hydroxide, sodium carbonate, sodium silicate, sodium metasilicate, aqueous ammonia, ethylamine, diethylamine, dimethylethanolamine, tetramethylammonium hydroxide, tetraethylammonium hydroxide, tetrapropylammonium hydroxide, tetrabutylammonium hydroxide, benzyltrimethylammonium hydroxide, choline, pyrrole, piperidine, and 1,8-diazabicyclo[5.4.0]-7-undecene (among them, organic alkalis are preferable.).

Furthermore, in a case where the alkaline compound is used as an alkaline developer, the alkaline compound is generally subjected to a washing treatment with water after development.

[Post-Baking]

A heating treatment (post-baking) is preferably performed after the exposure step. The post-baking is a heating treatment after development to complete the curing. The heating temperature is preferably equal to or lower than 240° C. and more preferably equal to or lower than 220° C. The lower limit thereof is not particularly limited, but is preferably equal to or higher than 50° C. and more preferably equal to or higher than 100° C., in consideration of an efficient and effective treatment.

The post-baking can be performed continuously or batch-wise by using a heating unit such as a hot plate, a convection oven (hot-air circulating dryer), and a radio-frequency heater.

The post-baking is preferably performed in an atmosphere of a low oxygen concentration. The oxygen concentration is preferably equal to or lower than 19% by volume, more preferably equal to or lower than 15% by volume, even more preferably equal to or lower than 10% by volume, particularly preferably equal to or lower than 7% by volume, and most preferably equal to or lower than 3% by volume. The lower limit thereof is not particularly limited, but is practically equal to or higher than 10 ppm by volume.

In addition, the curing may be completed by irradiation with ultraviolet rays (UV) instead of the post-baking by heating.

In this case, it is preferable that the composition further contains a UV curing agent. The UV curing agent is preferably a UV curing agent which can be cured at a wavelength shorter than 365 nm that is an exposure wavelength of a polymerization initiator added for a lithography step by ordinary i-line exposure. Examples of the UV curing agent include CIBA IRGACURE 2959 (trade name). In a case where UV irradiation is performed, the composition layer is preferably a material which is cured at a wavelength equal to or less than a wavelength of 340 nm. The lower limit value of the wavelength is not particularly limited, but is generally equal to or greater than 220 nm. Moreover, an exposure amount of the UV irradiation is preferably 100 to 5,000 mJ, more preferably 300 to 4,000 mJ, and even more preferably 800 to 3,500 mJ. The UV curing step is preferably performed after the lithography step because low-temperature curing is more effectively performed. As an exposure light source, an ozoneless mercury lamp is preferably used.

[Physical Properties of Cured Film and Application of Cured Film]

[Physical Properties of Cured Film]

From the viewpoint that excellent light-shielding properties are exhibited, in a cured film formed of the composition according to the embodiment of the present invention, an optical density (OD) per film thickness of 1.0 μm in a wavelength range of 400 to 1,200 nm is preferably equal to or higher than 2.0 and more preferably equal to or higher than 3.0. Moreover, the upper limit value thereof is not particularly limited, but is preferably equal to or lower than 10, in general. The cured film can be preferably used as a light-shielding film.

Furthermore, in a case where the cured film (light-shielding film) is used as a light-attenuating film, the optical density per film thickness of 1.0 μm in a wavelength range of 400 to 1,200 nm is preferably 0.1 to 1.5 and more preferably 0.2 to 1.0, for example.

In the present specification, the expression that the optical density per film thickness of 1.0 μm in a wavelength range of 400 to 1,200 nm is equal to or higher than 3.0 means that an optical density per film thickness of 1.0 μm in the entire wavelength range of 400 to 1,200 nm is equal to or higher than 3.0.

Moreover, in the present specification, as a method for measuring the optical density of the cured film, a cured film is first formed on a glass substrate, measurement using a transmission densitometer (X-rite 361T (visual) densitometer) is performed, the film thickness at a measurement location is also measured, and an optical density per predetermined film thickness is calculated.

The thickness of the cured film is preferably 0.1 to 4.0 μm and more preferably 1.0 to 2.5 μm, for example. The cured film may be a thinner film or a thicker film than the above range depending on the application.

Furthermore, in a case where the cured film is used as a light-attenuating film, it is also preferable that the light-shielding properties are adjusted by making the cured film thinner (for example, 0.1 to 0.5 μm) than the above range.

In addition, it is also preferable that the cured film has a rugged surface structure. This makes it possible to reduce the reflectivity of the cured film in a case where the cured film is used as a light-shielding film. The surface of the cured film may have a rugged structure, or another layer may be provided on the cured film to impart a rugged structure. A shape of the rugged surface structure is not particularly limited, but it is preferable that the surface roughness is in a range of 0.55 μm to 1.5 μm.

The reflectivity of the cured film is preferably equal to or less than 5%, more preferably equal to or less than 3%, and even more preferably equal to or less than 2%.

A method for forming the rugged surface structure is not particularly limited, but may be a method for incorporating an organic filler and/or an inorganic filler into the cured film or other layers, a lithography method utilizing exposure development, or a method for roughening the surface of the cured film or other layers by an etching method, a sputtering method, a nanoimprint method, and the like.

Furthermore, examples of the method for reducing the reflectivity of the cured film include, in addition to the aforementioned method, a method for providing a layer of low refractive index on the cured film, a method for further providing a plurality of layers (for example, layers of high refractive index) having different refractive indices, and a method which is for forming a low-optical-density layer and a high-optical-density layer and described in JP2015-001654A.

In addition, the cured film is suitable for a light-shielding member, a light-shielding film, an antireflection member, and an antireflection film of optical filters and modules used in portable instruments such as a personal computer, a tablet PC, a mobile phone, a smartphone, and a digital camera; office automation (OA) instruments such as a printer composite machine and a scanner; industrial instruments such as monitoring camera, a barcode reader, an automated teller machine (ATM), a high-speed camera, an instrument having a personal authentication function using face image authentication; in-vehicle camera instruments; medical camera instruments such as an endoscope, a capsule endoscope, and a catheter; a biosensor, a military reconnaissance camera, a camera for a three-dimensional map, a camera for observing weather and sea, a camera for a land resource exploration, space instruments such as an exploration camera for the astronomy of the space and a deep space target; and the like.

The cured film can also be used in applications of a micro light emitting diode (LED), a micro organic light emitting diode (OLED), and the like. The cured film is suitable for an optical filter and an optical film used in the micro LED and the micro OLED and for a member which imparts a light-shielding function or an antireflection function.

Examples of the micro LED and the micro OLED include the examples described in JP2015-500562A and JP2014-533890A.

The cured film is also suitable as an optical filter and an optical film used in a quantum dot sensor and a quantum dot solid-state imaging element. Moreover, the cured film is suitable as a member which imparts a light-shielding function or an antireflection function. Examples of the quantum dot sensor and the quantum dot solid-state imaging element include the examples described in US2012/0037789A and WO2008/131313A.

[Light-Shielding Film, Solid-State Imaging Element, and Solid-State Imaging Device]

It is also preferable that the cured film according to the embodiment of the present invention is used as a so-called light-shielding film. It is also preferable that such a light-shielding film is used in a solid-state imaging element.

Furthermore, the light-shielding film is one of the preferable applications in the cured film according to the embodiment of the present invention, and the light-shielding film according to the embodiment of the present invention can be manufactured in the same manner as the method for manufacturing a cured film. Specifically, a light-shielding film can be manufactured by applying the composition to a substrate to form a composition layer, and performing exposure and development on the composition layer.

In addition, the solid-state imaging element according to the embodiment of the present invention is a solid-state imaging element which includes the cured film (light-shielding film) according to the embodiment of the present invention.

As described above, the solid-state imaging element according to the embodiment of the present invention includes the cured film (light-shielding film). An aspect in which the solid-state imaging element includes the cured film (light-shielding film) is not particularly limited, and examples thereof include an aspect in which a plurality of photodiodes and light-receiving elements consisting of polysilicon or the like constituting a light-receiving area of a solid-state imaging element (a CCD image sensor, a CMOS image sensor, or the like) are provided on a substrate, and solid-state imaging element includes the cured film on a surface side (for example, a portion other than light receiving sections and/or pixels for adjusting color, and the like) of a support on which the light-receiving elements are formed or on a side opposite to the surface on which the light-receiving elements are formed.

Moreover, in a case where the cured film (light-shielding film) is used as a light-attenuating film, for example, by disposing a light-attenuating film so that a part of light passes through the light-attenuating film and then is incident on a light-receiving element, the dynamic range of the solid-state imaging element can be improved.

The solid-state imaging device includes the aforementioned solid-state imaging element.

Figure 2:
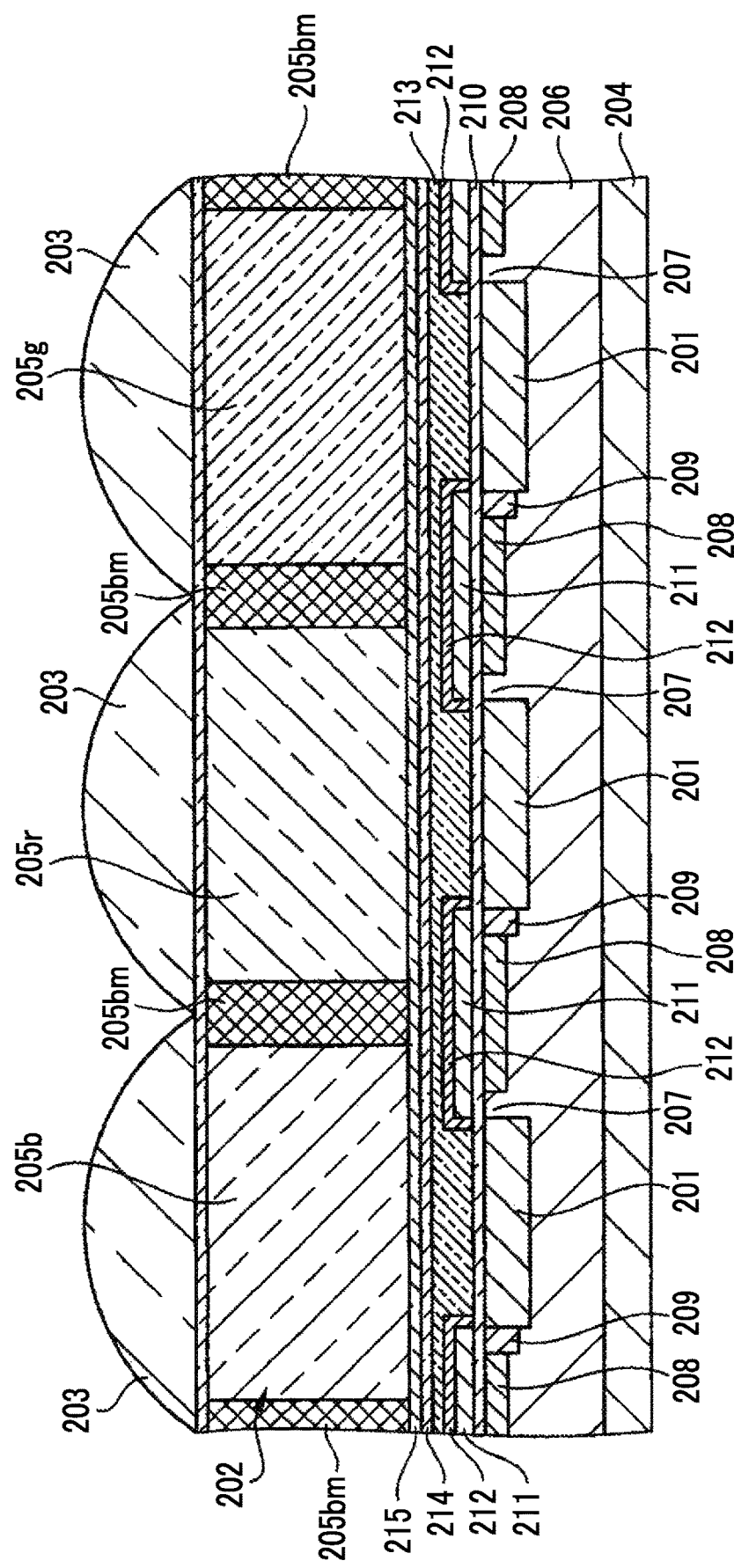
FIG. 2 is a schematic cross-sectional view showing an imaging portion in FIG. 1 in an enlarged manner.

Examples of the constitutions of the solid-state imaging device and the solid-state imaging element will be described with reference to FIGS. 1 and 2. In FIGS. 1 and 2, in order that each portion is clearly seen, some portions are magnified in disregard of a thickness ratio and/or a width ratio between the portions.

As shown in FIG. 1, a solid-state imaging device 100 comprises a rectangular solid-state imaging element 101 and a transparent cover glass 103 which is held above the solid-state imaging element 101 and seals the solid-state imaging element 101. Moreover, on the cover glass 103, a lens layer 111 is superposably provided through a spacer 104. The lens layer 111 includes a support 113 and a lens material 112. The lens layer 111 may have a constitution in which the support 113 and the lens material 112 are integrally formed. In a case where stray light is incident on the peripheral region of the lens layer 111, due to the diffusion of light, an effect of light condensation on the lens material 112 is weakened, and thus the light reaching an imaging portion 102 is reduced. Moreover, noise is also generated due to the stray light. Therefore, a light-shielding film 114 is provided in the peripheral region of the lens layer 111 so that light is shielded. The cured film obtained by the manufacturing method of the present invention can also be used as the light-shielding film 114.

The solid-state imaging element 101 performs photoelectric conversion on an optical image formed on the imaging portion 102 serving as a light-receiving surface of the solid-state imaging element 101, and outputs the converted optical image as an image signal. The solid-state imaging element 101 comprises a laminated substrate 105 obtained by laminating two sheets of substrates. The laminated substrate 105 consists of a chip substrate 106 and a circuit substrate 107 which have the same size and a rectangular shape, and the circuit substrate 107 is laminated on the rear surface of the chip substrate 106.

A material of the substrate used as the chip substrate 106 is not particularly limited, and known materials can be used.

The imaging portion 102 is provided in the central portion of the surface of the chip substrate 106. Moreover, in a case where stray light is incident on the peripheral region of the imaging portion 102, a dark current (noise) is generated from the circuit in the peripheral region, and thus a light-shielding film 115 is provided in the peripheral region so that light is shielded. The cured film obtained by the manufacturing method of the present invention is preferably used as the light-shielding film 115.

A plurality of electrode pads 108 are provided at an edge of the surface of the chip substrate 106. The electrode pads 108 are electrically connected to the imaging portion 102 through a signal wire (a bonding wire can also be used) which is provided on the surface of the chip substrate 106 and is not shown in the drawing.

On the rear surface of the circuit substrate 107, external connection terminals 109 are provided at positions approximately below the electrode pads 108. The external connection terminals 109 are respectively connected to the electrode pads 108 through a through electrode 110 vertically passing through the laminated substrate 105. Moreover, the external connection terminals 109 are connected to a control circuit controlling the driving of the solid-state imaging element 101, an image processing circuit performing image processing on an imaging signal output from the solid-state imaging element 101, and the like through wiring which is not shown in the drawing.

As shown in FIG. 2, the imaging portion 102 includes the portions, such as a light-receiving element 201, a color filter 202, and a microlens 203, provided on a substrate 204. The color filter 202 has a blue pixel 205$b$, a red pixel 205$r$, a green pixel 205$g$, and a black matrix 205$bm$. The cured film obtained by the manufacturing method of the present invention may be used as the black matrix 205$bm$.

As the material of the substrate 204, the same material as that of the chip substrate 106 can be used. On the surface layer of the substrate 204, a p-well layer 206 is formed. In the p-well layer 206, the light-receiving elements 201, which consist of an n-type layer and generate and accumulate signal charges by photoelectric conversion, are formed to be arranged in the form of square grids.

On one lateral side of each light-receiving element 201, through a reading gate portion 207 on the surface layer of the p-well layer 206, a vertical electric charge transfer path 208 consisting of an n-type layer is formed. Moreover, on the other lateral side of each light-receiving element 201, through an element separation region 209 consisting of a p-type layer, a vertical electric charge transfer path 208 belonging to the adjacent pixel is formed. The reading gate portion 207 is a channel region for the signal charges accumulated in the light-receiving element 201 to be read out toward the vertical electric charge transfer path 208.

On the surface of the substrate 204, a gate insulating film 210 consisting of an oxide-nitride-oxide (ONO) film is formed. On the gate insulating film 210, vertical electric charge transfer electrodes 211 consisting of polysilicon or amorphous silicon are formed to cover the portions which are approximately immediately above the vertical electric charge transfer path 208, the reading gate portion 207, and the element separation region 209. The vertical electric charge transfer electrodes 211 function as driving electrodes for driving the vertical electric charge transfer path 208 and performing charge transfer and as reading electrodes for driving the reading gate portion 207 and reading out signal charges. The signal charges are transferred to a horizontal electric charge transfer path and an output portion (floating diffusion amplifier), which are not shown in the drawing, in this order from the vertical electric charge transfer path 208, and then output as voltage signals.

On each of the vertical electric charge transfer electrodes 211, a light-shielding film 212 is formed to cover the surface of the electrode. The light-shielding film 212 has an opening portion at a position immediately above the light-receiving element 201 and shields a region other than the opening portion from light. The cured film obtained by the manufacturing method of the present invention may be used as the light-shielding film 212.

On the light-shielding film 212, a transparent interlayer which consists of an insulating film 213 consisting of borophosphosilicate glass (BPSG), an insulating film (passivation film) 214 consisting of P—SiN, and a planarization film 215 consisting of a transparent resin or the like is provided. The color filter 202 is formed on the interlayer.

[Image Display Device]

An image display device manufactured by the manufacturing method of the present invention includes the cured film obtained by the manufacturing method of the present invention.

Furthermore, the method for manufacturing the image display device according to the embodiment of the present invention is a method for manufacturing an image display device having the cured film, which includes a step of manufacturing a cured film through the aforementioned manufacturing method of the present invention.

Examples of the aspect in which the image display device has a cured film include an aspect in which a cured film is contained in a black matrix and a color filter including such a black matrix is used in an image display device.

Next, a black matrix and a color filter including the black matrix will be described, and a liquid crystal display device including such a color filter will be described as a specific example of the image display device.

<Black Matrix>

It is also preferable that the cured film obtained by the manufacturing method of the present invention is contained in the black matrix. The black matrix is incorporated into a color filter, a solid-state imaging element, and an image display device such as a liquid crystal display device in some cases.

Examples of the black matrix include those described above; a black rim provided in the peripheral portion of an image display device such as a liquid crystal display device; a lattice-like and/or stripe-like black portion between pixels of red, blue, and green; and a dot-like and/or linear black pattern for shielding a thin film transistor (TFT) from light. The definition of the black matrix is described in, for example, "Glossary of Liquid Crystal display Manufacturing Device", written by Yasuhira KANNO, 2nd edition, NIKKAN KOGYO SHIMBUN, LTD., 1996, p. 64.

In order to improve the display contrast and to prevent image quality deterioration resulting from current leakage of light in a case of an active matrix driving-type liquid crystal display device using a thin film transistor (TFT), the black matrix preferably has high light-shielding properties (the optical density OD is equal to or higher than 3).

The method for manufacturing the black matrix is not particularly limited, but the black matrix can be manufactured in the same manner as the method for manufacturing the cured film. Specifically, by applying the composition on a substrate to form a composition layer and performing exposure and development on the composition layer, a pattern-like cured film (black matrix) can be manufactured. Moreover, the film thickness of the cured film used as the black matrix is preferably 0.1 to 4.0 μm.

The material of the substrate is not particularly limited, but preferably has a transmittance equal to or greater than 80% for visible light (wavelength of 400 to 800 nm). Specific examples of such a material include glass such as soda lime glass, alkali-free glass, quartz glass, and borosilicate glass, and plastic such as a polyester-based resin and a polyolefin-based resin, and from the viewpoints of chemical resistance and heat resistance, alkali-free glass, quartz glass, or the like is preferable.

<Color Filter>

It is also preferable that the cured film obtained by the manufacturing method of the present invention is included in a color filter.

The aspect in which the color filter includes the cured film is not particularly limited, but examples thereof include a color filter comprising a substrate and the aforementioned black matrix. That is, examples thereof include a color filter comprising colored pixels of red, green, and blue which are formed in the opening portion of the black matrix formed on a substrate.

The color filter including a black matrix (cured film) can be manufactured, for example, by the following method.

First, in an opening portion of a pattern-like black matrix formed on a substrate, a coating film (composition layer) of a composition containing pigments corresponding to the colored pixels of the color filter is formed. Moreover, the composition for each color is not particularly limited, known compositions can be used, but in the composition described in the present specification, it is preferable that a composition in which the light-shielding pigment is replaced with a colorant corresponding to each pixel is used.

Subsequently, the composition layer is subjected to exposure through a photo mask having a pattern corresponding to the opening portion of the black matrix. Next, colored pixels can be formed in the opening portion of the black matrix by removing an unexposed portion by a development treatment, and then performing baking. In a case where the series of operations are performed using, for example, a composition for each color containing red, green, and blue pigments, a color filter having red, green, and blue pixels can be manufactured.

<Liquid Crystal Display Device>

It is also preferable that the cured film obtained by the manufacturing method of the present invention is included in a liquid crystal display device. The aspect in which the liquid crystal display device includes the cured film is not particularly limited, but examples thereof include an aspect in which the liquid crystal display device includes a color filter including the black matrix (cured film) described above.

Examples of the liquid crystal display device according to the present embodiment include an aspect in which the liquid crystal display device comprises a pair of substrates disposed to face each other and a liquid crystal compound sealed into the space between the substrates. The substrates are as described above as the substrate for a black matrix.

Examples of a specific aspect of the liquid crystal display device include a laminate having polarizing plate/substrate/color filter/transparent electrode layer/alignment film/liquid crystal layer/alignment film/transparent electrode layer/thin film transistor (TFT) element/substrate/polarizing plate/backlight unit in this order from the user side.

In addition, the liquid crystal display device is not limited to the aforementioned liquid crystal display devices, and examples thereof include the liquid crystal display devices described in "Electronic display device (written by Akio SASAKI, Kogyo Chosakai Publishing Co., Ltd., published in 1990)", "Display Device (written by Sumiaki IBUKI, Sangyo Tosho Publishing Co., Ltd., published in 1989)", or the like. Moreover, examples thereof include the liquid crystal display device described in "Next-Generation Liquid Crystal Display Technology (edited by Tatsuo UCHIDA, Kogyo Chosakai Publishing Co., Ltd., published in 1994)".

[Infrared Sensor]

It is also preferable that the cured film obtained by the manufacturing method of the present invention is included in an infrared sensor.

The infrared sensor according to the embodiment will be described with reference to FIG. 3. In an infrared sensor 300 shown in FIG. 3, a reference 310 represents a solid-state imaging element.

An imaging region provided on the solid-state imaging element 310 is constituted with a combination of an infrared absorption filter 311 and a color filter 312 according to the embodiment of the present invention.

The infrared absorption filter 311 is a film which transmits light (for example, light having a wavelength of 400 to 700 nm) in the visible light range and shields light (for example, light having a wavelength of 800 to 1,300 nm, preferably having a wavelength of 900 to 1,200 nm, and more preferably having a wavelength of 900 to 1,000 nm) in the infrared range, and a cured film containing an infrared absorber (the aspect of the infrared absorber is as described above) as a colorant can be used.

The color filter 312 is a color filter in which pixels transmitting or absorbing light having a specific wavelength in the visible light range are formed, a color filter in which pixels of red (R), green (G), and blue (B) are formed, or the like is used as an example of the color filter, and the aspect thereof is as described above.

Between an infrared transmission filter 313 and the solid-state imaging element 310, a resin film 314 (for example, a transparent resin film or the like), which transmits light having a wavelength transmitted through the infrared transmission filter 313, is disposed.

The infrared transmission filter 313 is a filter which has visible light-shielding properties and transmits infrared rays having a specific wavelength, and a cured film which is obtained by the manufacturing method of the present invention and contains a colorant (for example, a perylene compound and/or a bisbenzofuranone compound) which absorbs light in a visible light range, and an infrared absorber (for example, a pyrrolopyrrole compound, a phthalocyanine compound, a naphthalocyanine compound, a polymethine compound, and the like) can be used. It is preferable that the infrared transmission filter 313 shields light having a wavelength of 400 to 830 nm and transmits light having a wavelength of 900 to 1,300 nm, for example.

On an incidence ray hv side of the color filter 312 and the infrared transmission filter 313, microlenses 315 are arranged. A planarization film 316 is formed to cover the microlenses 315.

Figure 3:
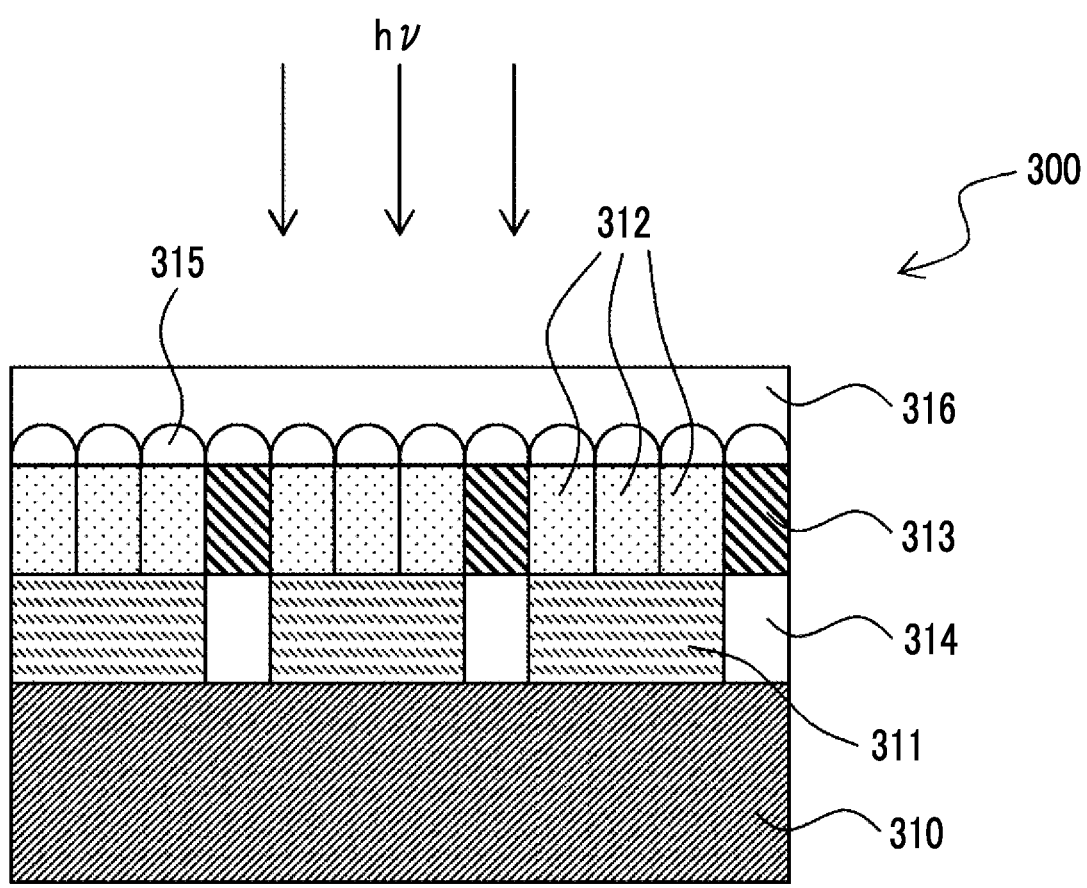
FIG. 3 is a schematic cross-sectional view showing an example of the constitution of an infrared sensor.

In the aspect shown in FIG. 3, the resin film 314 is disposed, but the infrared transmission filter 313 may be formed instead of the resin film 314. That is, on the solid-state imaging element 310, the infrared transmission filter 313 may be formed.

In the aspect shown in FIG. 3, the film thickness of the color filter 312 is the same as the film thickness of the infrared transmission filter 313, but both the film thicknesses may be different from each other.

In the aspect shown in FIG. 3, the color filter 312 is provided to be closer to the incidence ray hv side than the infrared absorption filter 311, but the order of the infrared absorption filter 311 and the color filter 312 may be switched so that the infrared absorption filter 311 is provided to be closer to the incidence ray hv side than the color filter 312.

In the aspect shown in FIG. 3, the infrared absorption filter 311 and the color filter 312 are laminated to be adjacent to each other, but both the filters do not need to be adjacent to each other, and another layer may be provided between the filters. The cured film obtained by the manufacturing method of the present invention can be used as a light-shielding film on an edge of the surface and/or a lateral surface of the infrared absorption filter 311, and, by being used as a device inner wall of an infrared sensor, can prevent internal reflection and/or unintended incidence of light on the light receiving section and can improve sensitivity.

According to the infrared sensor, image information can be simultaneously taken in, and thus motion sensing or the like by which a subject whose movement is to be detected is recognized can be carried out. Furthermore, because distance information can be obtained, images including 3D information and the like can be captured.

Next, a solid-state imaging device to which the aforementioned infrared sensor is applied will be described.

The solid-state imaging device includes a lens optical system, a solid-state imaging element, an infrared emission diode, and the like. Furthermore, regarding each of the constituents of the solid-state imaging device, reference can be made to paragraphs 0032 to 0036 of JP2011-233983A, the contents of which are incorporated into the specification of the present application.

EXAMPLES

Hereinafter, the present invention will be described in more detail based on Examples. The materials, the amounts of the materials used, the proportions, the treatment contents, the treatment procedure, and the like shown in the following Examples can be appropriately modified as long as the gist of the present invention is maintained. Accordingly, the scope of the present invention is not limited to the following Examples.

<<Production of Light-Shielding Pigment>>
[Production of Light-Shielding Pigment Pig-1]

A light-shielding pigment Pig-1 was produced by the following method.

First, a Zr powder (powder containing zirconium) (hereinafter, referred to as a "metal raw material powder" as well) as a transition metal was prepared.

Subsequently, the metal raw material powder was subjected to a plasma treatment (treatment conditions were according to the following plasma treatment (1)) in an Ar gas to form fine metal particles. An average primary particle diameter of the obtained fine metal particles was measured, and, as a result, was 90 nm. Moreover, the average primary particle diameter was determined by the following method.

Sample: A sample obtained by preparing a dispersion liquid (25% by mass of fine metal particles, 7.5% by mass of the following dispersant H-2A, and 67.5% by mass of a propylene glycol monomethyl ether acetate (PGMEA) solvent) in the same manner as in [Preparation of light-shielding pigment dispersion liquid] which will be described later, diluting the obtained dispersion liquid to 100 times with PGMEA, then adding the resultant dropwise on a carbon foil, and drying the resultant The sample was observed with a transmission electron microscope (TEM) at a magnification of 20,000 to obtain an image. Areas of the fine metal particles in the obtained image were calculated by image processing. Subsequently, diameters in a case where the obtained areas were converted into circles were calculated. This operation was performed on a total of 400 fine metal particles for 4 visual fields, and the evaluated circle-converted diameters were arithmetically averaged to obtain an average primary particle diameter of the fine metal particles.

In addition, as a result of measuring impurities contained in the fine metal particles by the following method, no impurities were detected. Moreover, the expression that no impurities are detected means that the content of the impurities is less than 20 ppm with respect to the total mass of the fine metal particles.

<Plasma Treatment (1)>

The plasma treatment (1) was performed by the following method. That is, the plasma treatment (1) was performed under the following conditions by using, as a fine metal particle production apparatus, an apparatus equivalent to the black composite fine particle production apparatus shown in FIG. 1 of WO2010/147098A.

Radio frequency voltage applied to radio-frequency oscillating coil: Frequency of about 4 MHz, and voltage of about 80 kVA Plasma gas: Argon gas (supply rate of 100 L/min)

Carrier gas: Argon gas (supply rate of 10 L/min)

Atmosphere in chamber: Argon gas (supply rate of 1,000 l/min, and flow rate in chamber of 5 m/sec)

Atmosphere in cyclone: Argon gas, and internal pressure of 50 kPa

Material supply speed from chamber to cyclone: 10 m/s (average value)

Next, a Hf powder was prepared as a raw material powder containing an atom A, and subjected to the plasma treatment under the conditions of the plasma treatment (1) to atomize the atom A. In this case, as a result of measuring impurities contained in the obtained fine particles by the following method, no impurities were detected.

Subsequently, the fine metal particles and the atomized atom A, which were obtained as described above, were mixed to obtain a metal raw material powder. The metal raw material powder was subjected to a plasma treatment (treatment conditions were according to the following plasma treatment (2)) in a nitrogen gas to obtain a light-shielding pigment.

<Plasma Treatment (2)>

The plasma treatment (2) was performed by the following method. Moreover, the apparatus used is the same as that used in the plasma treatment (1).

Radio frequency voltage applied to radio-frequency oscillating coil: Frequency of about 4 MHz, and voltage of about 80 kVA Plasma gas: Argon gas and nitrogen gas (each supply rate of 50 L/min)

Carrier gas: Nitrogen gas (supply rate of 10 L/min)

Atmosphere in chamber: Nitrogen gas (supply rate of 1,000 l/min, and flow rate in chamber of 5 m/sec)

Atmosphere in cyclone: Nitrogen gas, and internal pressure of 50 kPa

Material supply speed from chamber to cyclone: 10 m/s (average value)

In a case where the light-shielding pigment after the completion of the plasma treatment (2) was in the atmosphere using an Ar gas and a split flow-type humidity supply apparatus SRH manufactured by NIHON SHINTECH CO., LTD., a nitrogen gas at 20° C. was introduced under a condition where the relative humidity was 95%, and the resultant was left to stand for 24 hours. Thereafter, the obtained light-shielding pigment was classified using a TTSP separator manufactured by Hosokawa Micron Corporation under a condition where a yield was 10% to obtain a powder of the light-shielding pigment Pig-1. Moreover, a nitrogen gas was supplied to the separator.

An average primary particle diameter of Pig-1 was measured, and, as a result, was 35 nm.

Furthermore, the average primary particle diameter is an average primary particle diameter measured by the aforementioned method.

[Production of Light-Shielding Pigments Pig-2 to Pig-45 and Pig-C1 to Pig-C7]

With reference to the method for producing the light-shielding pigment Pig-1, the type of the metal raw material powder, the type of the raw material powder containing the atom A, and the addition amount were changed as shown in Tables 1-1 and 1-2 to produce light-shielding pigments Pig-2 to Pig-45 and Pig-C1 to Pig-C7.

Furthermore, the light-shielding pigments Pig-C1 to Pig-C7 for comparison were produced without using the raw material powder containing the atom A, or by using a raw material powder for comparison corresponding to the raw material powder containing the atom A.

Moreover, in the production of Pig-22 and Pig-23, a Si powder was also subjected to the plasma treatment under the conditions of the plasma treatment (1) to produce silicon atom fine particles. The silicon atom fine particles were mixed with the fine metal particles together with the atomized atom A to obtain a metal raw material powder, and thereafter, the same treatment as in the production of Pig-1 was performed to obtain Pig-22 or Pig-23.

The abbreviations for the transition metal raw materials and the raw materials of atom A in Tables 1-1 and 1-2 are as follows.

Zr powder: Zirconium powder produced by FUJIFILM Wako Pure Chemical Corporation

Nb powder: Niobium (powder)<100 to 325 mesh> produced by Mitsuwa Chemicals Co., Ltd.

V powder: Metal vanadium powder VHO produced by TAIYO KOKO Co., Ltd.

Tantalum Nodular: Tantalum Nodular produced by Global Advanced Metals Pty Ltd.

Y powder: Yttrium powder produced by NIPPON YTTRIUM CO., LTD.

Cr powder: Degassing electrolytic metal chromium powder produced by Kohsei Co., Ltd.

W powder: Tungsten powder AW3110 produced by Eurotungsten

Ti powder: Titanium powder NM-0031-UP produced by IoLiTec Ionic Liquids Technologies GmbH Al powder: Aluminum powder No. 22000 produced by YAMATO METAL POWDER CO., LTD.

Si powder: Silicon powder produced by Furuuchi Chemical Corporation

Hf powder: Hafnium powder produced by Furuuchi Chemical Corporation

Fe powder: Fe powder, JIP 270M produced by FE Steel Corporation

Ni powder: Ni powder, 300-nano product produced by TOHO TITANIUM CO., LTD.

Ag powder: Ag powder, SPQ03R produced by Mitsui Mining & Smelting Co., Ltd.

In addition, "%" in Tables 2-1 and 2-2 below means % by mass with respect to the total mass of the light-shielding pigment.

In the tables, "Not detected" indicates that no impurities were detected as a result of the measurement by the aforementioned measuring method, and specifically indicates that the content is less than 20 ppm by mass.

Moreover, "Not added" indicates that the atom A was not added.

A column of "Element ratio" indicates a ratio (mass ratio) of contents of respective elements in the light-shielding pigment.

For the measurement of contents (a ratio of contents) of respective elements in the light-shielding pigment and the raw material (the fine metal particles, the raw material powder, and the like) thereof, a scanning-type X-ray fluorescence spectrometer "ZSX Primus II" manufactured by Rigaku Corporation was used.

TABLE 1-1

| | Before plasma treatment | | | After plasma treatment (1) | | |
| | | Atom A (or silicon atom) | | Fine metal particles | | Atomized atom A |
| | Metal raw material powder | | Type of raw material powder | Average primary particle diameter | Impurities | Impurities |
| | Type | Impurities | | | | |
|---|---|---|---|---|---|---|
| Pig-1 | Zr powder | Hf | Hf powder | 90 nm | Not detected | Not detected |
| Pig-2 | Zr powder | Hf | Hf powder | 90 nm | Not detected | Not detected |
| Pig-3 | Zr powder | Hf | Hf powder | 90 nm | Not detected | Not detected |
| Pig-4 | Zr powder | Hf | Hf powder | 90 nm | Not detected | Not detected |
| Pig-5 | Zr powder | Hf | Hf powder | 90 nm | Not detected | Not detected |
| Pig-6 | Zr powder | Hf | W powder | 90 nm | Not detected | Not detected |
| Pig-7 | Zr powder | Hf | W powder | 90 nm | Not detected | Not detected |
| Pig-8 | Zr powder | Hf | W powder | 90 nm | Not detected | Not detected |
| Pig-9 | Zr powder | Hf | W powder | 90 nm | Not detected | Not detected |
| Pig-10 | Zr powder | Hf | W powder | 90 nm | Not detected | Not detected |
| Pig-11 | Zr powder | Hf | Hf powder | 90 nm | Not detected | Not detected |
| Pig-12 | Zr powder | Hf | Hf powder | 90 nm | Not detected | Not detected |
| Pig-13 | Zr powder | Hf | Hf powder | 90 nm | Not detected | Not detected |
| Pig-14 | Zr powder | Hf | Hf powder | 90 nm | Not detected | Not detected |
| Pig-15 | Zr powder | Hf | Hf powder | 90 nm | Not detected | Not detected |
| Pig-16 | Zr powder | Hf | W powder | 90 nm | Not detected | Not detected |
| Pig-17 | Zr powder | Hf | W powder | 90 nm | Not detected | Not detected |
| Pig-18 | Zr powder | Hf | W powder | 90 nm | Not detected | Not detected |
| Pig-19 | Zr powder | Hf | W powder | 90 nm | Not detected | Not detected |
| Pig-20 | Zr powder | Hf | W powder | 90 nm | Not detected | Not detected |
| Pig-21 | Zr powder | Hf | Hf powder/W powder | 90 nm | Not detected | Not detected |
| Pig-22 | Zr powder | Hf | Hf powder/Si powder | 90 nm | Not detected | Not detected |
| Pig-23 | Zr powder | Hf | W powder/Si powder | 90 nm | Not detected | Not detected |
| Pig-24 | Zr powder | Hf | W powder | 90 nm | Not detected | Not detected |
| Pig-25 | Zr powder | Hf | W powder | 90 nm | Not detected | Not detected |
| Pig-26 | Zr powder | Hf | W powder | 90 nm | Not detected | Not detected |
| Pig-27 | Zr powder | Hf | W powder | 90 nm | Not detected | Not detected |
| Pig-28 | Zr powder | Hf | W powder | 90 nm | Not detected | Not detected |
| Pig-29 | Nb powder | Fe/Ni | Hf powder | 80 nm | Not detected | Not detected |
| Pig-30 | Nb powder | Fe/Ni | W powder | 80 nm | Not detected | Not detected |

TABLE 1-2

| | Before plasma treatment | | Atom A (or silicon atom) | After plasma treatment (1) | | |
|---|---|---|---|---|---|---|
| | Metal raw material powder | | Type of raw | Fine metal particles | | Atomized atom A |
| | Type | Impurities | material powder | Average primary particle diameter | Impurities | Impurities |
| Pig-31 | Nb powder | Fe/Ni | Hf powder/W powder | 80 nm | Not detected | Not detected |
| Pig-32 | Nb powder | Fe/Ni | Hf powder/Si powder | 80 nm | Not detected | Not detected |
| Pig-33 | Nb powder | Fe/Ni | W powder/Si powder | 80 nm | Not detected | Not detected |
| Pig-34 | V powder | Al/Si/Fe/Mo | Hf powder | 90 nm | Not detected | Not detected |
| Pig-35 | V powder | Al/Si/Fe/Mo | W powder | 90 nm | Not detected | Not detected |
| Pig-36 | V powder | Al/Si/Fe/Mo | Hf powder/W powder | 90 nm | Not detected | Not detected |
| Pig-37 | V powder | Al/Si/Fe/Mo | Hf powder/Si powder | 90 nm | Not detected | Not detected |
| Pig-38 | V powder | Al/Si/Fe/Mo | W powder/Si powder | 90 nm | Not detected | Not detected |
| Pig-39 | Tantalum Nodular | Fe/Ni | Hf powder | 90 nm | Not detected | Not detected |
| Pig-40 | Tantalum Nodular | Fe/Ni | W powder | 90 nm | Not detected | Not detected |
| Pig-41 | Y powder | Al/Fe/Cu | Hf powder | 90 nm | Not detected | Not detected |
| Pig-42 | Y powder | Al/Fe/Cu | W powder | 90 nm | Not detected | Not detected |
| Pig-43 | Cr powder | Fe/Mg/Al | Hf powder | 90 nm | Not detected | Not detected |
| Pig-44 | Cr powder | Fe/Mg/Al | W powder | 90 nm | Not detected | Not detected |
| Pig-45 | Ti powder | Fe/Ni | W powder | 90 nm | Not detected | Not detected |
| Pig-C1 | Zr powder | Hf | Fe powder/Si powder | 90 nm | Not detected | Not detected |
| Pig-C2 | Nb powder | Fe/Ni | Ni powder/Ag powder | 80 nm | Not detected | Not detected |
| Pig-C3 | V powder | Al/Si/Fe/Mo | Al powder/Si powder | 90 nm | Not detected | Not detected |
| Pig-C4 | Zr powder | Hf | Not added | 90 nm | Not detected | — |
| Pig-C5 | V powder | Al/Si/Fe/Mo | Not added | 90 nm | Not detected | — |
| Pig-C6 | Al powder | Fe/Si | Not added | 80 nm | Not detected | — |
| Pig-C7 | Si powder | Fe/Al/Ca | Not added | 120 nm | Not detected | — |

TABLE 2-1

| | After plasma treatment (2) Light-shielding pigment | | |
|---|---|---|---|
| | Addition amount of atomized atom A | Average primary particle diameter | Element ratio |
| Pig-1 | 0.2% | 35 nm | Zr/N/O/Hf = 77.4%/12.9%/9.5%/0.2% |
| Pig-2 | 0.5% | 36 nm | Zr/N/O/Hf = 77.3%/12.8%/9.4%/0.5% |
| Pig-3 | 1.0% | 30 nm | Zr/N/O/Hf = 77.1%/12.6%/9.3%/1.0% |
| Pig-4 | 2.0% | 34 nm | Zr/N/O/Hf = 76.7%/12.3%/9.0%/2.0% |
| Pig-5 | 3.0% | 35 nm | Zr/N/O/Hf = 76.5%/12.0%/8.5%/3.0% |
| Pig-6 | 0.2% | 33 nm | Zr/N/O/W = 77.4%/12.9%/9.5%/0.2% |
| Pig-7 | 0.5% | 35 nm | Zr/N/O/W = 77.3%/12.8%/9.4%/0.5% |
| Pig-8 | 1.0% | 34 nm | Zr/N/O/W = 77.1%/12.6%/9.3%/1.0% |
| Pig-9 | 2.0% | 34 nm | Zr/N/O/W = 76.7%/12.3%/9.0%/2.0% |
| Pig-10 | 3.0% | 35 nm | Zr/N/O/W = 76.5%/12.0%/8.5%/3.0% |
| Pig-11 | 2.0% | 34 nm | Zr/N/O/Hf = 76.7%/8.3%/13.0%/2.0% |
| Pig-12 | 2.0% | 34 nm | Zr/N/O/Hf = 76.7%/10.3%/11.0%/2.0% |
| Pig-13 | 2.0% | 34 nm | Zr/N/O/Hf = 76.7%/15.3%/6.0%/2.0% |
| Pig-14 | 2.0% | 34 nm | Zr/N/O/Hf = 76.7%/18.3%/3.0%/2.0% |
| Pig-15 | 2.0% | 34 nm | Zr/N/O/Hf = 76.7%/20.3%/1.0%/2.0% |
| Pig-16 | 2.0% | 34 nm | Zr/N/O/W = 76.7%/8.3%/13.0%/2.0% |
| Pig-17 | 2.0% | 34 nm | Zr/N/O/W = 76.7%/10.3%/11.0%/2.0% |
| Pig-18 | 2.0% | 34 nm | Zr/N/O/W = 76.7%/15.3%/6.0%/2.0% |
| Pig-19 | 2.0% | 34 nm | Zr/N/O/W = 76.7%/18.3%/3.0%/2.0% |
| Pig-20 | 2.0% | 34 nm | Zr/N/O/W = 76.7%/20.3%/1.0%/2.0% |
| Pig-21 | 2.0%/1.5% | 40 nm | Zr/N/O/Hf/W = 76.0%/12.0%/8.5%/2.0%/1.5% |
| Pig-22 | 2.0%/1.5% | 40 nm | Zr/N/O/Hf/Si = 76.0%/12.0%/8.5%/2.0%/1.5% |
| Pig-23 | 2.0%/1.5% | 40 nm | Zr/N/O/W/Si = 76.0%/12.0%/8.5%/2.0%/1.5% |
| Pig-24 | 2.0% | 15 nm | Zr/N/O/W = 76.7%/12.3%/9.0%/2.0% |
| Pig-25 | 2.0% | 25 nm | Zr/N/O/W = 76.7%/12.3%/9.0%/2.0% |
| Pig-26 | 2.0% | 55 nm | Zr/N/O/W = 76.7%/12.3%/9.0%/2.0% |
| Pig-27 | 2.0% | 65 nm | Zr/N/O/W = 76.7%/12.3%/9.0%/2.0% |
| Pig-28 | 2.0% | 85 nm | Zr/N/O/W = 76.7%/12.3%/9.0%/2.0% |
| Pig-29 | 2.0% | 31 nm | Nb/N/O/Hf = 76.7%/12.3%/9.0%/2.0% |
| Pig-30 | 2.0% | 33 nm | Nb/N/O/W= 76.7%/12.3%/9.0%2.0% |

TABLE 2-2

| | After plasma treatment (2) Light-shielding pigment | | |
|---|---|---|---|
| | Addition amount of atomized atom A | Average primary particle diameter | Element ratio |
| Pig-31 | 2.0%/1.5% | 41 nm | Nb/N/O/Hf/W = 76.0%/12.0%/8.5%/2.0%/1.5% |
| Pig-32 | 2.0%/1.5% | 40 nm | Nb/N/O/Hf/Si = 76.0%/12.0%/8.5%/2.0%/1.5% |
| Pig-33 | 2.0%/1.5% | 39 nm | Nb/N/O/W/Si = 76.0%/12.0%/8.5%/2.0%/1.5% |
| Pig-34 | 2.0% | 31 nm | V/N/O/Hf = 76.7%/12.3%/9.0%/2.0% |
| Pig-35 | 2.0% | 33 nm | V/N/O/W = 76.7%/12.3%/9.0%/2.0% |
| Pig-36 | 2.0%/1.5% | 41 nm | V/N/O/Hf/W = 76.0%/12.0%/8.5%/2.0%/1.5% |
| Pig-37 | 2.0%/1.5% | 40 nm | V/N/O/Hf/Si = 76.0%/12.0%/8.5%/2.0%/1.5% |
| Pig-38 | 2.0%/1.5% | 39 nm | V/N/O/W/Si = 76.0%/12.0%/8.5%/2.0%/1.5% |
| Pig-39 | 2.0% | 30 nm | Ta/N/O/Hf = 76.7%/12.3%/9.0%/2.0% |
| Pig-40 | 2.0% | 31 nm | Ta/N/O/W = 76.7%/12.3%/9.0%/2.0% |
| Pig-41 | 2.0% | 33 nm | Y/N/O/Hf = 76.7%/12.3%/9.0%/2.0% |
| Pig-42 | 2.0% | 30 nm | Y/N/O/W = 76.7%/12.3%/9.0%/2.0% |
| Pig-43 | 2.0% | 35 nm | Cr/N/O/Hf = 76.7%/12.3%/9.0%/2.0% |
| Pig-44 | 2.0% | 33 nm | Cr/N/O/W = 76.7%/12.3%/9.0%/2.0% |
| Pig-45 | 2.0% | 38 nm | Ti/N/O/W = 76.7%/12.3%/9.0%/2.0% |
| Pig-C1 | 2.0%/1.5% | 35 nm | Zr/N/O/Fe/Si = 76.0%/12.0%/8.5%/2.0%/1.5% |
| Pig-C2 | 2.0%/1.5% | 34 nm | Nb/N/O/Ni/Ag = 76.0%/12.0%/8.5%/2.0%/1.5% |
| Pig-C3 | 2.0%/1.5% | 31 nm | V/N/O/Al/Si = 76.0%/12.0%/8.5%/2.0%/1.5% |
| Pig-C4 | — | 33 nm | Zr/N/O = 77.5%/13.0%/9.5% |
| Pig-C5 | — | 38 nm | V/N/O = 77.5%/13.0%/9.5% |
| Pig-C6 | — | 18 nm | Al/N/O = 77.7%/13.3%/9.0% |
| Pig-C7 | — | 18 nm | Si/N/O = 75.7%/12.5%/11.8% |

<<<Preparation of Light-Shielding Resin Composition>>>

A light-shielding resin composition was prepared using raw materials shown below.

<Light-Shielding Pigment>

As a light-shielding pigment, Pig-1 to Pig-47 and Pig-C1 to Pig-C7 were used. Moreover, Pig-C1 to Pig-C7 were used in Comparative Examples.

<Dispersant>

As a dispersant, dispersants H-1 to H-4 having the following structures were used. A numerical value described in each structural unit means % by mole of each structural unit with respect to all structural units.

Furthermore, all of H-1 to H-4 correspond to resins which are graft polymers.

H-1 (acid value=100 mgKOH/g, and weight-average molecular weight=39,000)

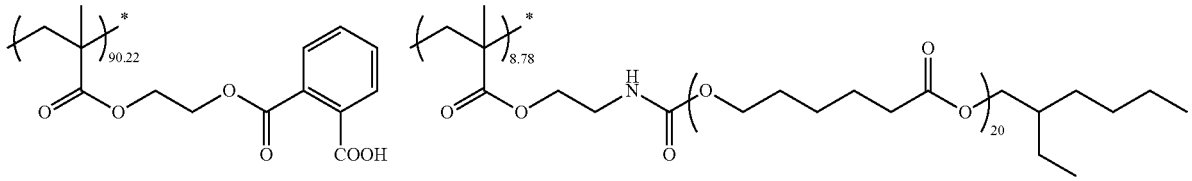

H-2 (acid value=60 mg KOH/g, and weight-average molecular weight=33,000)

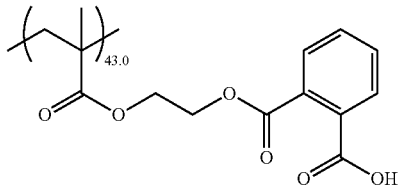

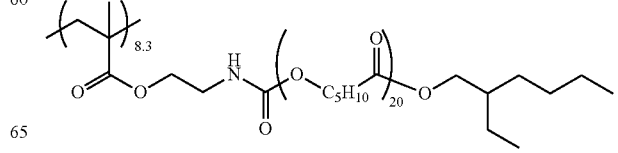

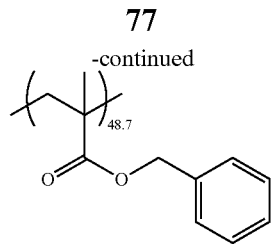

H-3 (acid value=100 mg KOH/g, and weight-average molecular weight=19,000)

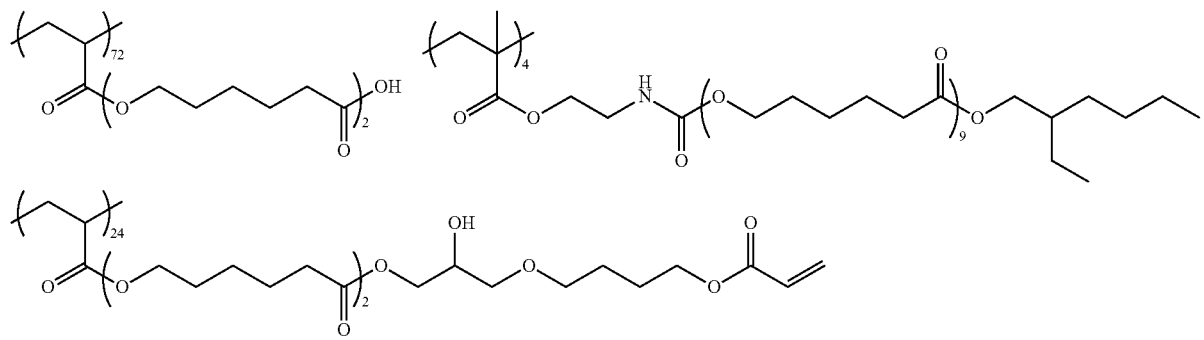

H-4 (acid value=33 mg KOH/g, and weight-average molecular weight=23,000)

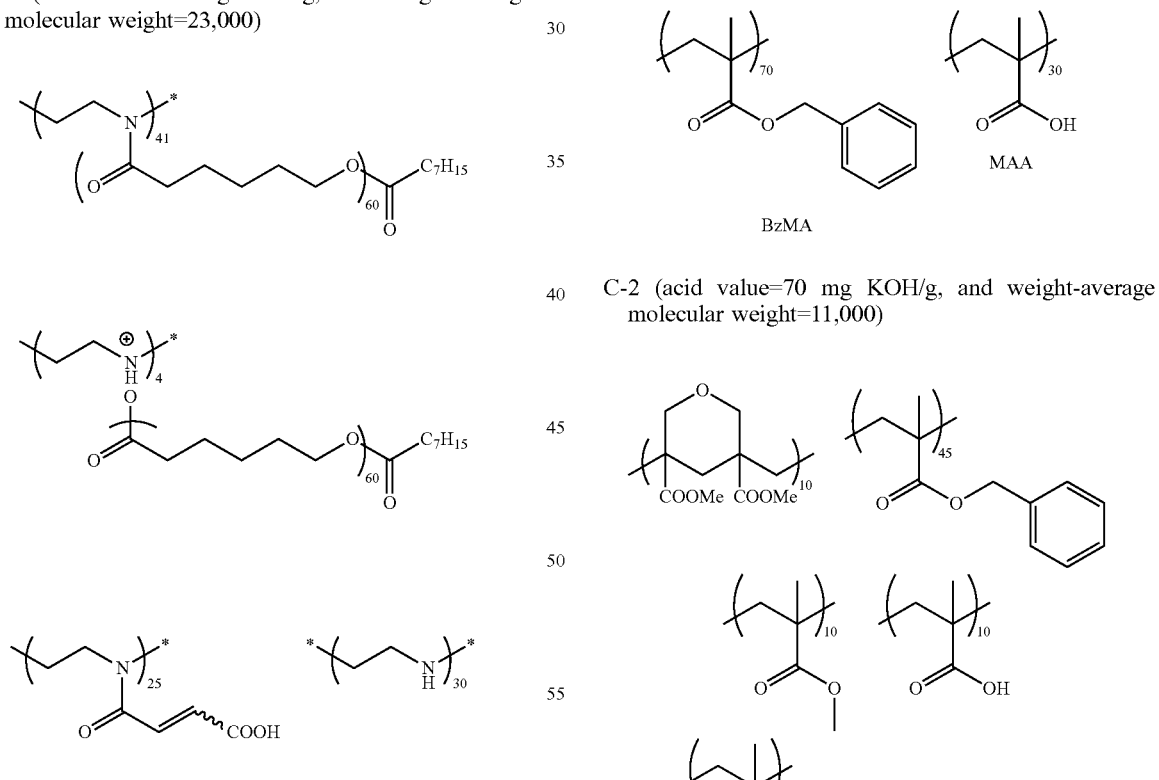

<Alkali-Soluble Resin>

As an alkali-soluble resin, the following resins C-1 and C-2 were used. The structures of the resins C-1 and C-2 are shown below. A numerical value described in each structural unit means % by mole of each structural unit with respect to all structural units.

C-1 (acid value=110 mg KOH/g, and weight-average molecular weight=33,000)

C-2 (acid value=70 mg KOH/g, and weight-average molecular weight=11,000)

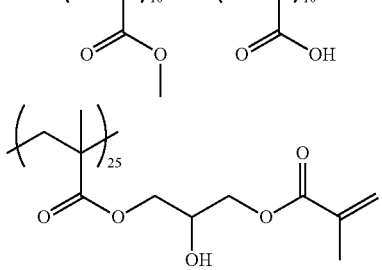

<Polymerizable Compound>

As a polymerizable compound, the following D-1 and D-2 were used.

D-1: KAYARAD DPHA (produced by Nippon Kayaku Co., Ltd.)

D-2: NK ESTER A-TMMT (produced by Shin-Nakamura Chemical Co., Ltd.)

D-1 is a compound containing four ethylenically unsaturated groups in one molecule, and D-2 is a mixture of a compound containing five ethylenically unsaturated groups in one molecule and a compound containing six ethylenically unsaturated groups in one molecule.

<Polymerization Initiator (Photopolymerization Initiator)>

As a polymerization initiator (photopolymerization initiator), the following E-1 to E-4 were used.

E-1: IRGACURE OXE02 (oxime compound) (produced by BASF SE)

E-2: IRGACURE OXE03 (oxime compound represented by General Formula (C-13)) (produced by BASF SE)

E-3: IRGACURE 369 (produced by BASF SE)

E-4: IRGACURE 379 (produced by BASF SE)

<Surfactant>

As another component, the following compound (weight-average molecular weight=15,000) was used.

Here, in the following formula, contents of a left structural unit and a right structural unit are 62% by mass and 38% by mass, respectively.

38%
62%
L1 + N1 + L2 + N2 = 14
M1 + M2 = 17

<Solvent>

PGMEA: Propylene glycol monomethyl ether acetate

PGME: Propylene glycol monomethyl ether

Butyl acetate

Cyclopentanone

<Other Components>

As other components, the following G-1 to G-4 were used.

G-1: EHPE 3150 (produced by DAICEL CORPORATION) (epoxy group-containing compound)

G-2: EPICLON N-695 (produced by DIC CORPORATION) (epoxy group-containingcompound)

G-3: The following compound (ultraviolet absorber (diethylamino-phenylsulfonyl-based ultraviolet absorber))

G-4: The following compound (adhesive agent)

[Preparation of Light-Shielding Pigment Dispersion Liquid]

First, a light-shielding pigment, a dispersant, and an organic solvent were mixed for 15 minutes by a stirrer (EUROSTAR manufactured by IKA Works GmbH & Co. KG) to obtain a mixed solution of the aforementioned components. Subsequently, the obtained mixed solution was subjected to a dispersion treatment using NPM-Pilot manufactured by Shinmaru Enterprises Corporation under the following conditions to obtain a pigment dispersion liquid (light-shielding pigment dispersion liquid).

<Dispersion Conditions>

Bead size: ϕ0.05 mm, (zirconia beads manufactured by NIKKATO CORPORATION, YTZ)

Bead filling rate: 65% by volume

Circumferential speed of mill: 10 m/sec

Circumferential speed of separator: 13 m/s

Amount of mixed solution subjected to dispersion treatment: 15 kg

Circulation flow rate (pump supply rate): 90 kg/hour

Temperature of treatment liquid: 19° C. to 21° C.

Coolant: water

Treatment time: about 22 hours

The compositions of the pigment dispersion liquids are shown in the tables below.

TABLE 3-1

|  | Light-shielding pigment | | Dispersant | | Solvent | |
| --- | --- | --- | --- | --- | --- | --- |
|  | Type | Addition amount (parts by mass) | Type | Addition amount (parts by mass) | Type | Addition amount (parts by mass) |
| Dispersion liquid 1 | Pig-9 | 24.2 | H-1 | 7.3 | PGMEA | 68.5 |
| Dispersion liquid 2 | Pig-9 | 24.2 | H-2 | 7.3 | PGMEA | 68.5 |
| Dispersion liquid 3 | Pig-9 | 24.2 | H-3 | 7.3 | PGMEA | 68.5 |
| Dispersion liquid 4 | Pig-9 | 24.2 | H-4 | 7.3 | PGMEA | 68.5 |
| Dispersion liquid 5 | Pig-1 | 24.2 | H-3 | 7.3 | PGMEA | 68.5 |
| Dispersion liquid 6 | Pig-2 | 24.2 | H-3 | 7.3 | PGMEA | 68.5 |
| Dispersion liquid 7 | Pig-3 | 24.2 | H-3 | 7.3 | PGMEA | 68.5 |
| Dispersion liquid 8 | Pig-4 | 24.2 | H-3 | 7.3 | PGMEA | 68.5 |
| Dispersion liquid 9 | Pig-5 | 24.2 | H-3 | 7.3 | PGMEA | 68.5 |
| Dispersion liquid 10 | Pig-6 | 24.2 | H-3 | 7.3 | PGMEA | 68.5 |
| Dispersion liquid 11 | Pig-7 | 24.2 | H-3 | 7.3 | PGMEA | 68.5 |
| Dispersion liquid 12 | Pig-8 | 24.2 | H-3 | 7.3 | PGMEA | 68.5 |
| Dispersion liquid 13 | Pig-10 | 24.2 | H-3 | 7.3 | PGMEA | 68.5 |
| Dispersion liquid 14 | Pig-11 | 24.2 | H-3 | 7.3 | PGMEA | 68.5 |
| Dispersion liquid 15 | Pig-12 | 24.2 | H-3 | 7.3 | PGMEA | 68.5 |
| Dispersion liquid 16 | Pig-13 | 24.2 | H-3 | 7.3 | PGMEA | 68.5 |
| Dispersion liquid 17 | Pig-14 | 24.2 | H-3 | 7.3 | PGMEA | 68.5 |
| Dispersion liquid 18 | Pig-15 | 24.2 | H-3 | 7.3 | PGMEA | 68.5 |
| Dispersion liquid 19 | Pig-16 | 24.2 | H-3 | 7.3 | PGMEA | 68.5 |
| Dispersion liquid 20 | Pig-17 | 24.2 | H-3 | 7.3 | PGMEA | 68.5 |
| Dispersion liquid 21 | Pig-18 | 24.2 | H-3 | 7.3 | PGMEA | 68.5 |
| Dispersion liquid 22 | Pig-19 | 24.2 | H-3 | 7.3 | PGMEA | 68.5 |
| Dispersion liquid 23 | Pig-20 | 24.2 | H-3 | 7.3 | PGMEA | 68.5 |
| Dispersion liquid 24 | Pig-21 | 24.2 | H-3 | 7.3 | PGMEA | 68.5 |
| Dispersion liquid 25 | Pig-22 | 24.2 | H-3 | 7.3 | PGMEA | 68.5 |
| Dispersion liquid 26 | Pig-23 | 24.2 | H-3 | 7.3 | PGMEA | 68.5 |
| Dispersion liquid 27 | Pig-24 | 24.2 | H-3 | 7.3 | PGMEA | 68.5 |
| Dispersion liquid 28 | Pig-25 | 24.2 | H-3 | 7.3 | PGMEA | 68.5 |
| Dispersion liquid 29 | Pig-26 | 24.2 | H-3 | 7.3 | PGMEA | 68.5 |
| Dispersion liquid 30 | Pig-27 | 24.2 | H-3 | 7.3 | PGMEA | 68.5 |

TABLE 3-2

|  | Light-shielding pigment | | Dispersant | | Solvent | |
| --- | --- | --- | --- | --- | --- | --- |
|  | Type | Addition amount (parts by mass) | Type | Addition amount (parts by mass) | Type | Addition amount (parts by mass) |
| Dispersion liquid 31 | Pig-28 | 24.2 | H-3 | 7.3 | PGMEA | 68.5 |
| Dispersion liquid 32 | Pig-29 | 24.2 | H-3 | 7.3 | PGMEA | 68.5 |
| Dispersion liquid 33 | Pig-30 | 24.2 | H-3 | 7.3 | PGMEA | 68.5 |
| Dispersion liquid 34 | Pig-31 | 24.2 | H-3 | 7.3 | PGMEA | 68.5 |
| Dispersion liquid 35 | Pig-32 | 24.2 | H-3 | 7.3 | PGMEA | 68.5 |
| Dispersion liquid 36 | Pig-33 | 24.2 | H-3 | 7.3 | PGMEA | 68.5 |
| Dispersion liquid 37 | Pig-34 | 24.2 | H-3 | 7.3 | PGMEA | 68.5 |
| Dispersion liquid 38 | Pig-35 | 24.2 | H-3 | 7.3 | PGMEA | 68.5 |
| Dispersion liquid 39 | Pig-36 | 24.2 | H-3 | 7.3 | PGMEA | 68.5 |
| Dispersion liquid 40 | Pig-37 | 24.2 | H-3 | 7.3 | PGMEA | 68.5 |
| Dispersion liquid 41 | Pig-38 | 24.2 | H-3 | 7.3 | PGMEA | 68.5 |
| Dispersion liquid 42 | Pig-39 | 24.2 | H-3 | 7.3 | PGMEA | 68.5 |
| Dispersion liquid 43 | Pig-40 | 24.2 | H-3 | 7.3 | PGMEA | 68.5 |
| Dispersion liquid 44 | Pig-41 | 24.2 | H-3 | 7.3 | PGMEA | 68.5 |
| Dispersion liquid 45 | Pig-42 | 24.2 | H-3 | 7.3 | PGMEA | 68.5 |
| Dispersion liquid 46 | Pig-43 | 24.2 | H-3 | 7.3 | PGMEA | 68.5 |
| Dispersion liquid 47 | Pig-44 | 24.2 | H-3 | 7.3 | PGMEA | 68.5 |
| Dispersion liquid 48 | Pig-9 | 24.2 | H-3 | 7.3 | PGMEA | 48.5 |
|  |  |  |  |  | PGME | 20.0 |
| Dispersion liquid 49 | Pig-9 | 24.2 | H-3 | 7.3 | PGMEA | 38.5 |
|  |  |  |  |  | PGME | 20.0 |
|  |  |  |  |  | Butyl acetate | 10.0 |
| Dispersion liquid 50 | Pig-9 | 24.2 | H-3 | 7.3 | Cyclopentanone | 48.5 |
|  |  |  |  |  | PGME | 20.0 |
| Dispersion liquid 51 | Pig-45 | 24.2 | H-3 | 7.3 | PGMEA | 68.5 |
| Comparative dispersion liquid 1 | Pig-C1 | 24.2 | H-3 | 7.3 | PGMEA | 68.5 |
| Comparative dispersion liquid 2 | Pig-C2 | 24.2 | H-3 | 7.3 | PGMEA | 68.5 |
| Comparative dispersion liquid 3 | Pig-C3 | 24.2 | H-3 | 7.3 | PGMEA | 68.5 |
| Comparative dispersion liquid 4 | Pig-C4 | 24.2 | H-3 | 7.3 | PGMEA | 68.5 |

TABLE 3-2-continued

|  | Light-shielding pigment | | Dispersant | | Solvent | |
| --- | --- | --- | --- | --- | --- | --- |
|  | Type | Addition amount (parts by mass) | Type | Addition amount (parts by mass) | Type | Addition amount (parts by mass) |
| Comparative dispersion liquid 5 | Pig-C5 | 24.2 | H-3 | 7.3 | PGMEA | 68.5 |
| Comparative dispersion liquid 6 | Pig-C6 | 24.2 | H-3 | 7.3 | PGMEA | 68.5 |
| Comparative dispersion liquid 7 | Pig-C7 | 24.2 | H-3 | 7.3 | PGMEA | 68.5 |

[Preparation of Composition]

Next components shown in Tables 4-1 and 4-2 below were mixed with the pigment dispersion liquids at ratios shown in Tables 4-1 and 4-2 to obtain compositions of Examples and Comparative Examples.

The compositions of the obtained compositions are shown in Tables 4-1 and 4-2.

TABLE 4-1

|  | Pigment dispersion liquid | | Alkali-soluble resin | | Polymerizable compound | | Photopolymerization initiator | |
| --- | --- | --- | --- | --- | --- | --- | --- | --- |
|  | Type | parts by mass | Type | parts by mass | Type | parts by mass | Type | parts by mass |
| Example Composition 1 | Dispersion liquid 3 | 54.1 | C-1 | 2.5 | D-1 | 5.2 | E-1 | 1.5 |
| Example Composition 2 | Dispersion liquid 3 | 54.1 | C-2 | 2.5 | D-1 | 5.2 | E-1 | 1.5 |
| Example Composition 3 | Dispersion liquid 3 | 54.1 | C-2 | 2.5 | D-2 | 5.2 | E-1 | 1.5 |
| Example Composition 4 | Dispersion liquid 3 | 54.1 | C-2 | 2.5 | D-2 | 5.2 | E-2 | 1.5 |
| Example Composition 5 | Dispersion liquid 3 | 54.1 | C-2 | 2.5 | D-2 | 5.2 | E-3 | 1.5 |
| Example Composition 6 | Dispersion liquid 3 | 54.1 | C-2 | 2.5 | D-2 | 5.2 | E-4 | 1.5 |
| Example Composition 7 | Dispersion liquid 3 | 54.1 | C-2 | 2.5 | D-2 | 5.2 | E-1 | 1.5 |
| Example Composition 8 | Dispersion liquid 3 | 54.1 | C-2 | 2.5 | D-2 | 5.2 | E-1 | 1.5 |
| Example Composition 9 | Dispersion liquid 3 | 54.1 | C-2 | 2.5 | D-2 | 5.2 | E-1 | 1.5 |
| Example Composition 10 | Dispersion liquid 3 | 54.1 | C-2 | 2.5 | D-2 | 5.2 | E-1 | 1.5 |
| Example Composition 11 | Dispersion liquid 3 | 54.1 | C-1 C-2 | 1.0 1.5 | D-1 D-2 | 2.0 3.2 | E-1 E-4 | 1.3 0.2 |
| Example Composition 12 | Dispersion liquid 1 | 54.1 | C-2 | 2.5 | D-2 | 5.2 | E-2 | 1.5 |
| Example Composition 13 | Dispersion liquid 2 | 54.1 | C-2 | 2.5 | D-2 | 5.2 | E-2 | 1.5 |
| Example Composition 14 | Dispersion liquid 4 | 54.1 | C-2 | 2.5 | D-2 | 5.2 | E-2 | 1.5 |
| Example Composition 15 | Dispersion liquid 5 | 54.1 | C-2 | 2.5 | D-2 | 5.2 | E-2 | 1.5 |
| Example Composition 16 | Dispersion liquid 6 | 54.1 | C-2 | 2.5 | D-2 | 5.2 | E-2 | 1.5 |
| Example Composition 17 | Dispersion liquid 7 | 54.1 | C-2 | 2.5 | D-2 | 5.2 | E-2 | 1.5 |
| Example Composition 18 | Dispersion liquid 8 | 54.1 | C-2 | 2.5 | D-2 | 5.2 | E-2 | 1.5 |
| Example Composition 19 | Dispersion liquid 9 | 54.1 | C-2 | 2.5 | D-2 | 5.2 | E-2 | 1.5 |
| Example Composition 20 | Dispersion liquid 10 | 54.1 | C-2 | 2.5 | D-2 | 5.2 | E-2 | 1.5 |
| Example Composition 21 | Dispersion liquid 11 | 54.1 | C-2 | 2.5 | D-2 | 5.2 | E-2 | 1.5 |
| Example Composition 22 | Dispersion liquid 12 | 54.1 | C-2 | 2.5 | D-2 | 5.2 | E-2 | 1.5 |
| Example Composition 23 | Dispersion liquid 13 | 54.1 | C-2 | 2.5 | D-2 | 5.2 | E-2 | 1.5 |
| Example Composition 24 | Dispersion liquid 14 | 54.1 | C-2 | 2.5 | D-2 | 5.2 | E-2 | 1.5 |

TABLE 4-1-continued

| | | | | | | | | |
|---|---|---|---|---|---|---|---|---|
| Example Composition 25 | Dispersion liquid 15 | 54.1 | C-2 | 2.5 | D-2 | 5.2 | E-2 | 1.5 |
| Example Composition 26 | Dispersion liquid 16 | 54.1 | C-2 | 2.5 | D-2 | 5.2 | E-2 | 1.5 |
| Example Composition 27 | Dispersion liquid 17 | 54.1 | C-2 | 2.5 | D-2 | 5.2 | E-2 | 1.5 |
| Example Composition 28 | Dispersion liquid 18 | 54.1 | C-2 | 2.5 | D-2 | 5.2 | E-2 | 1.5 |
| Example Composition 29 | Dispersion liquid 19 | 54.1 | C-2 | 2.5 | D-2 | 5.2 | E-2 | 1.5 |
| Example Composition 30 | Dispersion liquid 20 | 54.1 | C-2 | 2.5 | D-2 | 5.2 | E-2 | 1.5 |
| Example Composition 31 | Dispersion liquid 21 | 54.1 | C-2 | 2.5 | D-2 | 5.2 | E-2 | 1.5 |
| Example Composition 32 | Dispersion liquid 22 | 54.1 | C-2 | 2.5 | D-2 | 5.2 | E-2 | 1.5 |
| Example Composition 33 | Dispersion liquid 23 | 54.1 | C-2 | 2.5 | D-2 | 5.2 | E-2 | 1.5 |
| Example Composition 34 | Dispersion liquid 24 | 54.1 | C-2 | 2.5 | D-2 | 5.2 | E-2 | 1.5 |
| Example Composition 35 | Dispersion liquid 25 | 54.1 | C-2 | 2.5 | D-2 | 5.2 | E-2 | 1.5 |

| | Solvent | | Other components | | Surfactant | |
|---|---|---|---|---|---|---|
| | Type | parts by mass | Type | parts by mass | Type | parts by mass |
| Example Composition 1 | PGMEA | 36.7 | | | W-1 | 0.01 |
| Example Composition 2 | PGMEA | 36.7 | | | W-1 | 0.01 |
| Example Composition 3 | PGMEA | 36.7 | | | W-1 | 0.01 |
| Example Composition 4 | PGMEA | 36.7 | | | W-1 | 0.01 |
| Example Composition 5 | PGMEA | 36.7 | | | W-1 | 0.01 |
| Example Composition 6 | PGMEA | 36.7 | | | W-1 | 0.01 |
| Example Composition 7 | PGMEA | 36.2 | G-1 | 0.5 | W-1 | 0.01 |
| Example Composition 8 | PGMEA | 36.2 | G-2 | 0.5 | W-1 | 0.01 |
| Example Composition 9 | PGMEA | 36.4 | G-3 | 0.3 | W-1 | 0.01 |
| Example Composition 10 | PGMEA | 36.2 | G4 | 0.5 | W-1 | 0.01 |
| Example Composition 11 | PGMEA / Cyclopentanone | 10.7 / 26.0 | | | W-1 | 0.01 |
| Example Composition 12 | PGMEA | 36.7 | | | W-1 | 0.01 |
| Example Composition 13 | PGMEA | 36.7 | | | W-1 | 0.01 |
| Example Composition 14 | PGMEA | 36.7 | | | W-1 | 0.01 |
| Example Composition 15 | PGMEA | 36.7 | | | W-1 | 0.01 |
| Example Composition 16 | PGMEA | 36.7 | | | W-1 | 0.01 |
| Example Composition 17 | PGMEA | 36.7 | | | W-1 | 0.01 |
| Example Composition 18 | PGMEA | 36.7 | | | W-1 | 0.01 |
| Example Composition 19 | PGMEA | 36.7 | | | W-1 | 0.01 |
| Example Composition 20 | PGMEA | 36.7 | | | W-1 | 0.01 |
| Example Composition 21 | PGMEA | 36.7 | | | W-1 | 0.01 |
| Example Composition 22 | PGMEA | 36.7 | | | W-1 | 0.01 |
| Example Composition 23 | PGMEA | 36.7 | | | W-1 | 0.01 |
| Example Composition 24 | PGMEA | 36.7 | | | W-1 | 0.01 |
| Example Composition 25 | PGMEA | 36.7 | | | W-1 | 0.01 |
| Example Composition 26 | PGMEA | 36.7 | | | W-1 | 0.01 |

TABLE 4-1-continued

| | | | | | |
|---|---|---|---|---|---|
| Example Composition 27 | PGMEA | 36.7 | | W-1 | 0.01 |
| Example Composition 28 | PGMEA | 36.7 | | W-1 | 0.01 |
| Example Composition 29 | PGMEA | 36.7 | | W-1 | 0.01 |
| Example Composition 30 | PGMEA | 36.7 | | W-1 | 0.01 |
| Example Composition 31 | PGMEA | 36.7 | | W-1 | 0.01 |
| Example Composition 32 | PGMEA | 36.7 | | W-1 | 0.01 |
| Example Composition 33 | PGMEA | 36.7 | | W-1 | 0.01 |
| Example Composition 34 | PGMEA | 36.7 | | W-1 | 0.01 |
| Example Composition 35 | PGMEA | 36.7 | | W-1 | 0.01 |

TABLE 4-2

| | Pigment dispersion liquid | | Alkali-soluble resin | | Polymerizable compound | | Photopolymerization initiator | |
|---|---|---|---|---|---|---|---|---|
| | Type | parts by mass | Type | parts by mass | Type | parts by mass | Type | parts by mass |
| Example Composition 36 | Dispersion liquid 26 | 54.1 | C-2 | 2.5 | D-2 | 5.2 | E-2 | 1.5 |
| Example Composition 37 | Dispersion liquid 27 | 54.1 | C-2 | 2.5 | D-2 | 5.2 | E-2 | 1.5 |
| Example Composition 38 | Dispersion liquid 28 | 54.1 | C-2 | 2.5 | D-2 | 5.2 | E-2 | 1.5 |
| Example Composition 39 | Dispersion liquid 29 | 54.1 | C-2 | 2.5 | D-2 | 5.2 | E-2 | 1.5 |
| Example Composition 40 | Dispersion liquid 30 | 54.1 | C-2 | 2.5 | D-2 | 5.2 | E-2 | 1.5 |
| Example Composition 41 | Dispersion liquid 31 | 54.1 | C-2 | 2.5 | D-2 | 5.2 | E-2 | 1.5 |
| Example Composition 42 | Dispersion liquid 32 | 54.1 | C-2 | 2.5 | D-2 | 5.2 | E-2 | 1.5 |
| Example Composition 43 | Dispersion liquid 33 | 54.1 | C-2 | 2.5 | D-2 | 5.2 | E-2 | 1.5 |
| Example Composition 44 | Dispersion liquid 34 | 54.1 | C-2 | 2.5 | D-2 | 5.2 | E-2 | 1.5 |
| Example Composition 45 | Dispersion liquid 35 | 54.1 | C-2 | 2.5 | D-2 | 5.2 | E-2 | 1.5 |
| Example Composition 46 | Dispersion liquid 36 | 54.1 | C-2 | 2.5 | D-2 | 5.2 | E-2 | 1.5 |
| Example Composition 47 | Dispersion liquid 37 | 54.1 | C-2 | 2.5 | D-2 | 5.2 | E-2 | 1.5 |
| Example Composition 48 | Dispersion liquid 38 | 54.1 | C-2 | 2.5 | D-2 | 5.2 | E-2 | 1.5 |
| Example Composition 49 | Dispersion liquid 39 | 54.1 | C-2 | 2.5 | D-2 | 5.2 | E-2 | 1.5 |
| Example Composition 50 | Dispersion liquid 40 | 54.1 | C-2 | 2.5 | D-2 | 5.2 | E-2 | 1.5 |
| Example Composition 51 | Dispersion liquid 41 | 54.1 | C-2 | 2.5 | D-2 | 5.2 | E-2 | 1.5 |
| Example Composition 52 | Dispersion liquid 42 | 54.1 | C-2 | 2.5 | D-2 | 5.2 | E-2 | 1.5 |
| Example Composition 53 | Dispersion liquid 43 | 54.1 | C-2 | 2.5 | D-2 | 5.2 | E-2 | 1.5 |
| Example Composition 54 | Dispersion liquid 44 | 54.1 | C-2 | 2.5 | D-2 | 5.2 | E-2 | 1.5 |
| Example Composition 55 | Dispersion liquid 45 | 54.1 | C-2 | 2.5 | D-2 | 5.2 | E-2 | 1.5 |
| Example Composition 56 | Dispersion liquid 46 | 54.1 | C-2 | 2.5 | D-2 | 5.2 | E-2 | 1.5 |
| Example Composition 57 | Dispersion liquid 47 | 54.1 | C-2 | 2.5 | D-2 | 5.2 | E-2 | 1.5 |
| Example Composition 58 | Dispersion liquid 48 | 54.1 | C-2 | 2.5 | D-2 | 5.2 | E-2 | 1.5 |
| Example Composition 59 | Dispersion liquid 49 | 54.1 | C-2 | 2.5 | D-2 | 5.2 | E-2 | 1.5 |
| Example Composition 60 | Dispersion liquid 50 | 54.1 | C-2 | 2.5 | D-2 | 5.2 | E-2 | 1.5 |

TABLE 4-2-continued

| | | | | | | | | | |
|---|---|---|---|---|---|---|---|---|---|
| Example Composition 61 | Dispersion liquid 51 | 54.1 | C-2 | 2.5 | D-2 | 5.2 | E-2 | 1.5 |
| Comparative Composition 1 | Comparative dispersion liquid 1 | 54.1 | C-2 | 2.5 | D-2 | 5.2 | E-2 | 1.5 |
| Comparative Composition 2 | Comparative dispersion liquid 2 | 54.1 | C-2 | 2.5 | D-2 | 5.2 | E-2 | 1.5 |
| Comparative Composition 3 | Comparative dispersion liquid 3 | 54.1 | C-2 | 2.5 | D-2 | 5.2 | E-2 | 1.5 |
| Comparative Composition 4 | Comparative dispersion liquid 4 | 54.1 | C-2 | 2.5 | D-2 | 5.2 | E-2 | 1.5 |
| Comparative Composition 5 | Comparative dispersion liquid 5 | 54.1 | C-2 | 2.5 | D-2 | 5.2 | E-2 | 1.5 |
| Comparative Composition 6 | Comparative dispersion liquid 6 | 54.1 | C-2 | 2.5 | D-2 | 5.2 | E-2 | 1.5 |
| Comparative Composition 7 | Comparative dispersion liquid 7 | 54.1 | C-2 | 2.5 | D-2 | 5.2 | E-2 | 1.5 |

| | Solvent | | Other components | | Surfactant | |
|---|---|---|---|---|---|---|
| | Type | parts by mass | Type | parts by mass | Type | parts by mass |
| Example Composition 36 | PGMEA | 36.7 | | | W-1 | 0.01 |
| Example Composition 37 | PGMEA | 36.7 | | | W-1 | 0.01 |
| Example Composition 38 | PGMEA | 36.7 | | | W-1 | 0.01 |
| Example Composition 39 | PGMEA | 36.7 | | | W-1 | 0.01 |
| Example Composition 40 | PGMEA | 36.7 | | | W-1 | 0.01 |
| Example Composition 41 | PGMEA | 36.7 | | | W-1 | 0.01 |
| Example Composition 42 | PGMEA | 36.7 | | | W-1 | 0.01 |
| Example Composition 43 | PGMEA | 36.7 | | | W-1 | 0.01 |
| Example Composition 44 | PGMEA | 36.7 | | | W-1 | 0.01 |
| Example Composition 45 | PGMEA | 36.7 | | | W-1 | 0.01 |
| Example Composition 46 | PGMEA | 36.7 | | | W-1 | 0.01 |
| Example Composition 47 | PGMEA | 36.7 | | | W-1 | 0.01 |
| Example Composition 48 | PGMEA | 36.7 | | | W-1 | 0.01 |
| Example Composition 49 | PGMEA | 36.7 | | | W-1 | 0.01 |
| Example Composition 50 | PGMEA | 36.7 | | | W-1 | 0.01 |
| Example Composition 51 | PGMEA | 36.7 | | | W-1 | 0.01 |
| Example Composition 52 | PGMEA | 36.7 | | | W-1 | 0.01 |
| Example Composition 53 | PGMEA | 36.7 | | | W-1 | 0.01 |
| Example Composition 54 | PGMEA | 36.7 | | | W-1 | 0.01 |
| Example Composition 55 | PGMEA | 36.7 | | | W-1 | 0.01 |
| Example Composition 56 | PGMEA | 36.7 | | | W-1 | 0.01 |
| Example Composition 57 | PGMEA | 36.7 | | | W-1 | 0.01 |
| Example Composition 58 | PGMEA | 36.7 | | | W-1 | 0.01 |
| Example Composition 59 | PGMEA | 36.7 | | | W-1 | 0.01 |
| Example Composition 60 | PGMEA | 36.7 | | | W-1 | 0.01 |
| Example | PGMEA | 36.7 | | | W-1 | 0.01 |

TABLE 4-2-continued

| | | | | | |
|---|---|---|---|---|---|
| Composition 61 Comparative Composition 1 | PGMEA | 36.7 | | W-1 | 0.01 |
| Comparative Composition 2 | PGMEA | 36.7 | | W-1 | 0.01 |
| Comparative Composition 3 | PGMEA | 36.7 | | W-1 | 0.01 |
| Comparative Composition 4 | PGMEA | 36.7 | | W-1 | 0.01 |
| Comparative Composition 5 | PGMEA | 36.7 | | W-1 | 0.01 |
| Comparative Composition 6 | PGMEA | 36.7 | | W-1 | 0.01 |
| Comparative Composition 7 | PGMEA | 36.7 | | W-1 | 0.01 |

In addition, concentrations of solid contents of Example Compositions 7 to 10 were 26.7% by mass, 26.7% by mass, 26.5% by mass, and 26.7% by mass in numerical order, and concentrations of solid contents of other compositions were all 26.2% by mass.

Furthermore, a ratio (content mass of resin as graft polymer/content mass of light-shielding pigment) of a content mass of the resin as a graft polymer to a content mass of the light-shielding pigment in each composition was 0.30 in all the compositions.

<<Evaluation>>

The obtained compositions were used for the following tests and evaluations.

[Test Method]

[Light-Shielding Properties (OD Value)]

A coating film was formed on a glass plate (Eagle XG, manufactured by Corning Incorporated) having a thickness of 0.7 mm and 10 cm square through spin coating by using the compositions of Examples and Comparative Examples obtained above and adjusting the rotation speed so that the film thickness was 1.5 μm. The formed coating film was dried on a hot plate by a heat treatment at 100° C. for 2 minutes to obtain a cured film. Regarding the substrate containing the obtained cured film, the OD value for light having a wavelength of 400 to 1,000 nm was measured with a spectrophotometer U-4100 (manufactured by Hitachi High-Technologies Corporation). As the OD value is higher, the cured film has superior light-shielding properties. The evaluation was performed according to the following determination standards.

In the following determination standards, A to C are levels which are unproblematic for practical use.
  A: The minimum OD value at 400 to 1,000 nm was equal to or higher than 4.0
  B: The minimum OD value at 400 to 1,000 nm was equal to or higher than 3.0 and less than 4.0
  C: The minimum OD value at 400 to 1,000 nm was equal to or higher than 2.5 and less than 3.0
  D: The minimum OD value at 400 to 1,000 nm was less than 2.5

[Viscosity Stability Overtime]

The change in viscosity of the composition obtained above after 1 year lapsed in an environment of a temperature of 7° C. was evaluated.

The viscosity was measured with a standard cone rotor (1° 34'×R24) and E-type rotational viscometer RE85L manufactured by TOKI SANGYO CO., LTD. by setting a rotation speed to 50 rpm and adjusting the temperature of a sample cup to 23±0.2° C. The evaluation was performed according to the following determination standards.

The change in viscosity is determined based on the following expression.

Change in viscosity (%)=(|viscosity before lapse of time (mPa·s)−viscosity after lapse of time (mPa·s|))/viscosity before lapse of time (mPa·s)×100

In the following determination standards, A to D are levels which are unproblematic for practical use.
  A: The change in viscosity before and after the lapse of time was equal to or greater than 0.0% and less than 3.0%
  B: The change in viscosity before and after the lapse of time was equal to or greater than 3.0% and less than 5.0%
  C: The change in viscosity before and after the lapse of time was equal to or greater than 5.0% and less than 10.0%
  D: The change in viscosity before and after the lapse of time was equal to or greater than 10.0% and less than 15.0%
  E: The change in viscosity before and after the lapse of time was equal to or greater than 15.0%

[Precipitation Stability Over Time]

Volatile components in each composition obtained above were dried using an oven under conditions of 160° C. and 1 hour. The drying loss before and after drying was measured to determine a volatilization amount, and a difference between the mass of each composition before drying and the volatilization amount was calculated to calculate a "solid content before precipitation over time".

Furthermore, for a supernatant obtained after storing the obtained composition at room temperature in a constant temperature and humidity room with a temperature of 23° C. and a humidity of 50% for 3 months, a "solid content after precipitation over time" was calculated in the same manner as above.

A difference between the "solid content after precipitation over time" and the "solid content before precipitation over time" was divided by the "solid content before precipitation over time", and a solid content precipitation rate was calculated as a percentage, classified as follows, and used as a test for liquid temporal stability.

In the following determination standards, A to D are levels which are unproblematic for practical use.
  A: The solid content precipitation rate was less than 2% by mass
  B: The solid content precipitation rate was equal to or greater than 2% by mass and less than 5% by mass
  C: The solid content precipitation rate was equal to or greater than 5% by mass and less than 10% by mass D: The solid content precipitation rate was equal to or greater than 10% by mass and less than 15% by mass E: The solid content precipitation rate was equal to or greater than 15% by mass

[Solvent Resistance]

Each composition obtained above was applied onto an 8-inch glass wafer with an undercoat layer using a spin coater so that the film thickness after drying was 1.5 µm, and subjected to a heating treatment (pre-baking) for 120 seconds using a hot plate at 110° C.

Next, using an i-line stepper exposure device FPA-3000i5+(manufactured by Canon Inc.), the resultant was exposed to light having a wavelength of 365 nm at 1,000 mJ/cm$^2$ through a mask having a pattern of 2 cm×2 cm.

Thereafter, the glass wafer on which the exposed coating film was formed was placed on a horizontal rotary table of a spin shower developing machine (DW-30 type, manufactured by Chemitronics Co., Ltd.), and subjected to puddle development at 23° C. for 60 seconds using an aqueous solution of 0.3% tetramethylammonium hydroxide (TMAH), thereby forming a pattern (pattern-like cured film) of 2 cm×2 cm on the glass wafer.

The glass wafer on which a pattern of 2 cm×2 cm was formed was fixed to the horizontal rotary table by a vacuum chuck method, subjected to a rinse treatment by supplying pure water in a form of a shower from a spray nozzle from above the rotation center while rotating the glass wafer at a rotation speed of 50 rpm by a rotation device, and then spray-dried. Then, a heating treatment (post-baking) was performed for 5 minutes using a hot plate at 220° C.

The OD value at a wavelength of 400 to 1,000 nm was measured with the spectrophotometer U-4100 (manufactured by Hitachi High-Technologies Corporation), after the production of the pattern of 2 cm×2 cm formed above and after immersing the pattern in cyclohexanone for 15 minutes, respectively.

The change in the OD values before and after the immersion was examined, and solvent resistance was evaluated based on a change rate at a wavelength showing the maximum change rate.

A change rate for light having each wavelength is determined based on the following expression.

Change rate (%)=(|OD value before immersion−OD value after immersion|)/OD value before immersion×100

In the following determination standards, A to C are levels which are unproblematic for practical use.

A: The change rate was equal to or greater than 0% and less than 3%

B: The change rate was equal to or greater than 3% and less than 5%

C: The change rate was equal to or greater than 5% and less than 10%

D: The change rate was equal to or greater than 10%

[Undercut Resistance]

The composition obtained above was applied onto an 8-inch silicon wafer with an undercoat layer by a spin coating method so that the film thickness after application was 1.5 µm, and then heated on a hot plate at 110° C. for 2 minutes to obtain a composition layer.

Next, using the i-line stepper exposure device FPA-3000i5+(manufactured by Canon Inc.), the obtained composition layer was exposed (exposure amount of 500 mJ/cm$^2$) in a form of a line-and-space pattern of 300 µm through a mask.

Subsequently, a development treatment was performed using a development device (Act-8 manufactured by Tokyo Electron Limited). Shower development was performed at 23° C. for 60 seconds by using an aqueous solution of 0.3% tetramethylammonium hydroxide (TMAH) as a developer. Thereafter, rinse was performed with a spin shower using pure water to obtain a line-and-space pattern of 300 µm. An undercut width was measured by observing the cross section of the obtained pattern with a scanning electron microscope (SEM) (S-4800, manufactured by Hitachi High-Technologies Corporation), and evaluated according to the following determination standards.

In the following determination standards, A to D are levels which are unproblematic for practical use.

A: The undercut width was equal to or greater than 0.0 µm and less than 0.2 µm

B: The undercut width was equal to or greater than 0.2 µm and less than 0.5 µm

C: The undercut width was equal to or greater than 0.5 µm and less than 1.0 µm

D: The undercut width was equal to or greater than 1.0 µm and less than 1.5 µm

E: The undercut width was equal to or greater than 1.5 µm

[Moisture Resistance (Moisture-Resistant Spectral Stability)]

The obtained composition was applied onto a glass wafer with an undercoat layer using a spin coater so that the film thickness after drying was 1.5 µm, and subjected to a heating treatment (pre-baking) for 120 seconds using a hot plate at 110° C.

Next, using the i-line stepper exposure device FPA-3000i5+(manufactured by Canon Inc.), the resultant was exposed to light having a wavelength of 365 nm at 500 mJ/cm$^2$ through a mask having a pattern of 2 cm×2 cm.

Thereafter, the glass wafer on which the exposed coating film was formed was placed on a horizontal rotary table of a spin shower developing machine (DW-30 type, manufactured by Chemitronics Co., Ltd.), and subjected to puddle development at 23° C. for 60 seconds using a 60% diluted solution of CD-2000 (produced by FUJIFILM Electronic Materials Co., Ltd., alkaline developer).

The glass wafer was fixed to the horizontal rotary table by the vacuum chuck method, subjected to a rinse treatment by supplying pure water in a form of a shower from a spray nozzle from above the rotation center while rotating the wafer at a rotation speed of 50 rpm by a rotation device, and then spray-dried.

A heating treatment (post-baking: 200° C./8 minutes) using a hot plate was performed to obtain a pattern (pattern-like cured film) of 2 cm×2 cm.

The glass wafer with the formed pattern of 2 cm×2 cm was subjected to a treatment of being left to stand for 1,000 hours in an atmosphere of a temperature of 85° C. and a relative humidity of 85% using a constant temperature and humidity machine (EHS-221M) manufactured by Yamato Scientific Co., Ltd. The OD value at a wavelength of 400 to 1,000 nm was measured with U-4100 (manufactured by Hitachi High-Technologies Corporation) before and after the treatment, respectively.

The change in the OD values before and after the treatment was examined, and moisture resistance (moisture-resistant spectral stability) was evaluated based on a change rate at a wavelength showing the maximum change rate.

A change rate for light having each wavelength is determined based on the following expression.

Change rate (%)=(|OD value before treatment−OD value after treatment|)/OD value before treatment×100

In the following determination standards, A to C are levels which are unproblematic for practical use.
A: The change rate was equal to or greater than 0% and less than 3%
B: The change rate was equal to or greater than 3% and less than 5%
C: The change rate was equal to or greater than 5% and less than 10%
D: The change rate was 10%

[Moisture Resistance (Moisture-Resistant Peeling Inhibitory)]

The composition obtained above was applied onto an 8-inch silicon wafer with an undercoat layer by a spin coating method so that the film thickness after application was 1.5 μm, and then heated on a hot plate at 110° C. for 2 minutes.

Next, using the i-line stepper exposure device FPA-3000i5+(manufactured by Canon Inc.), the resultant was exposed (exposure amount of 500 mJ/cm$^2$) in a form of a line-and-space pattern of 300 μm through a mask.

Subsequently, a development treatment was performed using a development device (Act-8 manufactured by Tokyo Electron Limited). Shower development was performed at 23° C. for 60 seconds by using an aqueous solution of 0.3% tetramethylammonium hydroxide (TMAH) as a developer. Thereafter, rinse was performed with a spin shower using pure water to obtain a pattern (pattern-like cured film).

The silicon wafer with the obtained pattern was left to stand for 750 hours, 1,000 hours, and 1,500 hours, respectively, in an atmosphere of a temperature of 85° C. and a relative humidity of 85% using a constant temperature and humidity machine (EHS-221M) manufactured by Yamato Scientific Co., Ltd.

The presence or absence of peeling was observed by observing the cross section of the pattern after each moisture resistance test with the scanning electron microscope (SEM) (S-4800, manufactured by Hitachi High-Technologies Corporation).

In the following determination standards, A to C are levels which are unproblematic for practical use.
A: There was no peeling in a case of being left to stand for 1,500 hours
B: There was no peeling in a case of being left to stand for 1,000 hours, and there was peeling in a case of being left to stand for 1,500 hours
C: There was no peeling in a case of being left to stand for 750 hours, and there was peeling in a case of being left to stand for 1,000 hours
D: Peeling was observed in a case of being left to stand for 750 hours Furthermore, in a case where both the moisture-resistant spectral stability and the moisture-resistant peeling inhibitory are levels (C evaluation or higher) which are unproblematic for practical use, the moisture resistance can be determined to be favorable.

[Result]

The features of the compositions used in the test and the test results are shown in the tables below.

In Tables 5-1, 5-2, and 5-3, columns of "Ethylenically unsaturated group" in columns of "Dispersant" and "Alkali-soluble resin" indicate whether or not the "dispersant" and "alkali-soluble resin" used in the composition used a resin containing an "ethylenically unsaturated group", respectively. A indicates that the resin was used, and B indicates that the resin was not used.

A column of "Number of ethylenically unsaturated groups" in a column of "Polymerizable compound" indicates the number of ethylenically unsaturated groups contained in the used polymerizable compound.

A column of "Oxime compound" in a column of "Photopolymerization initiator" indicates the type of the used photopolymerization initiator. A indicates that the oxime compound represented by General Formula (C-13) was used, B indicates that an oxime compound other than the oxime compound represented by General Formula (C-13) was used, and C indicates that a photopolymerization initiator other than the oxime compound was used.

A column of "Other components" indicates the types of components used as other components. "Epoxy" indicates that an epoxy group-containing compound was used.

TABLE 5-1

| | | Light-shielding pigment | | Dispersant Ethylenically unsaturated group | Alkali-soluble resin Ethylenically unsaturated group | Polymerizable compound Number of ethylenically unsaturated groups | Photo-polymerization initiator Oxime compound | Other components Type |
|---|---|---|---|---|---|---|---|---|
| | Composition | Average primary particle diameter | Element ratio (mass ratio) | | | | | |
| Example 1 | Example Composition 1 | 34 nm | Zr/N/O/W = 76.7/12.3/9.0/2.0 | A | B | 4 | B | — |
| Example 2 | Example Composition 2 | 34 nm | Zr/N/O/W = 76.7/12.3/9.0/2.0 | A | A | 4 | B | — |
| Example 3 | Example Composition 3 | 34 nm | Zr/N/O/W = 76.7/12.3/9.0/2.0 | A | A | 5/6 | B | — |
| Example 4 | Example Composition 4 | 34 nm | Zr/N/O/W = 76.7/12.3/9.0/2.0 | A | A | 5/6 | A | — |
| Example 5 | Example Composition 5 | 34 nm | Zr/N/O/W = 76.7/12.3/9.0/2.0 | A | A | 5/6 | C | — |
| Example 6 | Example Composition 6 | 34 nm | Zr/N/O/W = 76.7/12.3/9.0/2.0 | A | A | 5/6 | C | — |
| Example 7 | Example Composition 7 | 34 nm | Zr/N/O/W = 76.7/12.3/9.0/2.0 | A | A | 5/6 | B | Epoxy |
| Example 8 | Example Composition 8 | 34 nm | Zr/N/O/W = 76.7/12.3/9.0/2.0 | A | A | 5/6 | B | Epoxy |
| Example 9 | Example Composition 9 | 34 nm | Zr/N/O/W = 76.7/12.3/9.0/2.0 | A | A | 5/6 | B | Ultraviolet absorber |

TABLE 5-1-continued

| | | | | | | | | |
|---|---|---|---|---|---|---|---|---|
| Example 10 | Example Composition 10 | 34 nm | Zr/N/O/W = 76.7/12.3/9.0/2.0 | A | A | 5/6 | B | Adhesive agent |
| Example 11 | Example Composition 11 | 34 nm | Zr/N/O/W = 76.7/12.3/9.0/2.0 | A | A | 4/5/6 | B | — |
| Example 12 | Example Composition 12 | 34 nm | Zr/N/O/W = 76.7/12.3/9.0/2.0 | B | A | 5/6 | A | — |
| Example 13 | Example Composition 13 | 34 nm | Zr/N/O/W = 76.7/12.3/9.0/2.0 | B | A | 5/6 | A | — |
| Example 14 | Example Composition 14 | 34 nm | Zr/N/O/W = 76.7/12.3/9.0/2.0 | B | A | 5/6 | A | — |
| Example 15 | Example Composition 15 | 35 nm | Zr/N/O/Hf = 77.4/12.9/9.5/0.2 | A | A | 5/6 | A | — |
| Example 16 | Example Composition 16 | 36 nm | Zr/N/O/Hf = 77.3/12.8/9.4/0.5 | A | A | 5/6 | A | — |
| Example 17 | Example Composition 17 | 30 nm | Zr/N/O/Hf = 77.1/12.6/9.3/1.0 | A | A | 5/6 | A | — |
| Example 18 | Example Composition 18 | 34 nm | Zr/N/O/Hf = 76.7/12.3/9.0/2.0 | A | A | 5/6 | A | — |
| Example 19 | Example Composition 19 | 35 nm | Zr/N/O/Hf = 76.5/12.0/8.5/3.0 | A | A | 5/6 | A | — |
| Example 20 | Example Composition 20 | 33 nm | Zr/N/O/W = 77.4/12.9/9.5/0.2 | A | A | 5/6 | A | — |
| Example 21 | Example Composition 21 | 35 nm | Zr/N/O/W = 77.3/12.8/9.4/0.5 | A | A | 5/6 | A | — |
| Example 22 | Example Composition 22 | 34 nm | Zr/N/O/W = 77.1/12.6/9.3/1.0 | A | A | 5/6 | A | — |
| Example 23 | Example Composition 23 | 35 nm | Zr/N/O/W = 76.5/12.0/8.5/3.0 | A | A | 5/6 | A | — |
| Example 24 | Example Composition 24 | 34 nm | Zr/N/O/Hf = 76.7/8.3/13.0/2.0 | A | A | 5/6 | A | — |
| Example 25 | Example Composition 25 | 34 nm | Zr/N/O/Hf = 76.7/10.3/11.0/2.0 | A | A | 5/6 | A | — |

| | Evaluation | | | | | | |
|---|---|---|---|---|---|---|---|
| | Light-shielding properties | Viscosity stability over time | Precipitation stability over time | Solvent resistance | Undercut resistance | Moisture-resistant spectral stability | Moisture-resistant peeling inhibitory |
| Example 1 | B | B | C | C | C | B | C |
| Example 2 | B | B | C | B | C | B | C |
| Example 3 | B | B | C | B | B | B | C |
| Example 4 | B | B | C | B | A | B | B |
| Example 5 | B | B | C | C | C | B | C |
| Example 6 | B | B | C | C | C | B | C |
| Example 7 | B | B | C | A | B | B | B |
| Example 8 | B | B | C | A | B | B | B |
| Example 9 | B | B | C | B | A | B | C |
| Example 10 | B | B | C | B | B | B | A |
| Example 11 | B | B | C | C | C | B | C |
| Example 12 | B | B | C | C | C | B | C |
| Example 13 | B | B | C | C | C | B | C |
| Example 14 | B | B | C | C | C | B | C |
| Example 15 | B | D | C | B | A | B | B |
| Example 16 | B | C | C | B | A | B | B |
| Example 17 | B | B | B | B | A | B | B |
| Example 18 | B | B | B | B | A | B | B |
| Example 19 | B | B | B | B | A | C | B |
| Example 20 | B | D | D | B | A | B | B |
| Example 21 | B | C | D | B | A | B | B |
| Example 22 | B | B | C | B | A | B | B |
| Example 23 | B | B | C | B | A | C | B |
| Example 24 | B | B | B | B | A | B | B |
| Example 25 | B | B | B | B | A | B | B |

TABLE 5-2

| | Composition | Light-shielding pigment Average primary particle diameter | Light-shielding pigment Element ratio (mass ratio) | Dispersant Ethylenically unsaturated group | Alkali-soluble resin Ethylenically unsaturated group | Polymerizable compound Number of ethylenically unsaturated groups | Photo-polymerization initiator Oxime compound | Other components Type |
|---|---|---|---|---|---|---|---|---|
| Example 26 | Example Composition 26 | 34 nm | Zr/N/O/Hf = 76.7/15.3/6.0/2.0 | A | A | 5/6 | A | — |
| Example 27 | Example Composition 27 | 34 nm | Zr/N/O/Hf = 76.7/18.3/3.0/2.0 | A | A | 5/6 | A | — |
| Example 28 | Example Composition 28 | 34 nm | Zr/N/O/Hf = 76.7/20.3/1.0/2.0 | A | A | 5/6 | A | — |
| Example 29 | Example Composition 29 | 34 nm | Zr/N/O/W = 76.7/8.3/13.0/2.0 | A | A | 5/6 | A | — |
| Example 30 | Example Composition 30 | 34 nm | Zr/N/O/W = 76.7/10.3/11.0/2.0 | A | A | 5/6 | A | — |
| Example 31 | Example Composition 31 | 34 nm | Zr/N/O/W = 76.7/15.3/6.0/2.0 | A | A | 5/6 | A | — |
| Example 32 | Example Composition 32 | 34 nm | Zr/N/O/W = 76.7/18.3/3.0/2.0 | A | A | 5/6 | A | — |
| Example 33 | Example Composition 33 | 34 nm | Zr/N/O/W = 76.7/20.3/1.0/2.0 | A | A | 5/6 | A | — |
| Example 34 | Example Composition 34 | 40 nm | Zr/N/O/Hf/W = 76.0/12.0/8.5/2.0/1.5 | A | A | 5/6 | A | — |
| Example 35 | Example Composition 35 | 40 nm | Zr/N/O/Hf/Si = 76.0/12.0/8.5/2.0/1.5 | A | A | 5/6 | A | — |
| Example 36 | Example Composition 36 | 40 nm | Zr/N/O/W/Si = 76.0/12.0/8.5/2.0/1.5 | A | A | 5/6 | A | — |
| Example 37 | Example Composition 37 | 15 nm | Zr/N/O/W = 76.7/12.3/9.0/2.0 | A | A | 5/6 | A | — |
| Example 38 | Example Composition 38 | 25 nm | Zr/N/O/W = 76.7/12.3/9.0/2.0 | A | A | 5/6 | A | — |
| Example 39 | Example Composition 39 | 55 nm | Zr/N/O/W = 76.7/12.3/9.0/2.0 | A | A | 5/6 | A | — |
| Example 40 | Example Composition 40 | 65 nm | Zr/N/O/W = 76.7/12.3/9.0/2.0 | A | A | 5/6 | A | — |
| Example 41 | Example Composition 41 | 85 nm | Zr/N/O/W = 76.7/12.3/9.0/2.0 | A | A | 5/6 | A | — |
| Example 42 | Example Composition 42 | 31 nm | Nb/N/O/Hf = 76.7/12.3/9.0/2.0 | A | A | 5/6 | A | — |
| Example 43 | Example Composition 43 | 33 nm | Nb/N/O/W = 76.7/12.3/9.0/2.0 | A | A | 5/6 | A | — |
| Example 44 | Example Composition 44 | 41 nm | Nb/N/O/Hf/W = 76.0/12.0/8.5/2.0/1.5 | A | A | 5/6 | A | — |
| Example 45 | Example Composition 45 | 40 nm | Nb/N/O/Hf/Si = 76.0/12.0/8.5/2.0/1.5 | A | A | 5/6 | A | — |
| Example 46 | Example Composition 46 | 39 nm | Nb/N/O/W/Si = 76.0/12.0/8.5/2.0/1.5 | A | A | 5/6 | A | — |
| Example 47 | Example Composition 47 | 31 nm | V/N/O/Hf = 76.7/12.3/9.0/2.0 | A | A | 5/6 | A | — |
| Example 48 | Example Composition 48 | 33 nm | V/N/O/W = 76.7/12.3/9.0/2.0 | A | A | 5/6 | A | — |
| Example 49 | Example Composition 49 | 41 nm | V/N/O/Hf/W = 76.0/12.0/8.5/2.0/1.5 | A | A | 5/6 | A | — |
| Example 50 | Example Composition 50 | 40 nm | V/N/O/Hf/Si = 76.0/12.0/8.5/2.0/1.5 | A | A | 5/6 | A | — |

| | Evaluation Light-shielding properties | Viscosity stability over time | Precipitation stability over time | Solvent resistance | Undercut resistance | Moisture-resistant spectral stability | Moisture-resistant peeling inhibitory |
|---|---|---|---|---|---|---|---|
| Example 26 | A | B | B | B | A | B | B |
| Example 27 | A | B | B | B | A | B | B |
| Example 28 | A | B | B | B | B | B | B |
| Example 29 | B | B | C | B | A | B | B |
| Example 30 | B | B | C | B | A | B | B |
| Example 31 | A | B | C | B | A | B | B |
| Example 32 | A | B | C | B | A | B | B |
| Example 33 | A | B | C | B | B | B | B |
| Example 34 | B | B | B | B | A | B | B |
| Example 35 | B | A | A | B | A | A | B |
| Example 36 | B | A | A | B | A | A | B |
| Example 37 | C | B | A | B | A | B | B |
| Example 38 | C | B | B | B | A | B | B |
| Example 39 | B | B | C | B | A | B | B |

TABLE 5-2-continued

|  |  |  |  |  |  |  |  |
|---|---|---|---|---|---|---|---|
| Example 40 | B | B | C | B | A | B | B |
| Example 41 | A | B | D | B | A | B | B |
| Example 42 | A | B | B | B | B | C | B |
| Example 43 | A | B | C | B | B | C | B |
| Example 44 | A | B | B | B | B | C | B |
| Example 45 | A | A | A | B | B | B | B |
| Example 46 | A | A | A | B | B | B | B |
| Example 47 | A | B | B | B | B | B | B |
| Example 48 | A | B | C | B | B | B | B |
| Example 49 | A | B | B | B | B | B | B |
| Example 50 | A | A | A | B | B | A | B |

TABLE 5-3

| | Composition | Light-shielding pigment | | Alkali-soluble Dispersant Ethylenically unsaturated group | Polymerizable compound | | Photo-polymerization initiator Oxime compound | Other components Type |
|---|---|---|---|---|---|---|---|---|
| | | Average primary particle diameter | Element ratio (mass ratio) | | resin Ethylenically unsaturated group | Number of ethylenically unsaturated groups | | |
| Example 51 | Example Composition 51 | 39 nm | V/N/O/W/Si = 76.0/12.0/8.5/2.0/1.5 | A | A | 5/6 | A | — |
| Example 52 | Example Composition 52 | 30 nm | Ta/N/O/Hf = 76.7/12.3/9.0/2.0 | A | A | 5/6 | A | — |
| Example 53 | Example Composition 53 | 31 nm | Ta/N/O/W = 76.7/12.3/9.0/2.0 | A | A | 5/6 | A | — |
| Example 54 | Example Composition 54 | 33 nm | Y/N/O/Hf = 76.7/12.3/9.0/2.0 | A | A | 5/6 | A | — |
| Example 55 | Example Composition 55 | 30 nm | Y/N/O/W = 76.7/12.3/9.0/2.0 | A | A | 5/6 | A | — |
| Example 56 | Example Composition 56 | 35 nm | Cr/N/O/Hf = 76.7/12.3/9.0/2.0 | A | A | 5/6 | A | — |
| Example 57 | Example Composition 57 | 33 nm | Cr/N/O/W = 76.7/12.3/9.0/2.0 | A | A | 5/6 | A | — |
| Example 58 | Example Composition 58 | 34 nm | Zr/N/O/W = 76.7/12.3/9.0/2.0 | A | A | 5/6 | A | — |
| Example 59 | Example Composition 59 | 34 nm | Zr/N/O/W = 76.7/12.3/9.0/2.0 | A | A | 5/6 | A | — |
| Example 60 | Example Composition 60 | 34 nm | Zr/N/O/W = 76.7/12.3/9.0/2.0 | A | A | 5/6 | A | — |
| Example 61 | Example Composition 61 | 38 nm | Ti/N/O/W = 76.7/12.3/9.0/2.0 | A | A | 5/6 | A | — |
| Comparative Example 1 | Comparative Composition 1 | 35 nm | Zr/N/O/Fe/Si = 76.0/12.0/8.5/2.0/1.5 | A | A | 5/6 | A | — |
| Comparative Example 2 | Comparative Composition 2 | 34 nm | Nb/N/O/Ni/Ag = 76.0/12.0/8.5/2.0/1.5 | A | A | 5/6 | A | — |
| Comparative Example 3 | Comparative Composition 3 | 31 nm | V/N/O/Al//Si = 76.0/12.0/8.5/2.0/1.5 | A | A | 5/6 | A | — |
| Comparative Example 4 | Comparative Composition 4 | 33 nm | Zr/N/O = 77.5/13.0/9.5 | A | A | 5/6 | A | — |
| Comparative Example 5 | Comparative Composition 5 | 38 nm | V/N/O = 77.5/13.0/9.5 | A | A | 5/6 | A | — |
| Comparative Example 6 | Comparative Composition 6 | 18 nm | Al/N/O = 77.7/11.3/9.0 | A | A | 5/6 | A | — |
| Comparative Example 7 | Comparative Composition 7 | 18 nm | Si/N/O = 75.7/12.5/11.8 | A | A | 5/6 | A | — |

| | Evaluation | | | | | | |
|---|---|---|---|---|---|---|---|
| | Light-shielding properties | Viscosity stability over time | Precipitation stability over time | Solvent resistance | Undercut resistance | Moisture-resistant spectral stability | Moisture-resistant peeling inhibitory |
| Example 51 | A | A | A | B | B | A | B |
| Example 52 | C | B | B | B | C | B | B |
| Example 53 | C | B | C | B | C | B | B |
| Example 54 | C | B | B | B | C | B | B |
| Example 55 | C | B | C | B | C | B | B |
| Example 56 | C | B | B | B | C | B | B |
| Example 57 | C | B | C | B | C | B | B |
| Example 58 | B | B | C | B | A | B | B |
| Example 59 | B | B | C | B | A | B | B |
| Example 60 | B | B | C | B | A | B | B |
| Example 61 | B | C | C | B | D | C | C |

TABLE 5-3-continued

| | | | | | | | |
|---|---|---|---|---|---|---|---|
| Comparative Example 1 | B | E | E | B | A | D | B |
| Comparative Example 2 | A | E | E | B | B | D | B |
| Comparative Example 3 | A | E | E | B | B | D | B |
| Comparative Example 4 | B | E | E | B | A | D | B |
| Comparative Example 5 | B | E | E | B | B | D | B |
| Comparative Example 6 | D | E | E | B | C | D | D |
| Comparative Example 7 | D | E | E | B | C | D | D |

From the results shown in the tables, it was confirmed that the objects of the present invention can be achieved by the composition according to the embodiment of the present invention.

It was confirmed that in a case where the composition contains a resin containing an ethylenically unsaturated group in an amount equal to or greater than 65% by mass with respect to the total mass of the resins, the solvent resistance of a cured film formed of the composition and/or the undercut resistance in a case where a cured film is formed of the composition is excellent (comparison of Examples 1, 2, and 11 to 14).

It was confirmed that in a case where the composition contains a polymerizable compound containing five or more ethylenically unsaturated groups, the undercut resistance in a case where a cured film is formed of the composition is excellent (comparison of Examples 2 and 3).

It was confirmed that in a case where the composition contains a photopolymerization initiator which is an oxime compound, the undercut resistance in a case where a cured film is formed of the composition is excellent, and the solvent resistance of the cured film is excellent (comparison of Examples 3 to 6).

Furthermore, it was confirmed that in a case where the photopolymerization initiator which is an oxime compound is an oxime compound represented by General Formula (C-13), the undercut resistance in a case where a cured film is formed of the composition is superior, and the moisture-resistant peeling inhibitory of the cured film is superior (comparison of Examples 3 and 4).

It was confirmed that in a case where the composition contains an epoxy group-containing compound, the solvent resistance of a cured film formed of the composition is excellent, and the moisture-resistant peeling inhibitory is also superior (comparison of Examples 3, 7, and 8).

It was confirmed that in a case where the composition contains a polymerizable compound containing an ultraviolet absorber, the undercut resistance in a case where a cured film is formed of the composition is excellent (comparison of Examples 3 and 9).

It was confirmed that in a case where the composition contains a polymerizable compound containing an adhesive agent, the moisture-resistant peeling inhibitory of a cured film formed of the composition is superior (comparison of Examples 3 and 10).

It was confirmed that in a case where the composition contains a graft polymer containing an ethylenically unsaturated group, the undercut resistance in a case where a cured film is formed of the composition is excellent, the solvent resistance of the cured film is excellent, and the moisture-resistant peeling inhibitory of the cured film is superior (comparison of Examples 3 and 12 to 14).

It was confirmed that in a case where the light-shielding pigment contains hafnium as the atom A, and the content of the hafnium is 1.0% to 2.0% by mass with respect to the total mass of the light-shielding pigment, the viscosity stability of the composition over time, the precipitation stability of the composition over time, and the moisture-resistant spectral stability of the cured film formed of the composition are excellent in a well-balanced manner (comparison of Examples 15 and 18).

It was confirmed that in a case where the light-shielding pigment contains tungsten as the atom A, and the content of the tungsten is 1.0% to 2.0% by mass with respect to the total mass of the light-shielding pigment, the viscosity stability of the composition over time, the precipitation stability of the composition over time, and the moisture-resistant spectral stability of the cured film formed of the composition are excellent in a well-balanced manner (comparison of Examples 4 and 21 to 23).

It was confirmed that in a case where the light-shielding pigment contains an oxygen atom, and the content of the oxygen atom is equal to or greater than 3% by mass and less than 9% by mass with respect to the total mass of the light-shielding pigment, the undercut resistance in a case where a cured film is formed of the composition and the light-shielding properties of the cured film formed of the composition are excellent in a well-balanced manner (comparison of Examples 18 and 24 to 28, and comparison of Examples 4 and 29 to 33).

It was confirmed that in a case where the light-shielding pigment contains a silicon atom, the viscosity stability of the composition over time, the precipitation stability of the composition over time, and the moisture-resistant spectral stability of the cured film formed of the composition are superior (results of Examples 35 and 36).

It was confirmed that in a case where the average primary particle diameter of the light-shielding pigment is equal to or greater than 30 nm, the light-shielding properties of the cured film formed of the composition are excellent, and in a case where the average primary particle diameter is equal to or less than 65 nm, the precipitation stability of the composition over time is excellent (comparison of Examples 4 and 37 to 41).

It was confirmed that in a case where the specific transition metal is zirconium, vanadium, or niobium, the undercut resistance in a case where a cured film is formed of the composition is excellent.

It was confirmed that in a case where the specific transition metal is zirconium or vanadium, the moisture-resistant spectral stability of a cured film formed of the composition is superior.

It was confirmed that in a case where the specific transition metal is vanadium or niobium, the light-shielding properties of a cured film formed of the composition are superior.

(Comparison of Examples 4, 18, 43 to 59, and 61)

EXPLANATION OF REFERENCES

100: Solid-state imaging device
101: Solid-state imaging element
102: Imaging portion
103: Cover glass
104: Spacer
105: Laminated substrate
106: Chip substrate
107: Circuit substrate
108: Electrode pad
109: External connection terminal
110: Through electrode
111: Lens layer
112: Lens material
113: Support
114, 115: Cured film
201: Light-receiving element
202: Color filter
203: Microlens
204: Substrate
205b: Blue pixel
205r: Red pixel
205g: Green pixel
205bm: Black matrix
206: p-well layer
207: Reading gate portion
208: Vertical electric charge transfer path
209: Element separation region
210: Gate insulating film
211: Vertical electric charge transfer electrode
212: Cured film
213, 214: Insulating film
215: Planarization film
300: Infrared sensor
310: Solid-state imaging element
311: Infrared absorption filter
312: Color filter
313: Infrared transmission filter
314: Resin film
315: Microlens
316: Planarization film

What is claimed is:

1. A light-shielding resin composition comprising:
a light-shielding pigment which is one or more selected from the group consisting of metal nitride-containing particles containing an atom A and metal oxynitride-containing particles containing the atom A; and
a resin,
wherein the light-shielding pigment contains at least one of a nitride or an oxynitride of a transition metal having an electronegativity of 1.22 to 1.80, among transition metals of groups 3 to 7, and
the atom A is hafnium, and is an atom different from the transition metal.

2. The light-shielding resin composition according to claim 1, further comprising:
a polymerization initiator; and
a low-molecular compound containing an ethylenically unsaturated group.

3. The light-shielding resin composition according to claim 2,
wherein the low-molecular compound contains five or more ethylenically unsaturated groups.

4. The light-shielding resin composition according to claim 1,
wherein the light-shielding pigment satisfies a requirement 1 in which a content of the hafnium is 0.5% to 2.0% by mass with respect to a total mass of the light-shielding pigment.

5. The light-shielding resin composition according to claim 1,
wherein a content of the transition metal in the light-shielding pigment is 50% to 80% by mass with respect to a total mass of the light-shielding pigment.

6. The light-shielding resin composition according to claim 1,
wherein the light-shielding pigment contains an oxygen atom, and a content of the oxygen atom in the light-shielding pigment is equal to or greater than 3% by mass and less than 9% by mass with respect to a total mass of the light-shielding pigment.

7. The light-shielding resin composition according to claim 1,
wherein the transition metal is one or more selected from the group consisting of zirconium, vanadium, niobium, chromium, tantalum, yttrium, and titanium.

8. The light-shielding resin composition according to claim 1,
wherein the transition metal is one or more selected from the group consisting of zirconium, vanadium, and niobium.

9. The light-shielding resin composition according to claim 1,
wherein the light-shielding pigment contains one or more selected from the group consisting of zirconium oxynitride and zirconium nitride.

10. The light-shielding resin composition according to claim 1,
wherein the light-shielding pigment contains a silicon atom.

11. The light-shielding resin composition according to claim 1,
wherein an average primary particle diameter of the light-shielding pigment is 30 to 60 nm.

12. The light-shielding resin composition according to claim 1,
wherein the resin includes a resin containing an acid group.

13. The light-shielding resin composition according to claim 1,
wherein the resin includes a resin containing an ethylenically unsaturated group.

14. The light-shielding resin composition according to claim 13,
wherein a content of the resin containing an ethylenically unsaturated group is equal to or greater than 65% by mass with respect to a total mass of the resin.

15. The light-shielding resin composition according to claim 1,
wherein the resin includes a resin which is a graft polymer.

16. The light-shielding resin composition according to claim 15,
wherein a mass ratio of a content of the resin, which is a graft polymer, to a content of the light-shielding pigment is 0.05 to 0.35.

17. The light-shielding resin composition according to claim 1, further comprising:
a solvent,
wherein a solid content is 10% to 40% by mass.

18. The light-shielding resin composition according to claim 1, further comprising:
one or more selected from the group consisting of an epoxy group-containing compound, an ultraviolet absorber, and an adhesive agent.

19. A cured film formed of the light-shielding resin composition according to claim 1.

20. A color filter comprising:
the cured film according to claim 19.

21. A light-shielding film comprising:
the cured film according to claim 19.

22. A solid-state imaging element comprising:
the cured film according to claim 19.

23. An image display device comprising:
the cured film according to claim 19.

* * * * *